(12) United States Patent
Karasawa et al.

(10) Patent No.: US 6,653,696 B2
(45) Date of Patent: Nov. 25, 2003

(54) SEMICONDUCTOR DEVICE, MEMORY SYSTEM, AND ELECTRONIC INSTRUMENT

(75) Inventors: Junichi Karasawa, Nagano-ken (JP); Takashi Kumagai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 79 days.

(21) Appl. No.: 10/068,785

(22) Filed: Feb. 5, 2002

(65) Prior Publication Data

US 2002/0130426 A1 Sep. 19, 2002

(30) Foreign Application Priority Data

Feb. 9, 2001 (JP) .......................................... 2001-034205

(51) Int. Cl.[7] .......................... H01L 29/76; H01L 29/94; H01L 31/062; H01L 31/113; H01L 31/119
(52) U.S. Cl. ........................................ 257/393; 257/903
(58) Field of Search ................................. 257/393, 903; 438/152

(56) References Cited

U.S. PATENT DOCUMENTS 6,404,023 B1 * 6/2002 Mori et al. .................. 257/393
6,437,455 B2 * 8/2002 Mori et al. .................. 257/369

FOREIGN PATENT DOCUMENTS

JP       10-041409       2/1998

* cited by examiner

*Primary Examiner*—Cuong Quang Nguyen
(74) *Attorney, Agent, or Firm*—Hogan & Hartson, LLP

(57) ABSTRACT

The present invention provides a semiconductor device including a first gate—gate electrode layer located in a first conductive layer and including gate electrodes of a first load transistor and a first driver transistor and a second gate—gate electrode layer located in the first conductive layer and including gate electrodes of a second load transistor and a second driver transistor. A first drain—drain connecting layer is located in a second conductive layer which is an upper layer of the first conductive layer and connects a drain of the first load transistor with a drain of the first driver transistor. A second drain—drain connecting layer is located in the second conductive layer and connects a drain of the second load transistor with a drain of the second driver transistor. A first drain-gate connecting layer is located in a third conductive layer which is an upper layer of the first and second drain—drain connecting layers and connects the first drain—drain connecting layer with the second gate—gate electrode layer and a stacked contact-conductive section connects the third conductive layer with the first conductive layer and has a structure in which an upper layer conductive section buried in a second interlayer dielectric used to insulate the second conductive layer from the third conductive layer is stacked over a lower layer conductive section buried in a first interlayer dielectric used to insulate the first conductive layer from the second conductive layer.

20 Claims, 39 Drawing Sheets

FIELD, FIRST CONDUCTIVE LAYER, AND SECOND CONDUCTIVE LAYER

SEMICONDUCTOR DEVICE, MEMORY SYSTEM, AND ELECTRONIC INSTRUMENT

Japanese Patent Application No. 2001-34205, filed Feb. 9, 2001, is hereby incorporated by reference in its entirety.

BACKGROUND OF THE INVENTION

The present invention relates to a semiconductor device such as an SRAM (Static Random Access Memory), and a memory system and an electronic instrument including the semiconductor device.

An SRAM is one type of semiconductor memory device which does not need refreshing. Therefore, the SRAM enables the system configuration to be simplified and consumes only a small amount of electric power. Because of this, the SRAM is suitably used as a memory for an electronic instrument such as portable telephones.

There has been a demand for miniaturization of portable equipment. To deal with this demand, the memory cell size of the SRAM must be reduced.

BRIEF SUMMARY OF THE INVENTION

An advantage of the present invention is to provide a semiconductor device enabling miniaturization of memory cells, and a memory system and an electronic instrument including the semiconductor device.

One aspect of the present invention provides a semiconductor device including a first gate—gate electrode layer located in a first conductive layer and including gate electrodes of a first load transistor and a first driver transistor and a second gate—gate electrode layer located in the first conductive layer and including gate electrodes of a second load transistor and a second driver transistor.

A first drain—drain connecting layer is located in a second conductive layer which is an upper layer of the first conductive layer and connects a drain of the first load transistor with a drain of the first driver transistor. A second drain—drain connecting layer is located in the second conductive layer and connects a drain of the second load transistor with a drain of the second driver transistor. A first drain-gate connecting layer is located in a third conductive layer which is an upper layer of the first and second drain—drain connecting layers and connects the first drain—drain connecting layer with the second gate—gate electrode layer and a stacked contact-conductive section connects the third conductive layer with the first conductive layer and has a structure in which an upper layer conductive section buried in a second interlayer dielectric used to insulate the second conductive layer from the third conductive layer is stacked over a lower layer conductive section buried in a first interlayer dielectric used to insulate the first conductive layer from the second conductive layer.

DETAILED DESCRIPTION OF THE EMBODIMENT

Figure 1:
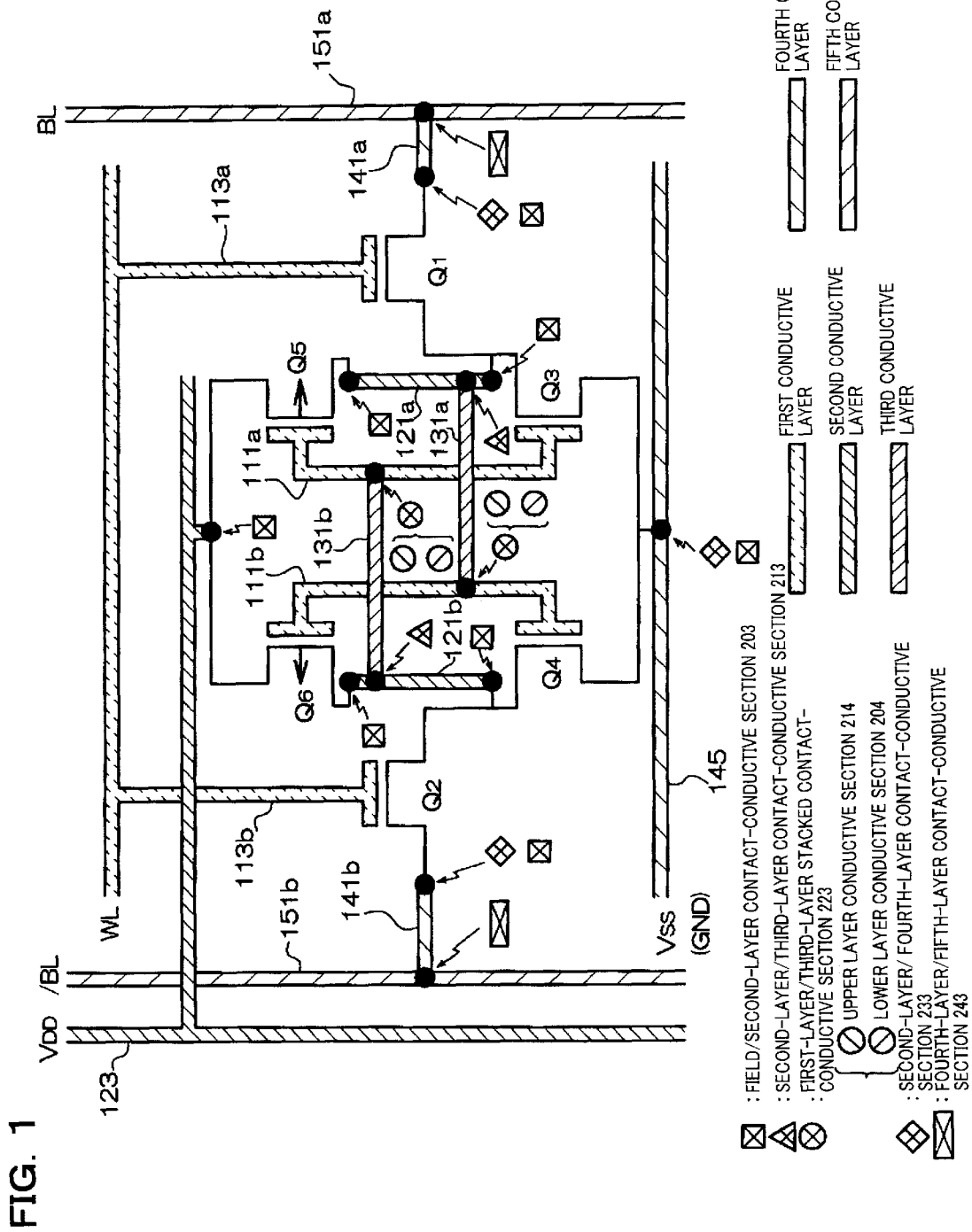
FIG. 1 is an equivalent circuit diagram of an SRAM according to a first embodiment.

An embodiment of the present invention is described below with reference to the drawings. The present embodiment illustrates a case where a semiconductor device according to the present invention is applied to an SRAM. The present embodiment consists of first and second embodiments. The first embodiment, the second embodiment, and effects of the first and second embodiments are described below in that order.

(1) One aspect of the present invention provides a semiconductor device including a first gate—gate electrode layer located in a first conductive layer and including gate electrodes of a first load transistor and a first driver transistor and a second gate—gate electrode layer located in the first conductive layer and including gate electrodes of a second load transistor and a second driver transistor.

A first drain—drain connecting layer is located in a second conductive layer which is an upper layer of the first conductive layer and connects a drain of the first load transistor with a drain of the first driver transistor. A second drain—drain connecting layer is located in the second conductive layer and connects a drain of the second load transistor with a drain of the second driver transistor. A first drain-gate connecting layer is located in a third conductive layer which is an upper layer of the first and second drain—drain connecting layers and connects the first drain—drain connecting layer with the second gate—gate electrode layer and a stacked contact-conductive section connects the third conductive layer with the first conductive layer and has a structure in which an upper layer conductive section buried in a second interlayer dielectric used to insulate the second conductive layer from the third conductive layer is stacked over a lower layer conductive section buried in a first interlayer dielectric used to insulate the first conductive layer from the second conductive layer.

An "active region" used herein refers to an element formation region specified by an element isolation region. Specifically, the active region includes a region in which an impurity diffusion layer is formed and a region in which a channel under the gate electrode is formed.

Since the semiconductor device includes the stacked contact-conductive section, it is unnecessary to provide a through-hole formed through two interlayer dielectrics, specifically, a through-hole formed through the first and second interlayer dielectrics. Therefore, even if the memory cells are more and more miniaturized, it is possible to prevent an excessive increase in the aspect ratio of the through-hole used to connect the third conductive layer with the first conductive layer (connection between first (second) drain-gate connecting layer and second (first) gate—gate electrode layer, for example). Therefore, memory cells can be miniaturized according to this aspect of the present invention.

(2) The semiconductor device may include an insulating layer located between the first interlayer dielectric and the second interlayer dielectric, the second conductive layer being buried in the insulating layer, wherein the upper layer conductive section of the stacked contact-conductive section is buried in the insulating layer and the second interlayer dielectric.

In case of forming the second conductive layer using a damascene process, these structures can be obtained.

(3) The second conductive layer may include tungsten.

Since the second conductive layer may include tungsten, the second conductive layer can be formed using a damascene process. Therefore, the semiconductor device can be easily provided with multilevel interconnection.

(4) The semiconductor device may include a first transfer transistor and a second transfer transistor, a first active region having a pattern extending in a first direction and located in a layer under the first conductive layer, the first and second load transistors being formed in the first active region and a second active region having a pattern extending in the first direction and located in the same layer as the first active region. The first and second driver transistors and the first and second transfer transistors are formed in the second active region. A first word line has a pattern extending in a second direction and located in the first conductive layer so as to intersect with the second active region in a plan view. The first word line includes a gate electrode of the first transfer transistor, and a second word line having a pattern extending in the second direction and located in the first conductive layer so as to intersect with the second active region in a plan view. The second word line includes a gate electrode of the second transfer transistor. The first and second gate—gate electrode layers have a pattern extending in the second direction and are located between the first word line and the second word line so as to intersect with the first and second active regions in a plan view. The first and second drain—drain connecting layers have a pattern extending in the second direction.

According to this configuration, miniaturization of memory cells can be achieved.

(5) The semiconductor device may include a power supply line which has a pattern extending in the first direction and which is located in the second conductive layer and connected with a source of the first and second load transistor and a ground line local interconnect layer which has a pattern extending in the second direction and which is located in the second conductive layer and connected with a source of the first and second driver transistors. A bit line contact pad layer is located in the second conductive layer and is connected with the first transfer transistor. A /bit line contact pad layer is located in the second conductive layer and is connected with the second transfer transistor. A ground line has a pattern extending in the second direction and is located in a fourth conductive layer which is an upper layer of the third conductive layer. The ground line is connected with the ground line local interconnect layer. A main word line has a pattern extending in the second direction and is located in the fourth conductive layer and a bit line local interconnect layer has a pattern extending in the second direction and is located in the fourth conductive layer and is connected with the bit line contact pad layer.

The semiconductor device also includes a /bit line local interconnect layer which has a pattern extending in the second direction and which is located in the fourth conductive layer and connected with the /bit line contact pad layer, a bit line having a pattern extending in the first direction and located in a fifth conductive layer which is an upper layer of the fourth conductive layer, the bit line being connected with the bit line local interconnect layer, and a /bit line which has a pattern extending in the first direction and which is located in the fifth conductive layer and connected with the /bit line local interconnect layer.

According to this aspect of the present invention, the power supply line, the ground line, the main word line, the bit line, and the /bit line can be disposed in a well-balanced manner. The ground line local interconnect layer is used to connect the source of the first and second driver transistors with the ground line. The bit line contact pad layer and the bit line local interconnect layer are used to connect the bit line with the first transfer transistor. The /bit line contact pad layer and the /bit line local interconnect layer are used to connect the /bit line with the second transfer transistor. A power supply line is a VDD interconnecting line, for example. A ground line is a VSS interconnecting line, for example. In case of providing a main word line, the above described word line becomes a sub word line.

(6) The semiconductor device may include a first stacked contact-conductive section connecting the ground line with the ground line local interconnect layer, and having a structure in which an upper layer conductive section buried in a third interlayer dielectric used to insulate the third conductive layer from the fourth conductive layer is stacked over a lower layer conductive section buried in the second interlayer dielectric, a second stacked contact-conductive section connecting the bit line local interconnect layer with the bit line contact pad layer, and having a structure in which an upper layer conductive section buried in the third interlayer dielectric is stacked over a lower layer conductive section buried in the second interlayer dielectric and a third stacked contact-conductive section connecting the /bit line local interconnect layer with the /bit line contact pad layer, and having a structure in which an upper layer conductive section buried in the third interlayer dielectric is stacked over a lower layer conductive section buried in the second interlayer dielectric.

Since the semiconductor device includes the first, second, and third stacked contact-conductive sections, it is unnecessary to provide a through-hole formed through two interlayer dielectrics, specifically, a through-hole formed through the second and third interlayer dielectrics. Therefore, even if the memory cells are more and more miniaturized, it is possible to prevent an excessive increase in the aspect ratio of the through-hole used to connect the second conductive layer with the fourth conductive layer. Therefore, miniaturization of memory cells can be achieved.

(7) The power supply line, the ground line local interconnect layer, the bit line contact pad layer, and the /bit line contact pad layer may include tungsten.

(8) The semiconductor device may include a first transfer transistor and a second transfer transistor, a first active region having a pattern extending in a second direction and located in a layer under the first A conductive layer, the first and second load transistors being formed in the first active region, a second active region having a pattern extending in a first and second directions and located in the same layer as the first active region, the first and second driver transistors and the first and second transfer transistors being formed in the second active region, and a word line having a pattern extending in the second direction and located in the first conductive layer so as to intersect with the pattern of the second active region extending in the first direction in a plan view, the word line including gate electrodes of the first and second transfer transistors. The first and second gate—gate electrode layers have a pattern extending in the first direction and intersect with the first and second active regions in a plan view. The first and second drain—drain connecting layers have a pattern extending in the first direction.

According to this configuration, miniaturization of memory cells can be achieved.

(9) The semiconductor device may include a power supply line which has a pattern extending in the second direction and which is located in the second conductive layer and connected with a source of the first and second load transistors, a first ground line local interconnect layer which has a pattern extending in the first direction and which is located in the second conductive layer and connected with a source of the first and second driver transistors, a first bit line contact pad layer which is located in the second conductive layer and connected with the first transfer transistor, a first /bit line contact pad layer which is located in the second conductive layer and connected with the second transfer transistor, a main word line having a pattern extending in the second direction and located in the third conductive layer and a second ground line local interconnect layer which has a pattern extending in the first direction and which is located in the third conductive layer and connected with the first ground line local interconnect layer.

The semiconductor device also includes a second bit line contact pad layer which is located in the third conductive layer and connected with the first bit line contact pad layer, a second /bit line contact pad layer which is located in the third conductive layer and connected with the first /bit line contact pad layer, a bit line having a pattern extending in the first direction and located in a fourth conductive layer which is an upper layer of the third conductive layer, the bit line being connected with the second bit line contact pad layer, a /bit line which has a pattern extending in the first direction and which is located in the fourth conductive layer and connected with the second /bit line contact pad layer, and a ground line which has a pattern extending in the first direction and which is located in the fourth conductive layer and connected with the second ground line local interconnect layer.

According to this aspect of the present invention, the power supply line, the ground line, the main word line, the bit line, and the /bit line can be disposed in a well-balanced manner. The first and second ground line local interconnect layers are used to connect the source of the first and second driver transistors with the ground line. The first and second bit line contact pad layers are used to connect the bit line with the first transfer transistor. The first and second /bit line contact pad layers are used to connect the /bit line with the second transfer transistor.

(10) The power supply line, the first ground line local interconnect layer, the first bit line contact pad layer, and the first /bit line contact pad layer may include tungsten.

(11) The size of a memory cell including the first and second load transistors, the first and second driver transistors, and the first and second transfer transistors may be 2.5 $\mu m^2$ or less.

(12) Another aspect of the present invention provides a memory system comprising the semiconductor device according to any one of the above (1) to (11).

(13) Still another aspect of the present invention provides an electronic instrument comprising the semiconductor device according to any one of the above (1) to (11).

1. First Embodiment

The outline of the structure of the SRAM according to the first embodiment, details of the structure, and a method of fabricating the SRAM are described below.

1.1 Outline of SRAM Structure

FIG. 1 is an equivalent circuit diagram of the SRAM according to the first embodiment. The SRAM according to the first embodiment is a type of memory in which one memory cell is formed by six MOS field effect transistors. Specifically, an n-channel driver transistor $Q_3$ and a p-channel load transistor $Q_5$ make up one CMOS inverter. An n-channel driver transistor $Q_4$ and a p-channel load transistor $Q_6$ make up one CMOS inverter. A flip-flop is formed by cross-coupling these two CMOS inverters. One memory cell is formed by this flip-flop and n-channel transfer transistors $Q_1$ and $Q_2$.

The memory cell of the SRAM according to the present embodiment has a structure including five conductive layers on a field, as shown in FIGS. 2 to 7. FIGS. 2 to 7 are described below briefly with reference to FIG. 1. A symbol "R" in these figures indicates a formation region of one memory cell.

Figure 2:
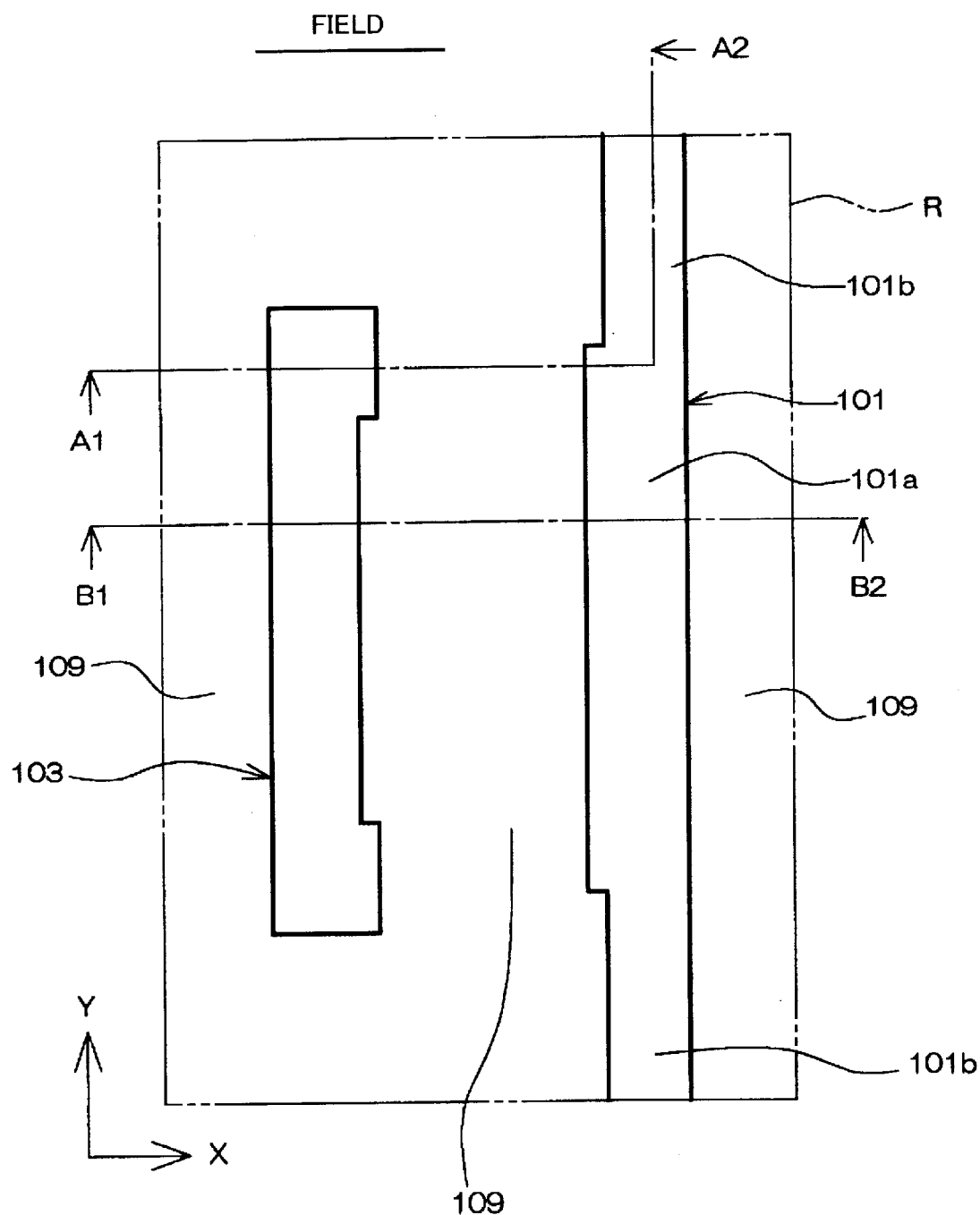
FIG. 2 is a plan view showing a field of a memory cell array of the SRAM according to the first embodiment.
Figure 3:
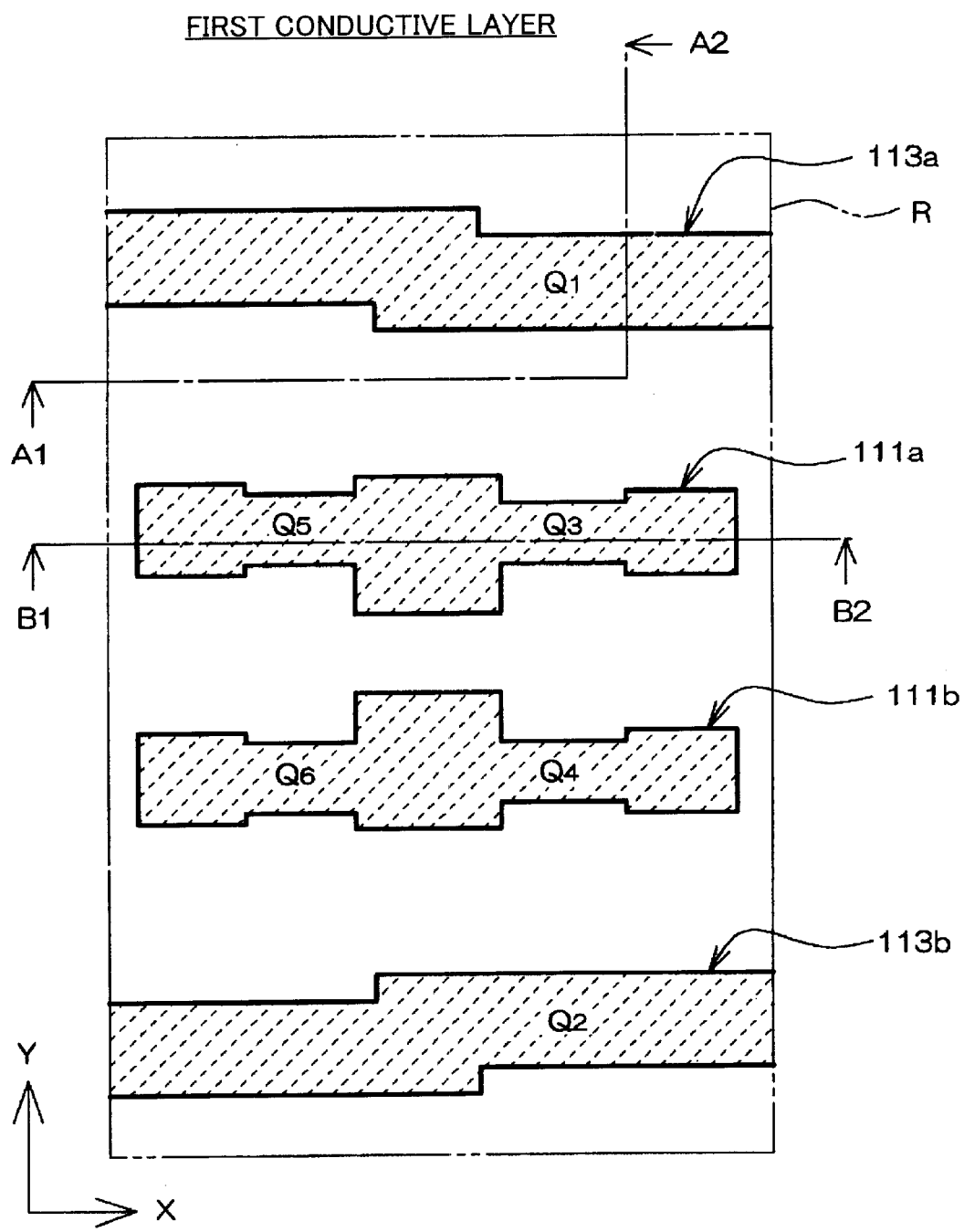
FIG. 3 is a plan view showing a first conductive layer of the memory cell array of the SRAM according to the first embodiment.
Figure 4:
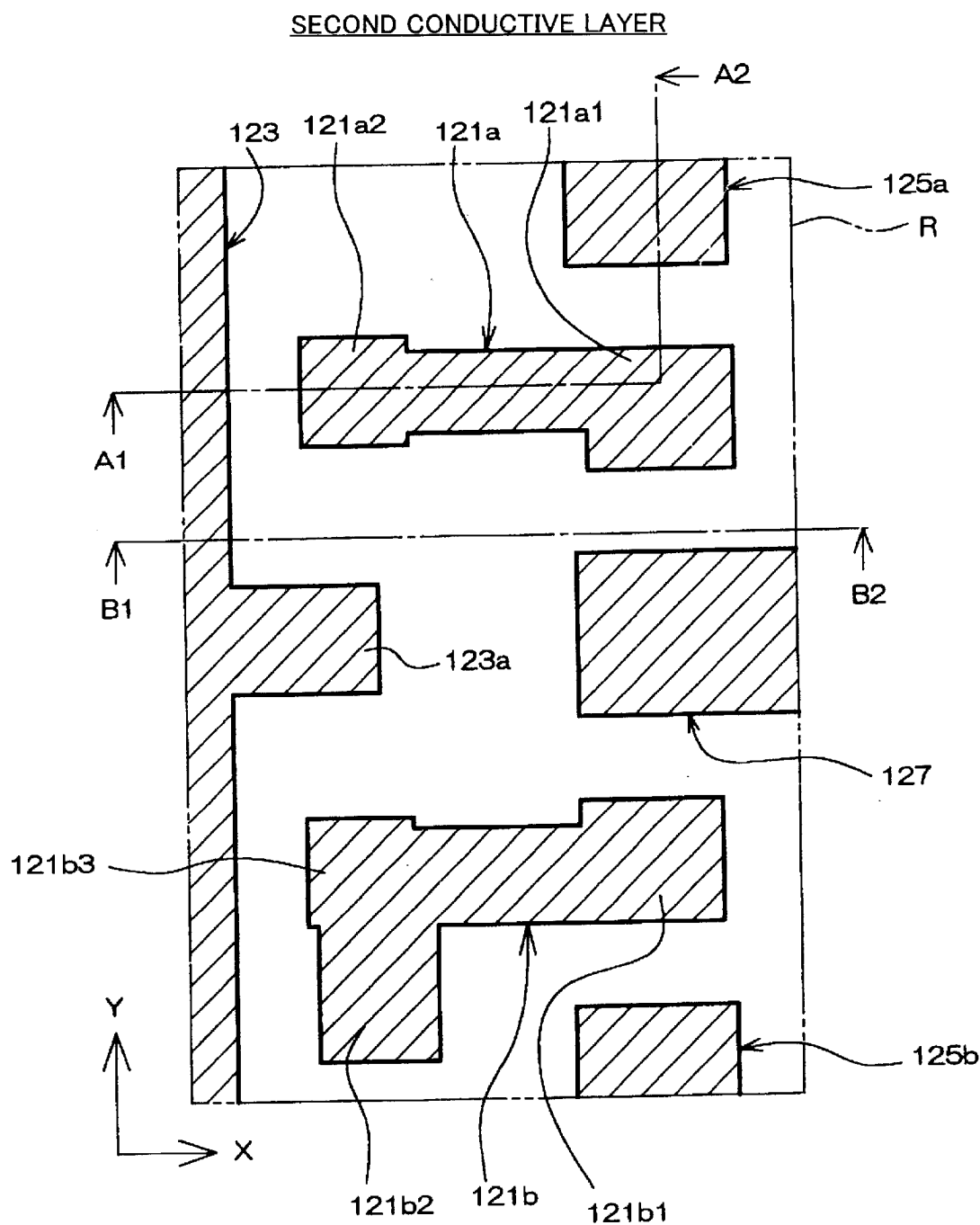
FIG. 4 is a plan view showing a second conductive layer of the memory cell array of the SRAM according to the first embodiment.
Figure 5:
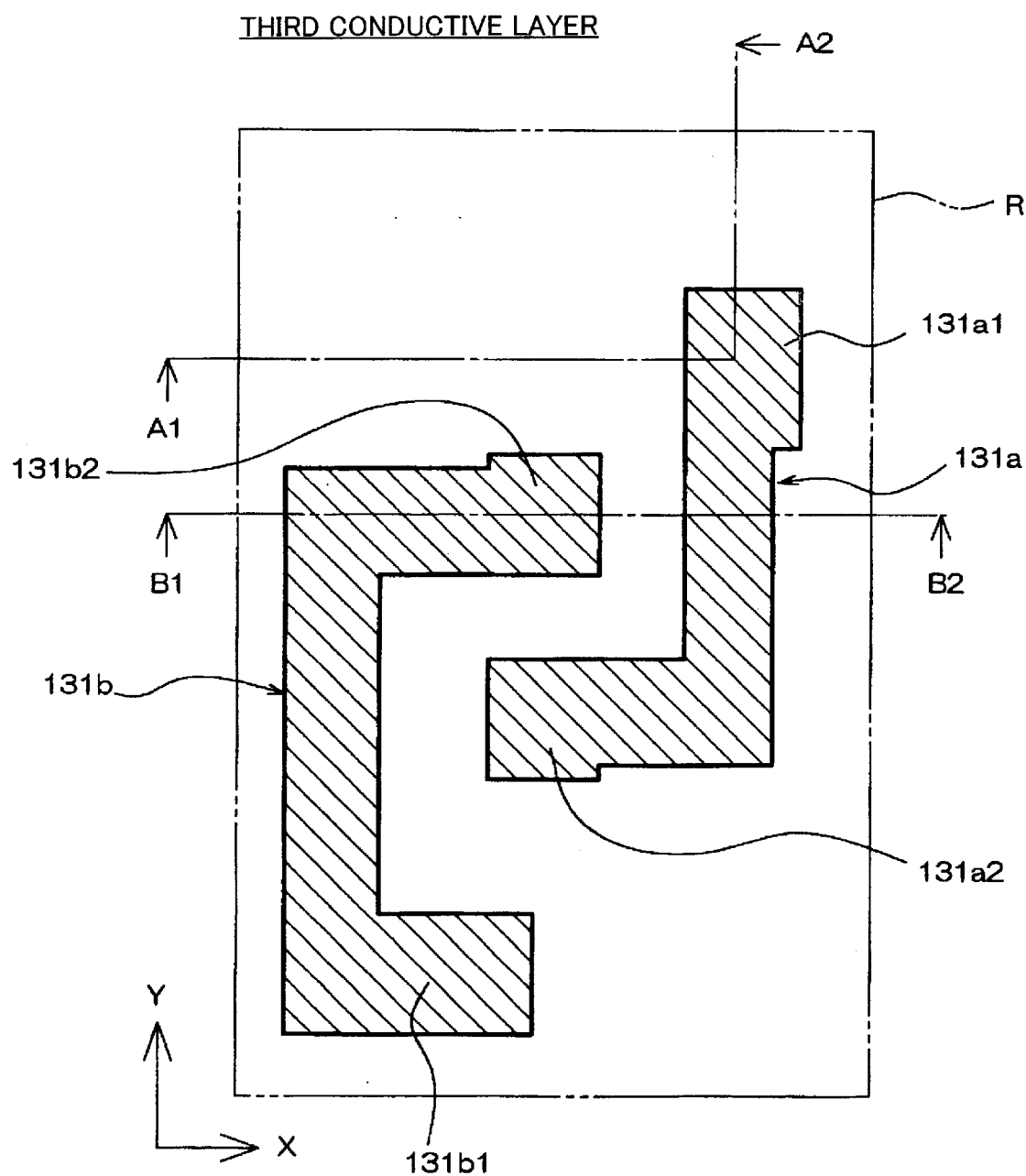
FIG. 5 is a plan view showing a third conductive layer of the memory cell array of the SRAM according to the first embodiment.
Figure 6:
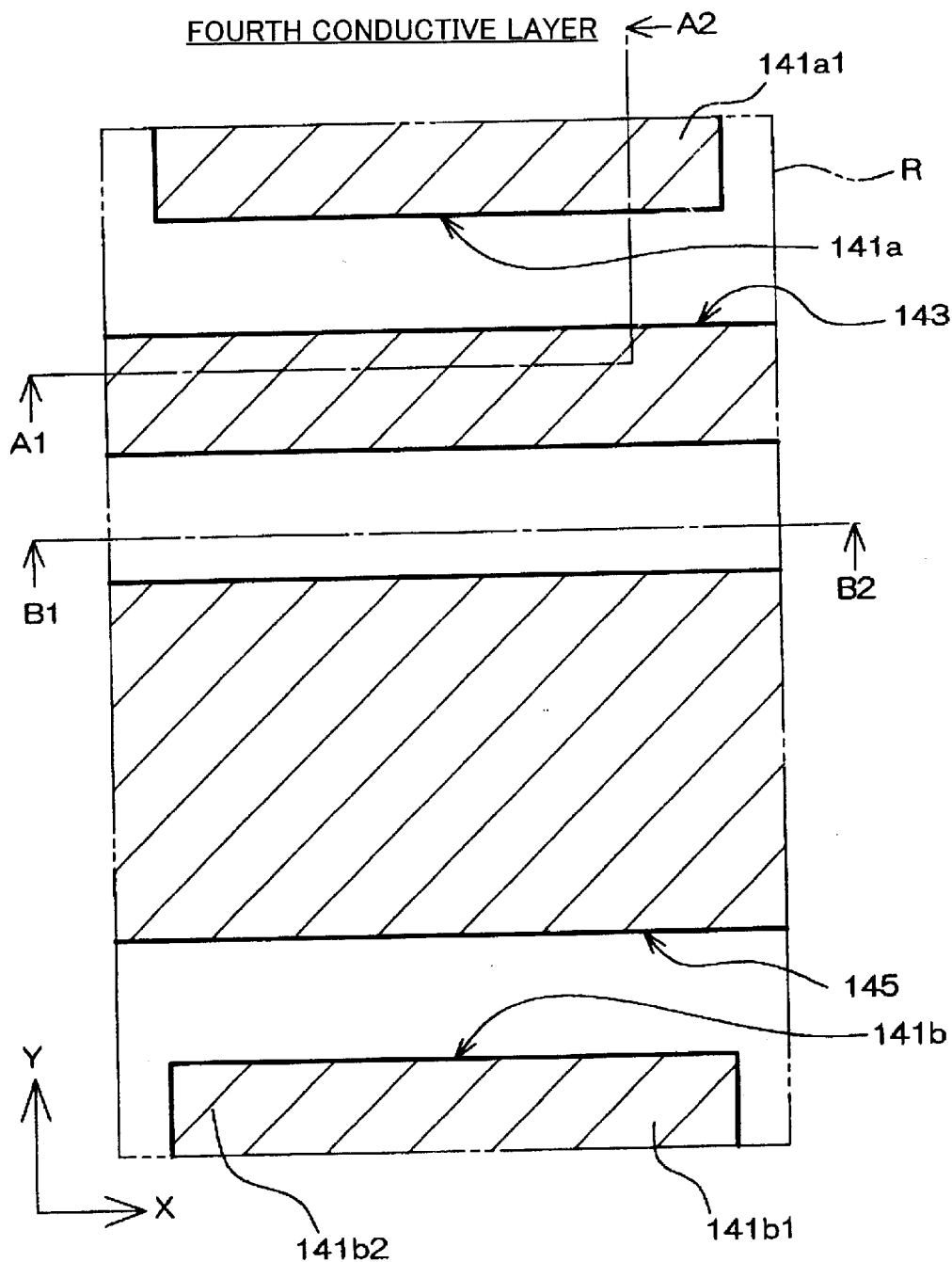
FIG. 6 is a plan view showing a fourth conductive layer of the memory cell array of the SRAM according to the first embodiment.
Figure 7:
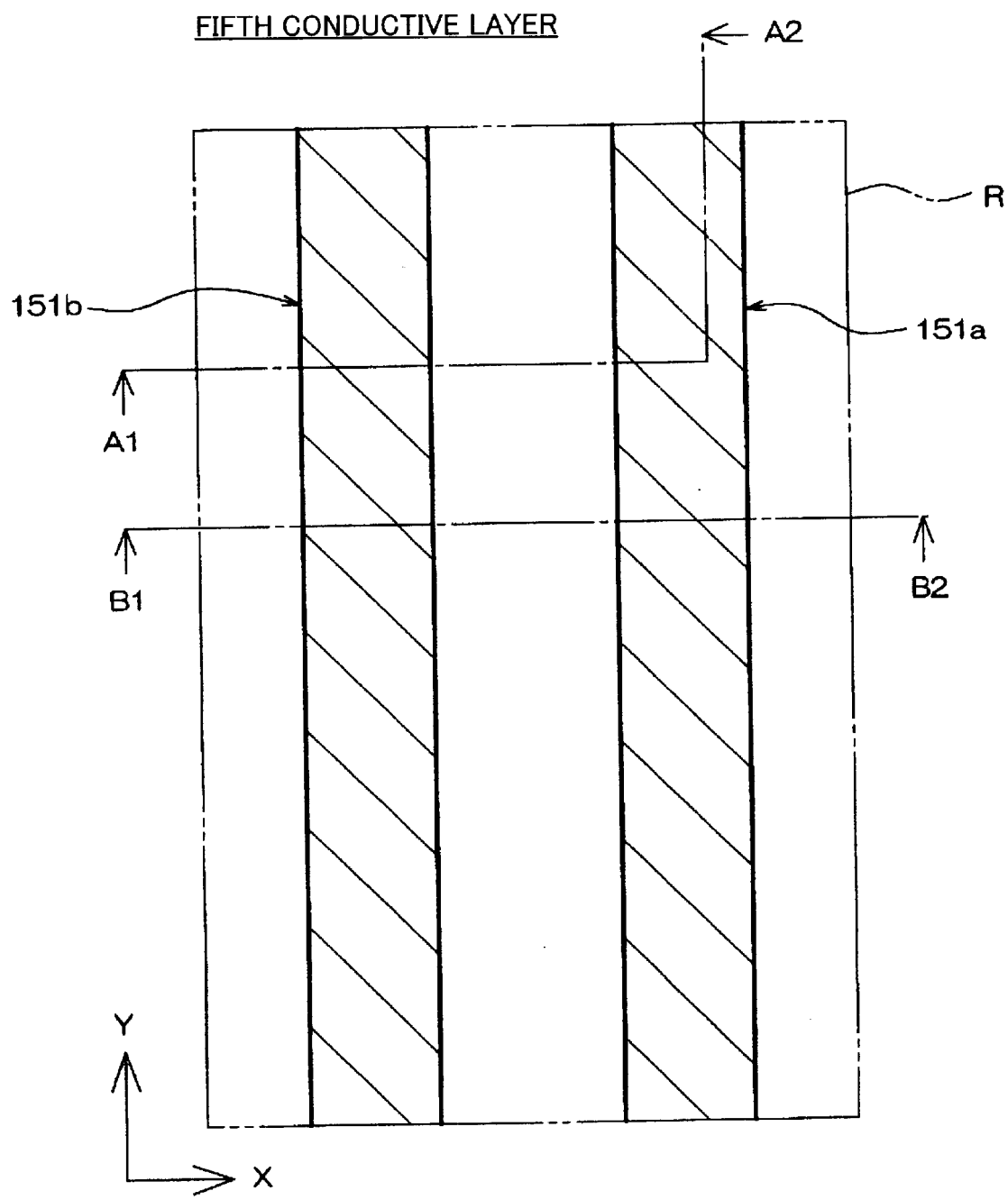
FIG. 7 is a plan view showing a fifth conductive layer of the memory cell array of the SRAM according to the first embodiment.

FIG. 2 is a plan view showing the field which includes active regions 101 and 103 having a pattern extending almost linearly in the Y direction. FIG. 3 is a plan view showing a first conductive layer, which includes gate—gate electrode layers 111a and 111b and sub word lines 113a and 113b having a pattern extending almost linearly in the X direction. The gate—gate electrode layer 111a includes gate electrodes of the driver transistor $Q_3$ and the load transistor $Q_5$. The gate—gate electrode layer 111b includes gate electrodes of the driver transistor $Q_4$ and the load transistor $Q_6$. The sub word line 113a includes a gate electrode of the transfer transistor $Q_1$. The sub word line 113b includes a gate electrode of the transfer transistor $Q_2$. FIG. 4 is a plan view showing a second conductive layer, which includes a drain—drain connecting layer 121a having a pattern extending almost linearly in the X direction, a drain—drain connecting layer 121b having a pattern in the shape of a letter "L", and a $V_{DD}$ interconnect 123 having a pattern extending almost linearly in the Y direction, and the like. FIG. 5 is a plan view showing a third conductive layer, which includes a drain-gate connecting layer 131a having a pattern in the shape of the letter "L", and a drain-gate connecting layer 131b having a pattern in the shape of the letter "C". FIG. 6 is a plan view showing a fourth conductive layer, which includes a bit line local interconnect layer 141a, a /bit line local interconnect layer 141b, a main word line 143, and a $V_{SS}$ interconnect 145, each having a pattern extending almost linearly in the X direction. FIG. 7 is a plan view showing a fifth conductive layer, which includes a bit line 151a and a /bit line 151b, each having a pattern extending almost linearly in the Y direction.

1.2 Details of SRAM Structure

Figure 8:
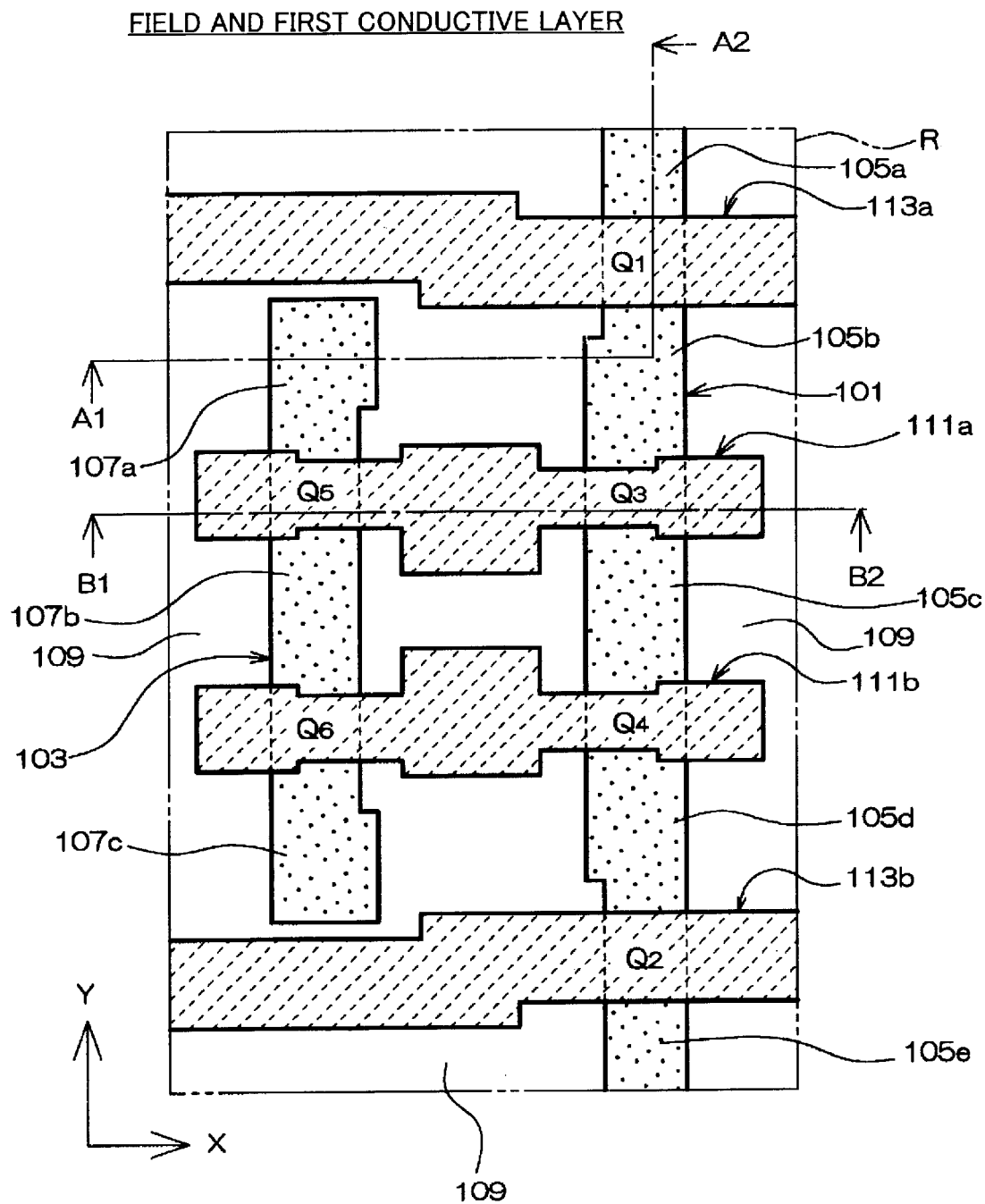
FIG. 8 is a plan view showing the field and the first conductive layer of the memory cell array of the SRAM according to the first embodiment.
Figure 9:
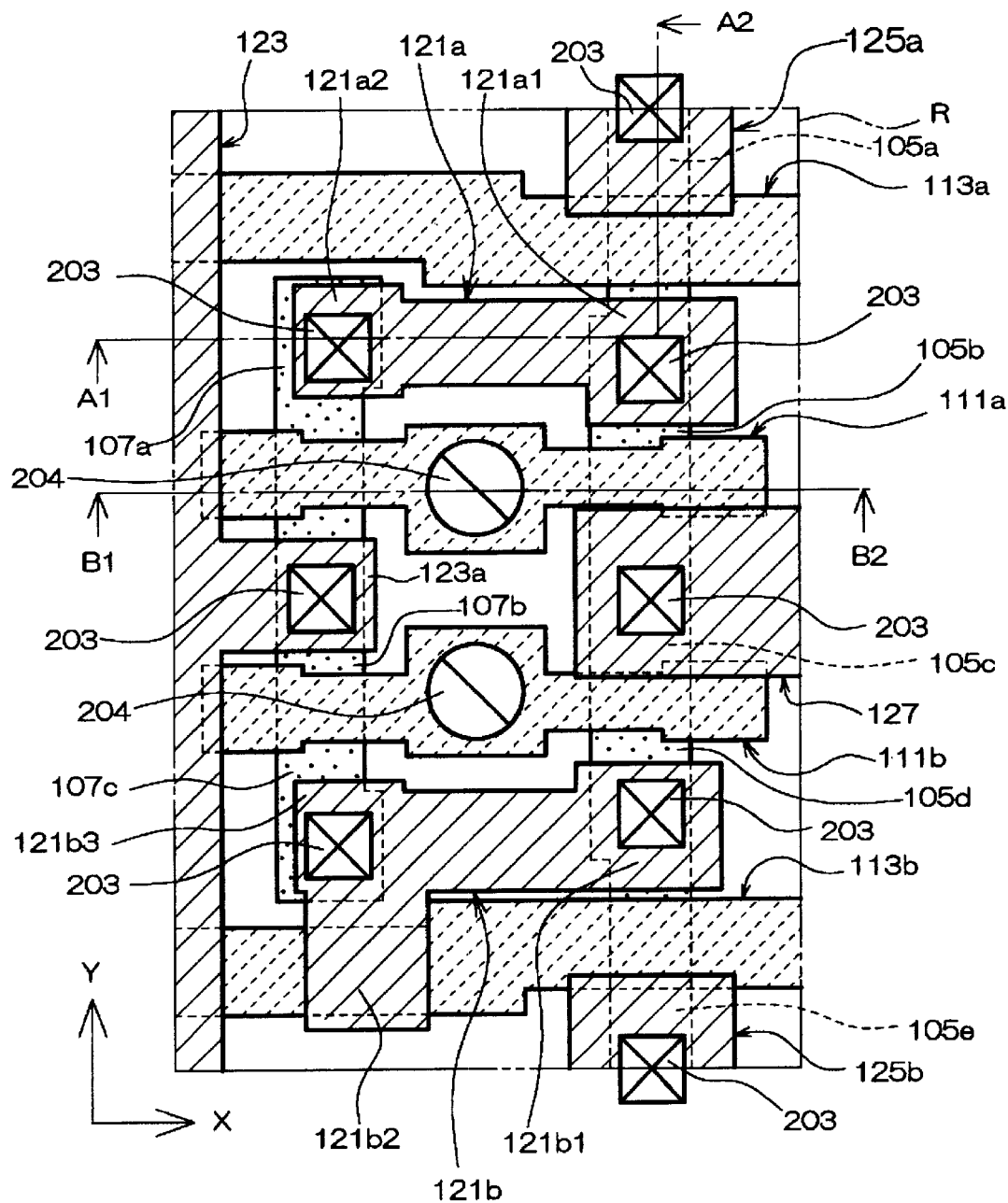
FIG. 9 is a plan view showing the field, the first conductive layer, and the second conductive layer of the memory cell array of the SRAM according to the first embodiment.
Figure 10:
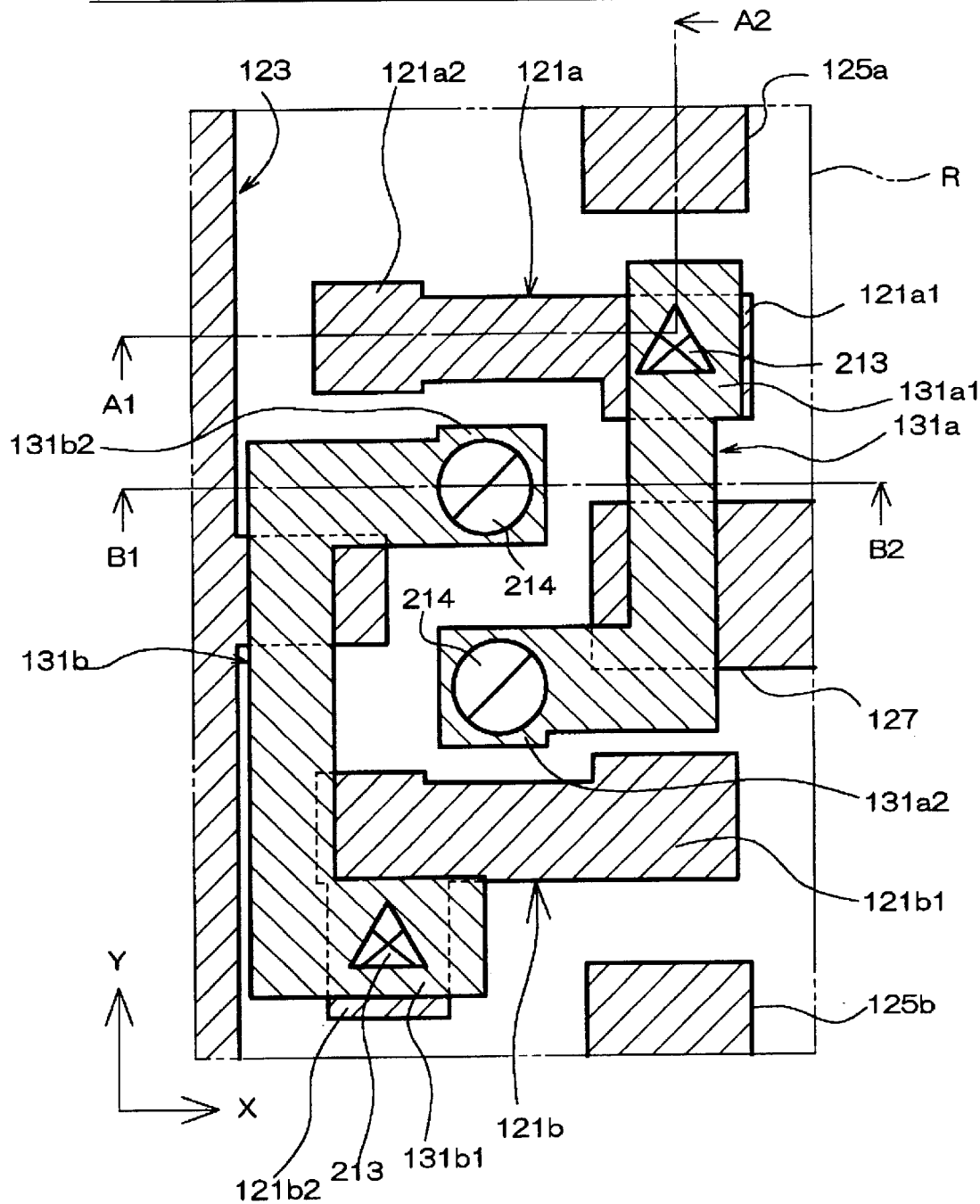
FIG. 10 is a plan view showing the second conductive layer and the third conductive layer of the memory cell array of the SRAM according to the first embodiment.
Figure 11:
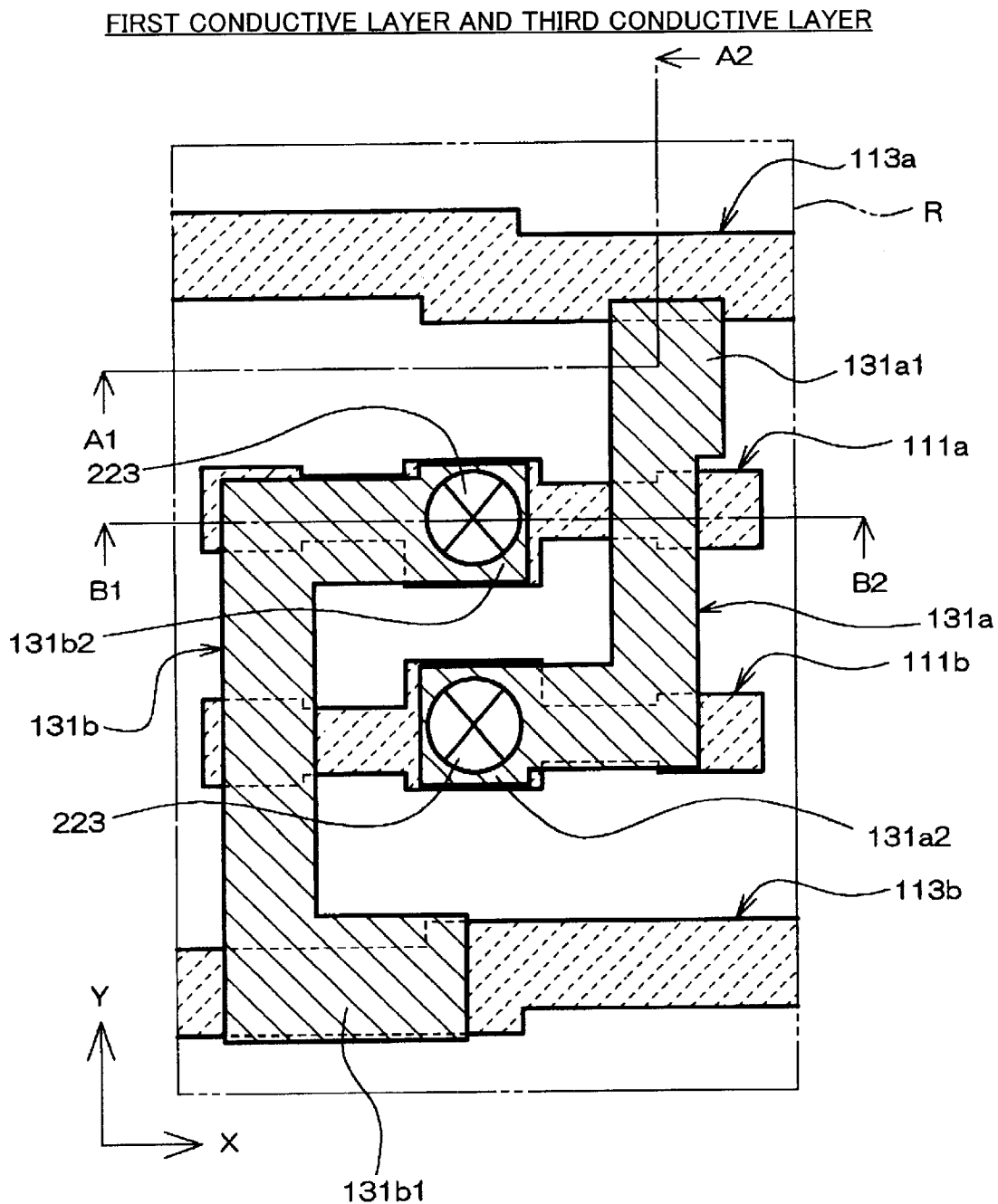
FIG. 11 is a plan view showing the first conductive layer and the third conductive layer of the memory cell array of the SRAM according to the first embodiment.
Figure 12:
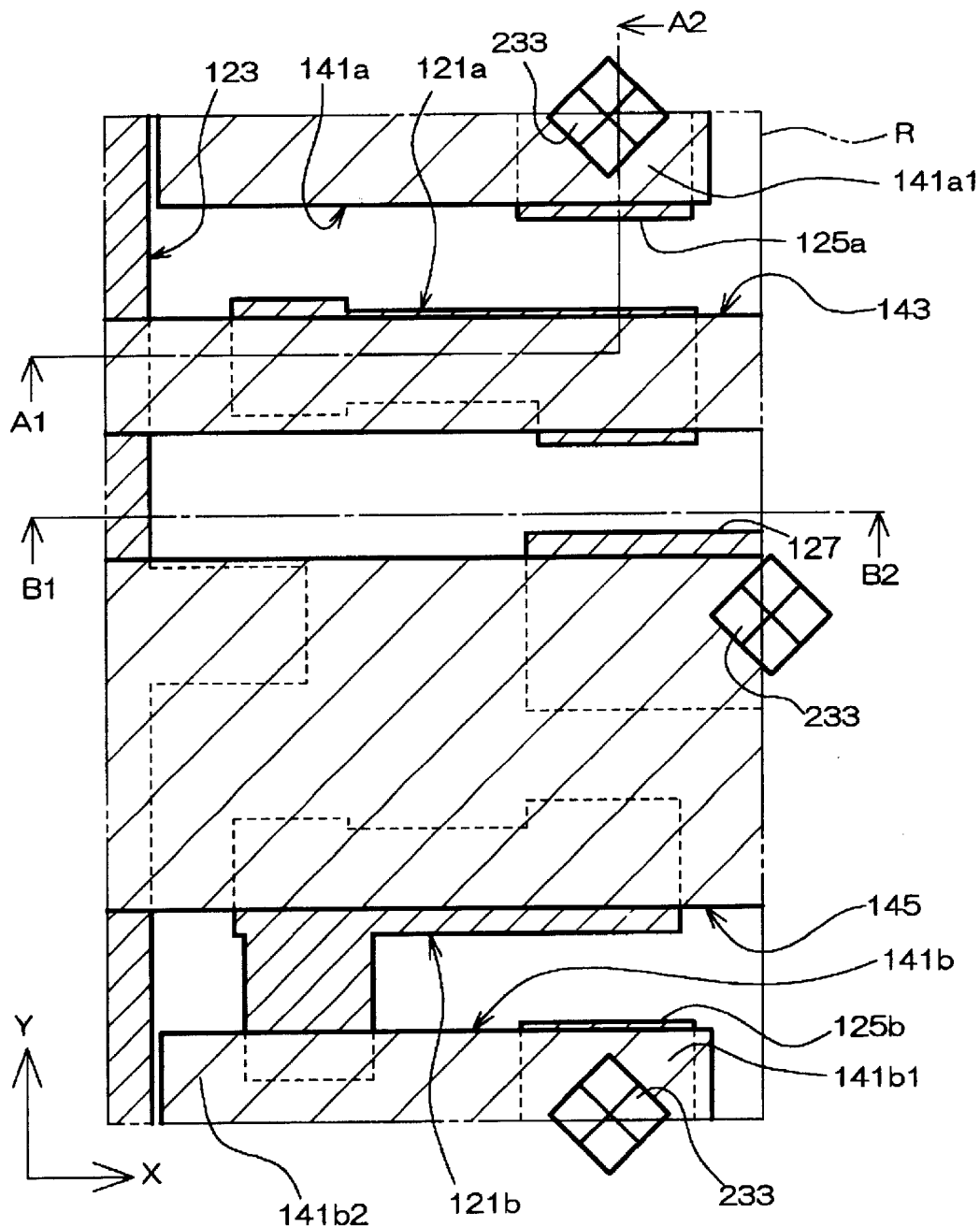
FIG. 12 is a plan view showing the second conductive layer and the fourth conductive layer of the memory cell array of the SRAM according to the first embodiment.
Figure 13:
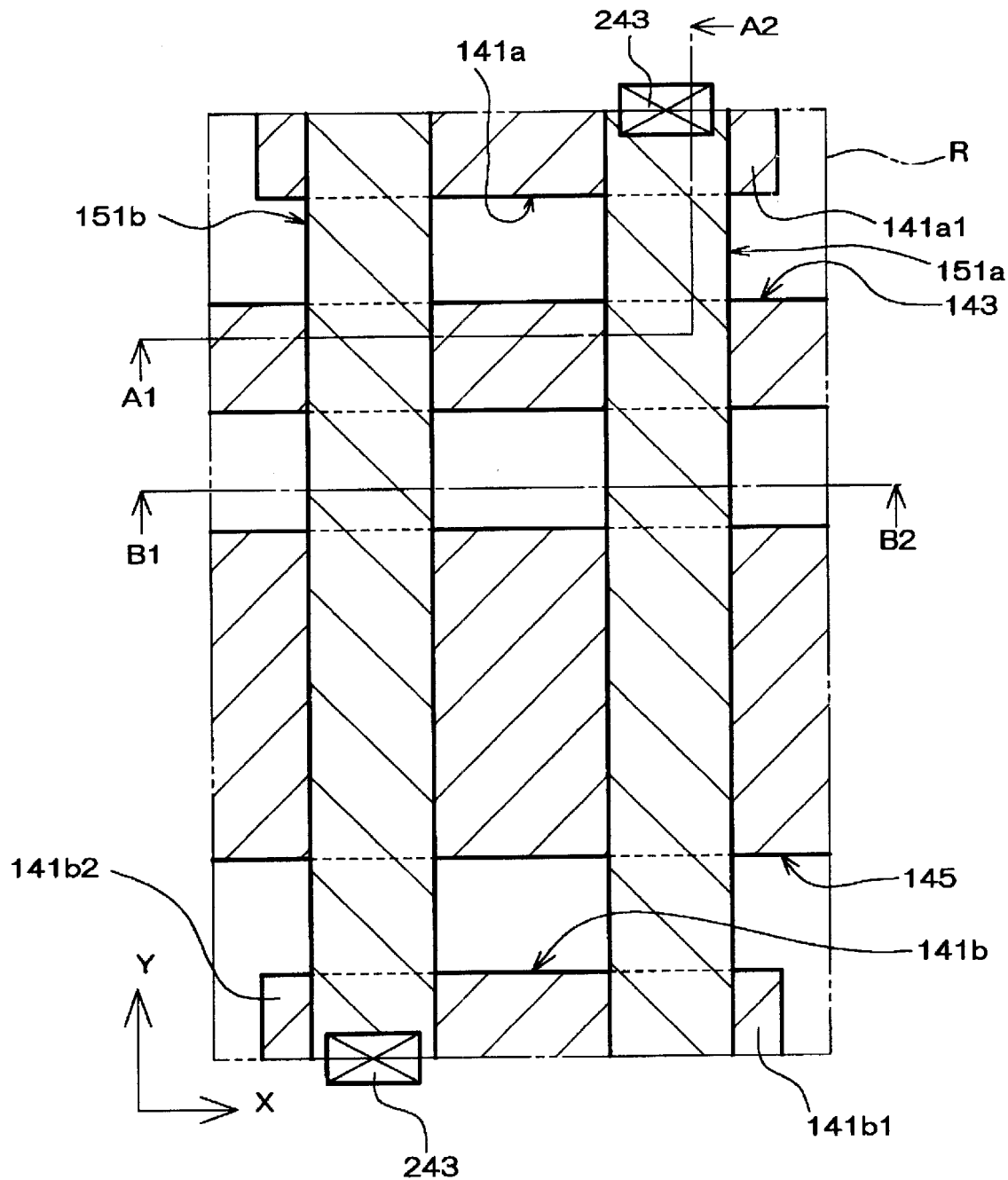
FIG. 13 is a plan view showing the fourth conductive layer and the fifth conductive layer of the memory cell array of the SRAM according to the first embodiment.
Figure 14:
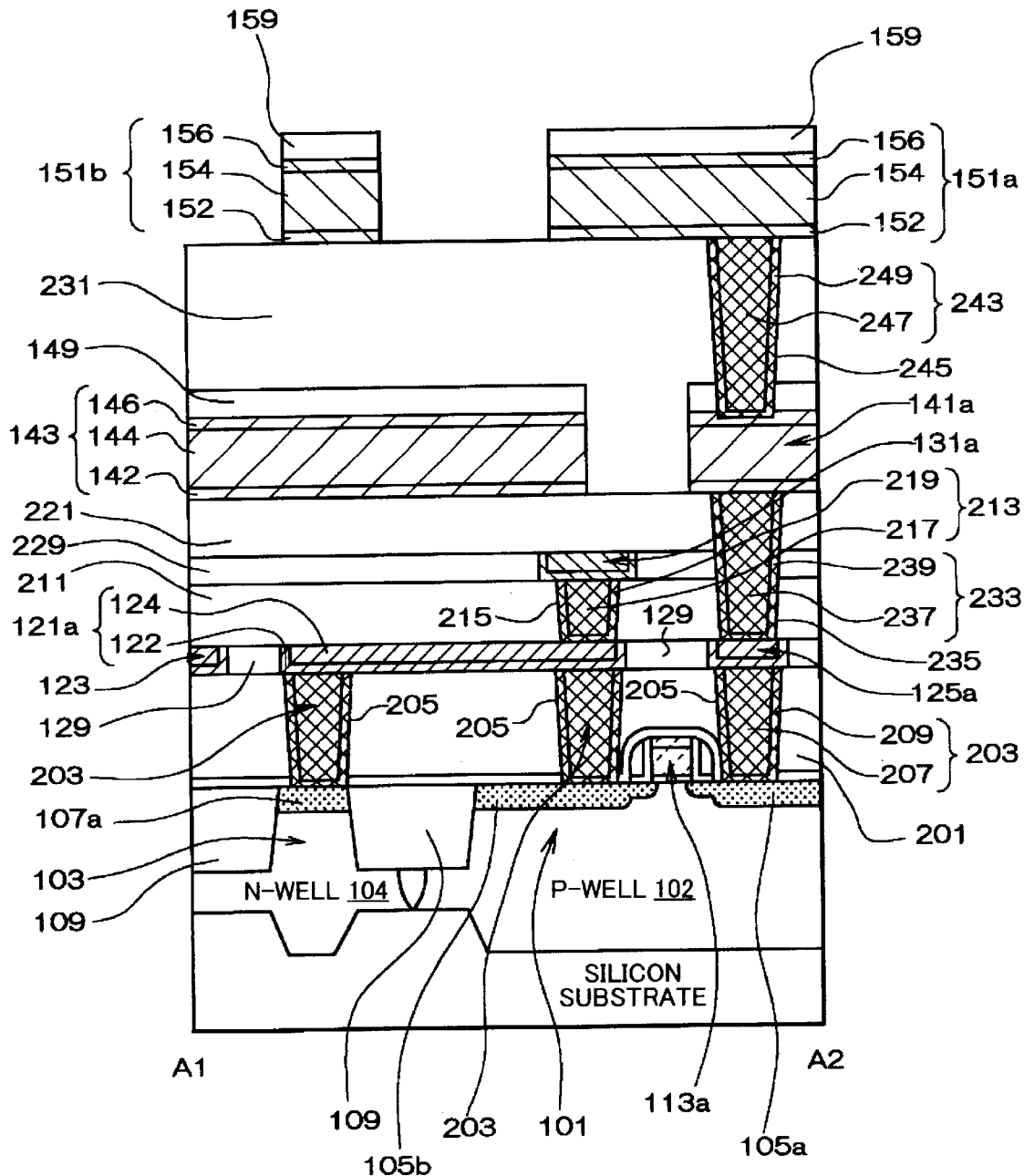
FIG. 14 is a cross-sectional view along the line A1–A2 shown in FIGS. 2 to 13.
Figure 15:
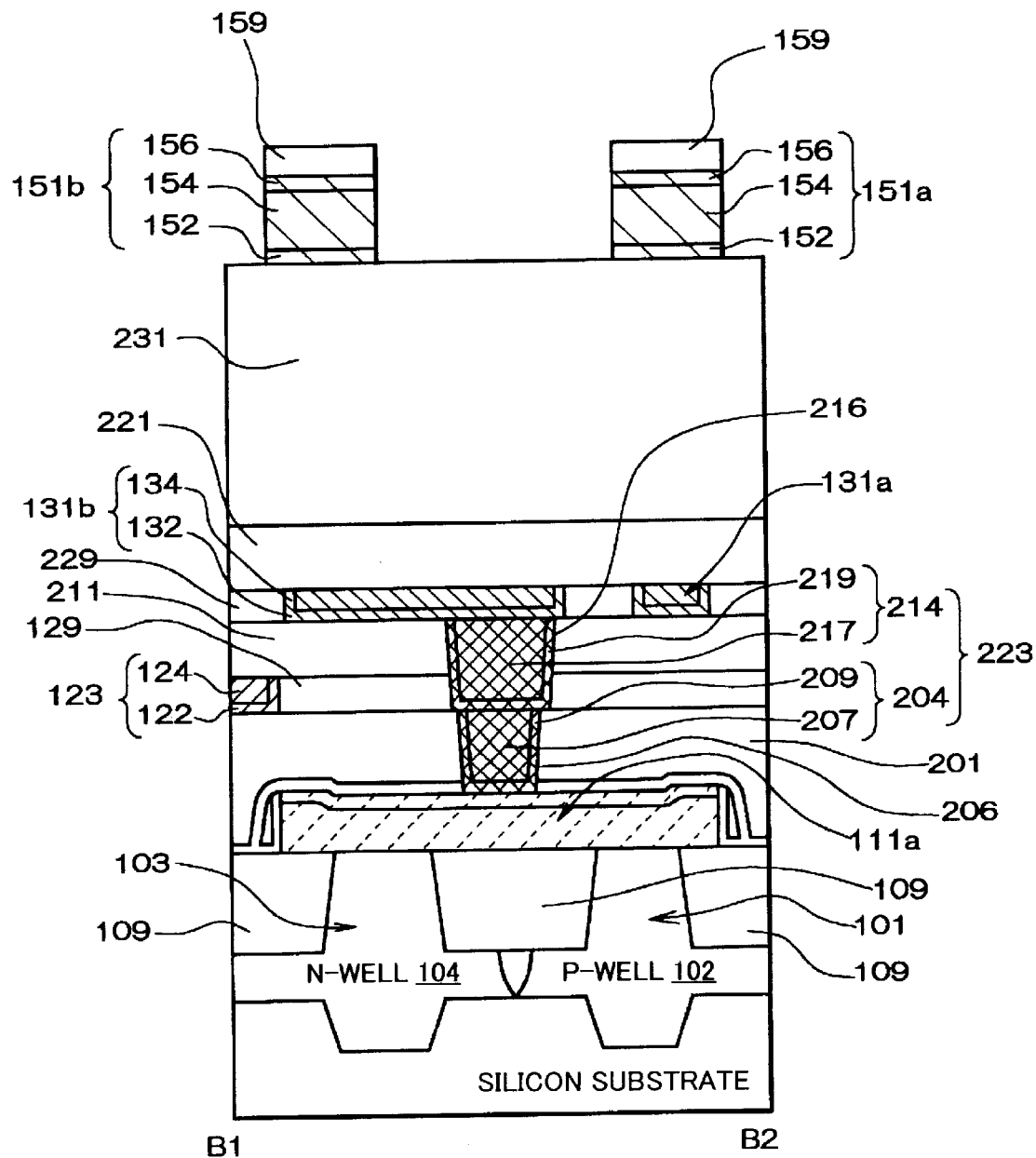
FIG. 15 is a cross-sectional view along the line B1–B2 shown in FIGS. 2 to 13.

The details of the structure of the SRAM according to the first embodiment are described below with reference to FIGS. 2 to 15 in the order from the lower layers. FIG. 8 is a plan view showing the field and the first conductive layer. FIG. 9 is a plan view showing the field, the first conductive layer, and the second conductive layer. FIG. 10 is a plan view showing the second conductive layer and the third conductive layer. FIG. 11 is a plan view showing the first conductive layer and the third conductive layer. FIG. 12 is a plan view showing the second conductive layer and the fourth conductive layer. FIG. 13 is a plan view showing the fourth conductive layer and the fifth conductive layer. FIG. 14 is a cross-section view along the line A1–A2 shown in FIGS. 2 to 13. FIG. 15 is a cross-sectional view along the line B1–B2 shown in FIGS. 2 to 13.

1.2.1 Field and First Conductive Layer

The field is described below. The field includes the active regions 101 and 103 and the element isolation regions 109, as shown in FIG. 2. The active regions 101 and 103 are formed on the surface of a silicon substrate.

The active region 101 has a pattern extending almost linearly in the Y direction. The active region 101 extends to the formation regions of other memory cells located on the upper and lower sides of the memory cell formation region R in FIG. 2. The active region 101 includes a region 101a in which the driver transistors $Q_3$ and $Q_4$ are formed and a region 101b in which the transfer transistors $Q_1$ and $Q_2$ are formed. The width of the region 101a is 0.22–0.33 $\mu$m, for example. The width of the region 101b is 0.16–0.20 $\mu$m, for example.

The active region 103 has a pattern extending almost linearly in the Y direction, and is formed at an interval from the active region 101. Both ends of the active region 103 are present inside the memory cell formation region R. The load transistors $Q_5$ and $Q_6$ are formed in the active region 103. The width of the active region 103 is 0.16–0.20 $\mu$m, for example.

The active region 101 is isolated from the active region 103 by the element isolation region 109 (depth: 0.35–0.45 $\mu$m, for example). The element isolation region 109 is formed by STI (Shallow Trench Isolation), for example. The lengths of the memory cell formation region R in the X direction and the Y direction are respectively 1.0–1.4 $\mu$m and 1.6–2.0 $\mu$m, for example.

The cross sections of the field along the line A1–A2 and the line B1–B2 shown in FIG. 2 are respectively shown in FIGS. 14 and 15. A p-well 102 and an n-well 104 formed in the silicon substrate and the like are illustrated in these cross sections.

The first conductive layer located on the field is described below with reference to FIGS. 3 and 8. A pair of gate—gate electrode layers 111a and 111b is disposed in parallel in one memory cell formation region R. The gate—gate electrode layers 111a and 111b intersect the active regions 101 and 103 in a plan view. The gate—gate electrode layer 111a forms gate electrodes of the driver transistor $Q_3$ and the load transistor $Q_5$ and connects these gate electrodes. The gate— gate electrode layer 111b forms gate electrodes of the driver transistor $Q_4$ and the load transistor $Q_6$ and connects these gate electrodes. The gate lengths of the driver transistors $Q_3$ and $Q_4$ are 0.12–0.15 μm, for example. The gate lengths of the load transistors $Q_5$ and $Q_6$ are 0.14–0.17 μm, for example.

The sub word lines 113a and 113b are located at an interval from the active region 103 in a plan view, and intersect the active region 101. The gate—gate electrode layers 111a and 111b are located between the sub word line 113a and the sub word line 113b. The sub word line 113a becomes a gate electrode of the transfer transistor $Q_1$. The sub word line 113b becomes a gate electrode of the transfer transistor $Q_2$. The gate lengths of the transfer transistors $Q_1$ and $Q_2$ are 0.14–0.17 μm, for example.

The gate—gate electrode layers 111a and 111b and the sub word lines 113a and 113b have a structure in which a silicide layer is formed on a polysilicon layer, for example.

The cross sections of the first conductive layer along the line A1–A2 and the line B1–B2 shown in FIGS. 3 and 8 are respectively shown in FIGS. 14 and 15. The sub word line 113a and the gate—gate electrode layer 111a are illustrated in these cross sections.

$n^+$-type impurity regions 105a, 105b, 105c, 105d, and 105e formed in the active region 101 are described below with reference to FIG. 8. The $n^+$-type impurity region 105a and the $n^+$-type impurity region 105b are located so that the sub word line 113a is interposed therebetween in a plan view. The $n^+$-type impurity region 105b and the $n^+$-type impurity region 105c are located so that the gate—gate electrode layer 111a is interposed therebetween. The $n^+$-type impurity region 105c and the $n^+$-type impurity region 105d are located so that the gate—gate electrode layer 111b is interposed therebetween. The $n^+$-type impurity region 105d and the $n^+$-type impurity region 105e are located so that the sub word line 113b is interposed therebetween.

The $n^+$-type impurity region 105a becomes either a source or a drain of the transfer transistor $Q_1$. The $n^+$-type impurity region 105b becomes either a source or a drain of the transfer transistor $Q_1$ and a drain of the driver transistor $Q_3$. The $n^+$-type impurity region 105c becomes a common source of the driver transistors $Q_3$ and $Q_4$. The $n^+$-type impurity region 105d becomes a drain of the driver transistor $Q_4$ and either a source or a drain of the transfer transistor $Q_2$. The $n^+$-type impurity region 105e becomes either a source or a drain of the transfer transistor $Q_2$.

$p^+$-type impurity regions 107a, 107b, and 107c formed in the active region 103 are described below with reference to FIG. 8. The $p^+$-type impurity region 107a and the $p^+$-type impurity region 107b are located so that the gate—gate electrode layer 111a is interposed therebetween in a plan view. The $p^+$-type impurity region 107b and the $p^+$-type impurity region 107c are located so that the gate—gate electrode layer 111b is interposed therebetween. The p+-type impurity region 107a becomes a drain of the load transistor $Q_5$. The $p^+$-type impurity region 107c becomes a drain of the load transistor $Q_6$. The $p^+$-type impurity region 107b becomes a common source of the load transistors $Q_5$ and $Q_6$. The $n^+$-type impurity regions 105a and 105b and the $p^+$-type impurity region 107a are illustrated in the cross section shown in FIG. 14.

An interlayer dielectric 201 such as a silicon oxide layer is formed to cover the field and the first conductive layer, as shown in FIGS. 14 and 15. The interlayer dielectric 201 is planarized by chemical mechanical polishing (hereinafter abbreviated as "CMP").

1.2.2 Second Conductive Layer

The second conductive layer is described below with reference to FIGS. 4 and 9. The second conductive layer is located on the first conductive layer. The second conductive layer includes the drain—drain connecting layers 121a and 121b, $V_{DD}$ interconnect 123, bit line contact pad layer 125a, /bit line contact pad layer 125b, and ground line local interconnect layer 127. The second conductive layer is connected to the $n^+$-type impurity regions and the $p^+$-type impurity regions in the field through contact-conductive sections 203 which connect the second conductive layer with the field (hereinafter called "field/second-layer contact-conductive sections 203").

The gate—gate electrode layers 111a and 111b are located between the drain—drain connecting layers 121a and 121b in a plan view. The drain—drain connecting layer 121a is located above the $n^+$-type impurity region 105b (drain) and the $p^+$-type impurity region 107a (drain). The end section 121a1 of the drain—drain connecting layer 121a is connected to the $n^+$-type impurity region 105b (drain) through the field/second-layer contact-conductive section 203. The end section 121a2 of the drain—drain connecting layer 121a is connected to the $p^+$-type impurity region 107a (drain) through the field/second-layer contact-conductive section 203. The drain—drain connecting layer 121b is located above the $n^+$-type impurity region 105d (drain) and the $p^+$-type impurity region 107c (drain). The end section 121b1 of the drain—drain connecting layer 121b is connected to the $n^+$-type impurity region 105d (drain) through the field/second-layer contact-conductive section 203. The corner section 121b3 of the drain—drain connecting layer 121b in the shape of the letter "L" is connected to the $p^+$-type impurity region 107c (drain) through the field/second-layer contact-conductive section 203. The widths of the drain—drain connecting layer 121a and 121b are 0.16–0.20 μm, for example.

The width of the $V_{DD}$ interconnect 123 is 0.16–0.20 μm, for example. A convex section 123a of the $V_{DD}$ interconnect 123 extends in the X direction and is located above the $p^+$-type impurity region 107b (source). The convex section 123a is connected to the $p^+$-type impurity region 107b through the field/second-layer contact-conductive section 203.

The ground line local interconnect layer 127 is located above the $n^+$-type impurity region 105c (source). The ground line local interconnect layer 127 is connected to the $n^+$-type impurity region 105c through the field/second-layer contact-conductive section 203. The ground line local interconnect layer 127 function as an interconnect layer for connecting the $V_{SS}$ interconnect 145 (FIG. 6) with the $n^+$-type impurity region 105c which becomes the source of the driver transistors $Q_3$ and $Q_4$. The memory cell in the formation region R and a memory cell located at the right of the formation region R in FIG. 9 share the ground line local interconnect layer 127.

The bit line contact pad layer 125a is located above the $n^+$-type impurity region 105a. The bit line contact pad layer 125a is connected to the $n^+$-type impurity region 105a through the field/second-layer contact-conductive section 203. The bit line contact pad layer 125a functions as a pad layer for connecting the bit line 151a (FIG. 7) with the $n^+$-type impurity region 105a which becomes either a source or a drain of the transfer transistor $Q_1$. The memory cell in the formation region R and a memory cell located on the upper side of the formation region R in FIG. 9 share the bit line contact pad layer 125a.

The /bit line contact pad layer 125b is located above the $n^+$-type impurity region 105e. The /bit line contact pad layer 125b is connected to the n+-type impurity region 105e through the field/second-layer contact-conductive section 203. The /bit line contact pad layer 125b functions as a pad layer for connecting the /bit line 151b (FIG. 7) with the n+-type impurity region 105e which becomes either a source or a drain of the transfer transistor $Q_2$. The memory cell in the formation region R and a memory cell located under the formation region R in FIG. 9 share the bit line contact pad layer 125b.

The cross-sectional structure of the second conductive layer is described below with reference to FIG. 14. The second conductive layer has a structure in which the second conductive layer is buried in an insulating layer 129 such as a silicon oxide layer, for example. The second conductive layer is formed using a damascene process. The second conductive layer has a structure in which a tungsten-containing layer 124 (thickness: 100–200 nm, for example) is formed on a high-melting-point metal nitride layer 122, for example. The high-melting-point metal nitride layer 122, which becomes an underlay, is a titanium nitride layer, for example. The tungsten-containing layer 124 may be a layer containing only tungsten or a layer further containing other metals. The second conductive layer may be formed only of the tungsten-containing layer 124.

The cross-sectional structure of the field/second-layer contact-conductive section 203 is described below with reference to FIG. 14. A plurality of through-holes 205 which expose the n+-type impurity regions and the p+-type impurity regions present in the field is formed in the interlayer dielectric 201. The through-holes 205 are filled with the field/second-layer contact-conductive sections 203. The field/second-layer contact-conductive section 203 includes a plug 207 buried in the through-hole 205 and a barrier layer 209 located at the bottom and on the side of the through-hole 205. The barrier layer 209 is preferably formed of a high-melting-point metal layer and a high-melting-point metal nitride layer formed on the metal layer. As a material for the high-melting-point metal layer, titanium and the like can be given. As a material for the high-melting-point metal nitride layer, titanium nitride and the like can be given. The upper end diameter of the through-hole 205 is 0.18–0.22 μm, for example. The lower end diameter of the through-hole 205 is 0.14–0.18 μm, for example. Contact-conductive sections 223 used to connect the gate—gate electrode layers 111a and 111b with the drain-gate connecting layers 131a and 131b (hereinafter called "first-layer/third-layer stacked contact-conductive sections 223") are described below with reference to FIG. 15. FIG. 15 shows the first-layer/third-layer stacked contact-conductive section 223 which connects the gate—gate electrode layer 111a with the drain-gate connecting layer 131b. The first-layer/third-layer stacked contact conductive section 223 has a structure in which an upper layer conductive section 214 is stacked on a lower layer conductive section 204. The lower layer conductive section 204 is buried in the interlayer dielectric 201. The lower layer conductive section 204 is formed in the same step as the field/second-layer contact-conductive section 203. The lower layer conductive section 204 includes the plug 207 buried in a through-hole 206 and a plug layer 209. The upper layer conductive section 214 is described in the section "Third conductive layer".

An interlayer dielectric 211 such as a silicon oxide layer is formed to cover the second conductive layer, as shown in FIGS. 14 and 15. The interlayer dielectric 211 is planarized by CMP.

1.2.3 Third Conductive Layer

The third conductive layer is described below with reference to FIGS. 5, 10, and 11. The third conductive layer is located on the second conductive layer. The third conductive layer includes the drain-gate connecting layers 131a and 131b. The widths of the drain-gate connecting layers 131a and 131b are 0.16–0.20 μm, for example.

The drain-gate connecting layer 131a has a pattern in the shape of the letter "L", with the end section 131a located above the end section 121a1 of the drain—drain connecting layer 121a (FIG. 10). The end section 131a1 of the drain-gate connecting layer 131a is connected to the end section 121a1 of the drain—drain connecting layer 121a through a contact-conductive section 213 which connects the third conductive layer with the second conductive layer (hereinafter called "second-layer/third-layer contact-conductive section 213") (FIG. 10). The end section 131a2 of the drain-gate connecting layer 131a is located above the center of the gate—gate electrode layer 111b (FIG. 11). The end section 131a2 of the drain-gate connecting layer 131a is connected to the center of the gate—gate electrode layer 111b through the first-layer/third-layer stacked contact-conductive section 223 (FIG. 11).

The drain-gate connecting layer 131b is in the shape of the letter "C", with the end section 131b1 located above the end section 121b2 of the drain—drain connecting layer 121b (FIG. 10). The end section 131b1 of the drain-gate connecting layer 131b is connected to the end section 121b2 of the drain—drain connecting layer 121b through the second-layer/third-layer contact-conductive section 213 (FIG. 10). The end section 131b2 of the drain-gate connecting layer 131b is located above the center of the gate—gate electrode layer 111a (FIG. 11). The end section 131b2 of the drain-gate connecting layer 131b is connected to the center of the gate—gate electrode layer 111a through the first-layer/third-layer stacked contact-conductive section 223 (FIG. 11).

The cross-sectional structure of the third conductive layer is described below with reference to FIGS. 14 and 15. The third conductive layer has a structure in which the third conductive layer is buried in an insulating layer 229 such as a silicon oxide layer, for example. The third conductive layer is formed using a damascene process. The third conductive layer has a structure in which a tungsten-containing layer 134 (thickness: 100–200 nm, for example) is formed on a high-melting-point metal nitride layer 132. The high-melting-point metal nitride layer 132, which becomes an underlay, is a titanium nitride layer, for example. The tungsten-containing layer 134 may be a layer containing only tungsten or a layer further containing other metals. The third conductive layer may be formed only of the tungsten-containing layer 134.

The cross-sectional structure of the second-layer/third-layer contact-conductive section 213 is described below with reference to FIG. 14. The through-hole 215 formed through the interlayer dielectric 211 is filled with the second-layer/third-layer contact-conductive section 213. The second-layer/third-layer contact-conductive section 213 may have the same structure as that described for the field/second-layer contact-conductive section 203.

The upper layer conductive section 214 of the first-layer/third-layer stacked contact-conductive section 223 is described below with reference to FIG. 15. FIG. 15 shows the first-layer/third-layer stacked contact-conductive section 223 which connects the gate—gate electrode layer 111a with the drain-gate connecting layer 131b. The upper layer conductive section 214 is buried in the interlayer dielectric 211 and the insulating layer 129, and connected to the lower layer conductive section 204 and the drain-gate connecting layer 131b. The upper layer conductive section 214 is formed in the same step as the second-layer/third-layer contact-conductive section 213. The upper layer conductive section 214 includes a plug 217 buried in a through-hole 216 and a plug layer 219.

An interlayer dielectric 221 such as a silicon oxide layer is formed to cover the third conductive layer, as shown in FIGS. 14 and 15. The interlayer dielectric 221 is planarized by CMP.

1.2.4 Fourth Conductive Layer

The fourth conductive layer is described below with reference to FIGS. 6 and 12. The fourth conductive layer is located on the third conductive layer. The fourth conductive layer includes the bit line local interconnect layer 141a, the /bit line local interconnect layer 141b, the main word line 143, and the $V_{SS}$ interconnect 145, each having a pattern extending almost linearly in the X direction. The main word line 143 and the $V_{SS}$ interconnect 145 are located between the bit line local interconnect layer 141a and the /bit line local interconnect layer 141b.

The $V_{SS}$ interconnect 145 is located above the ground line local interconnect layer 127, and connected to the ground line local interconnect layer 127 through a contact-conductive section 233 which connects the fourth conductive layer with the second conductive layer (hereinafter called "second-layer/fourth-layer contact-conductive section 233"). The width of the $V_{SS}$ interconnect 145 is 0.4–1.0 μm, for example.

The main word line 143 is located above the drain—drain connecting layer 121a. The sub word lines 113a and 113b (FIG. 8) are activated or deactivated by the main word line 143. The width of the main word line 143 is 0.18–0.24 μm, for example. In the present embodiment, the word line consists of the sub word lines and the main word line. However, the main word line need not be formed.

The bit line local interconnect layer 141a functions as an interconnect layer for connecting the bit line 151a (FIG. 7) with the $n^+$-type impurity region 105a (FIG. 8) which becomes either a source or a drain of the transfer transistor $Q_1$. The end section 141a1 of the bit line local interconnect layer 141a is connected to the bit line contact pad layer 125a through the second-layer/fourth-layer contact-conductive section 233. The memory cell in the formation region R and a memory cell located on the upper side of the formation region R in FIG. 12 share the bit line local interconnect layer 141a. The width of the bit line local interconnect layer 141a is 0.2–0.4 μm, for example.

The /bit line local interconnect layer 141b functions as an interconnect layer for connecting the /bit line 151b (FIG. 7) with the $n^+$-type impurity region 105e (FIG. 8) which becomes either a source or a drain of the transfer transistor $Q_2$. The end section 141b1 of the /bit line local interconnect layer 141b is connected to the /bit line contact pad layer 125b through the second-layer/fourth-layer contact-conductive section 233. The memory cell in the formation region R and a memory cell located under the formation region R in FIG. 12 share the /bit line local interconnect layer 141b. The width of the /bit line local interconnect layer 141b is 0.2–0.4 μm, for example.

The cross-sectional structure of the fourth conductive layer is described below with reference to FIG. 14. The fourth conductive layer has a structure in which a high-melting-point metal nitride layer 142, a metal layer 144, and a high-melting-point metal nitride layer 146 are layered in that order from the bottom, for example. Specific examples of each layer are given below. As examples of the high-melting-point metal nitride layer 142, a titanium nitride layer and the like can be given. As examples of the metal layer 144, an aluminum layer, a copper layer, an alloy layer of these metals, and the like can be given. As examples of the high-melting-point metal nitride layer 146, a titanium nitride layer and the like can be given. The fourth conductive layer may have any of the following features. 1) The fourth conductive layer may be formed only of a high-melting-point metal nitride layer. 2) The fourth conductive layer may be formed only of a metal layer.

A hard mask layer 149 is formed of a silicon oxide layer on the fourth conductive layer. The fourth conductive layer is patterned using the hard mask layer 149 as a mask. This is because miniaturization of memory cells makes it difficult to pattern the fourth conductive layer using only a resist as a mask.

The cross-sectional structure of the second-layer/fourth-layer contact-conductive section 233 is described below with reference to FIG. 14. The second-layer/fourth-layer contact-conductive section 233 is buried in a through-hole 235 formed through the interlayer dielectrics 211 and 221. In this cross section, the second-layer/fourth-layer contact-conductive section 233 connects the bit line contact pad layer 125a with the bit line local interconnect layer 141a. The second-layer/fourth-layer contact-conductive section 233 may have the same structure as that described for the field/second-layer contact-conductive section 203.

An interlayer dielectric 231 such as a silicon oxide layer is formed to cover the fourth conductive layer, as shown in FIGS. 14 and 15. The interlayer dielectric 231 is planarized by CMP.

1.2.5 Fifth Conductive Layer

The fifth conductive layer is described below with reference to FIGS. 7 and 13. The fifth conductive layer is located on the fourth conductive layer. The fifth conductive layer includes the bit line 151a and the /bit line 151b, each having a pattern extending almost linearly in the Y direction. A signal which compensates a signal flowing through the bit line 151a flows through the /bit line 151b. The widths of the bit line 151a and the /bit line 151b are 0.20–0.26 μm, for example.

The bit line 151a is connected to the end section 141a1 of the bit line local interconnect layer 141a through a contact-conductive section 243 which connects the fifth conductive layer with the fourth conductive layer (hereinafter called "fourth layer/fifth layer contact-conductive section 243"). The /bit line 151b is connected to the end section 141b2 of the /bit line local interconnect layer 141b through the fourth layer/fifth layer contact-conductive section 243.

The cross-sectional structure of the fifth conductive layer is described below with reference to FIGS. 14 and 15. The fifth conductive layer has a structure in which a high-melting-point metal nitride layer 152, a metal layer 154, and a high-melting-point metal nitride layer 156 are layered in that order from the bottom, for example. Specific examples of each layer are given below. As examples of the high-melting-point metal nitride layer 152, a titanium nitride layer and the like can be given. As examples of the metal layer 154, an aluminum layer, a copper layer, an alloy layer of these metals, and the like can be given. As examples of the high-melting-point metal nitride layer 156, a titanium nitride layer and the like can be given. The fifth conductive layer may have any of the following features. 1) The fifth conductive layer may be formed only of a high-melting-point metal nitride layer. 2) The fifth conductive layer may be formed only of a metal layer.

A hard mask layer 159 is formed of a silicon oxide layer on the fifth conductive layer. The reason for forming the hard mask layer 159 is the same as that for the hard mask layer 149.

The cross-sectional structure of the fourth layer/fifth layer contact-conductive section 243 is described below with reference to FIG. 14. The fourth layer/fifth layer contact-conductive section 243 is buried in a through-hole 245 formed through the interlayer dielectric 231. In this cross section, the fourth layer/fifth layer contact-conductive section 243 connects the bit line 151a with the bit line local interconnect layer 141a. The fourth layer/fifth layer contact-conductive section 243 may have the same structure as that described for the field/second-layer contact-conductive section 203.

The details of the structure of the SRAM according to the first embodiment are described above.

1.3 Method of Fabricating SRAM

The method of fabricating the SRAM according to the first embodiment is described below with reference to FIGS. 16A to 22B. A symbol "A" in each figure corresponds to the cross section shown in FIG. 14. A symbol "B" in each figure corresponds to the cross section shown in FIG. 15.

1.3.1 Formation of First Conductive Layer

Figure 16A:
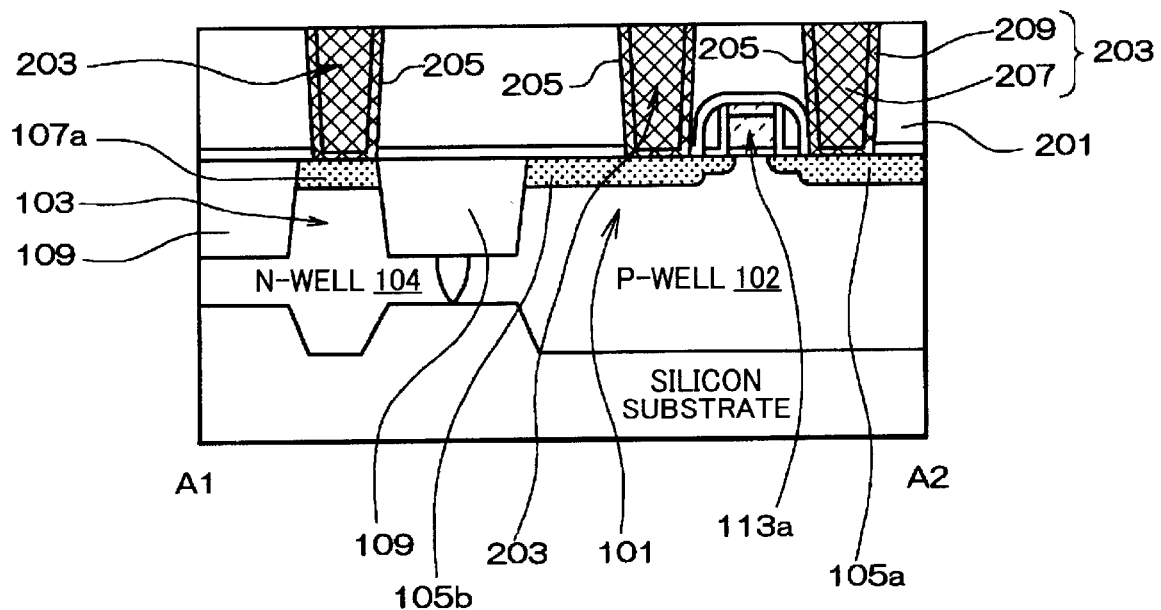
FIGS. 16A and 16B are views for illustrating a first step of a method of fabricating the SRAM according to the first embodiment.
Figure 16B:
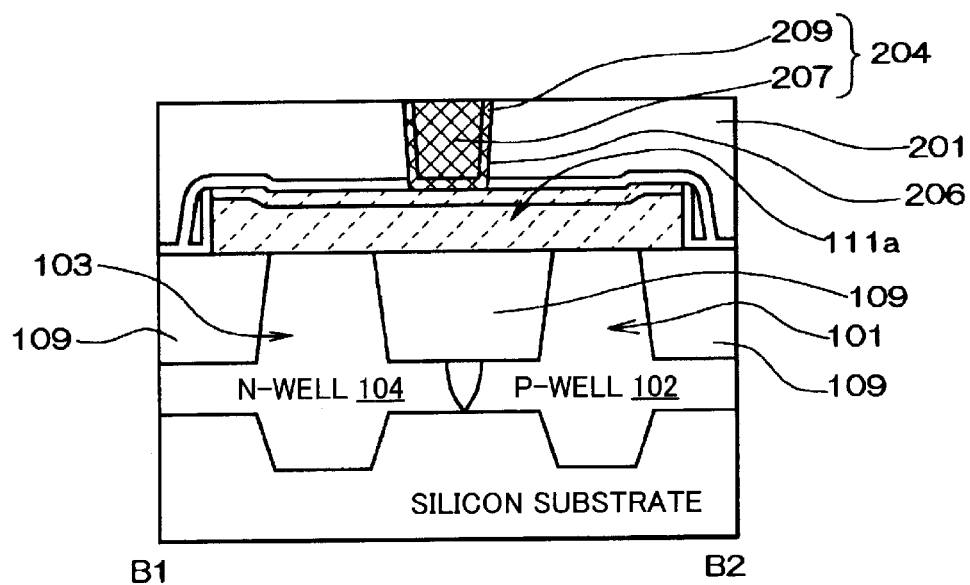

The element isolation regions 109 are formed in the silicon substrate using STI, for example, as shown in FIGS. 16A and 16B. The p-well 102 and the n-well 104 are formed in the silicon substrate by selectively injecting ions by ion implantation, for example. The first conductive layer including the gate—gate electrode layers 111a and 111b and the sub word lines 113a and 113b shown in FIG. 3 is formed using a conventional method.

1.3.2 Formation of Second Conductive Layer

The interlayer dielectric 201 is formed to cover the first conductive layer, as shown in FIGS. 16A and 16B. The field/second-layer contact-conductive sections 203 and the lower layer conductive section 204 of the first-layer/third-layer stacked contact-conductive section 223 shown in FIG. 9 are formed in the interlayer dielectric 201 using a conventional method.

Figure 17A:
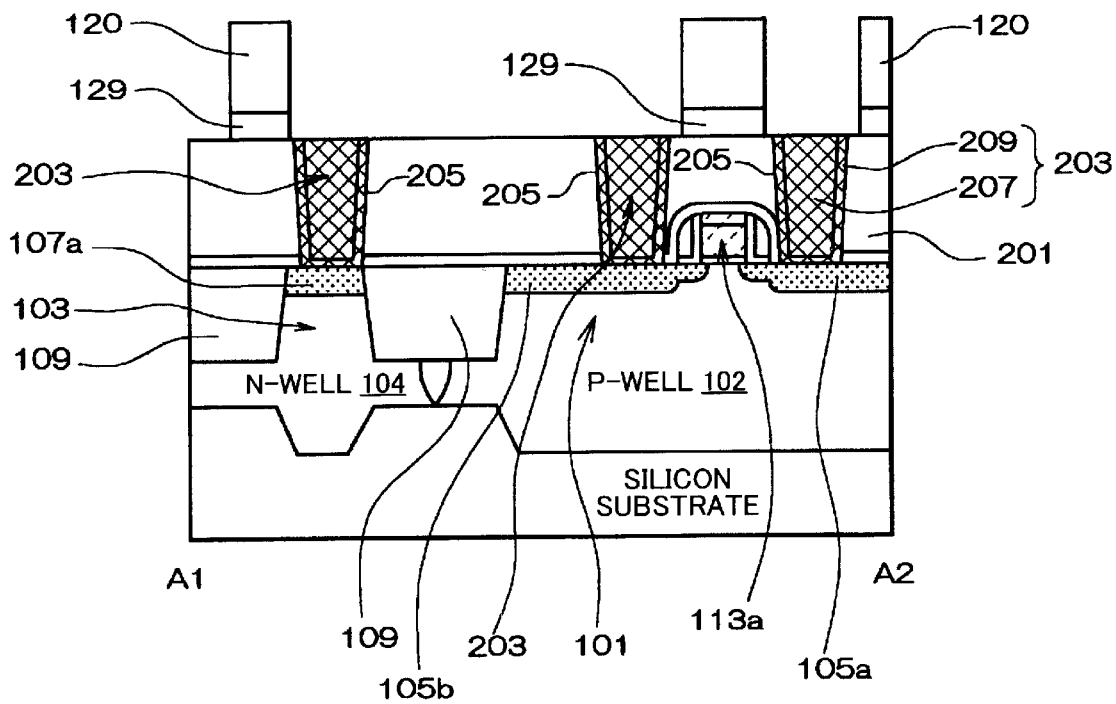
FIGS. 17A and 17B are views for illustrating a second step of the method of fabricating the SRAM according to the first embodiment.
Figure 17B:
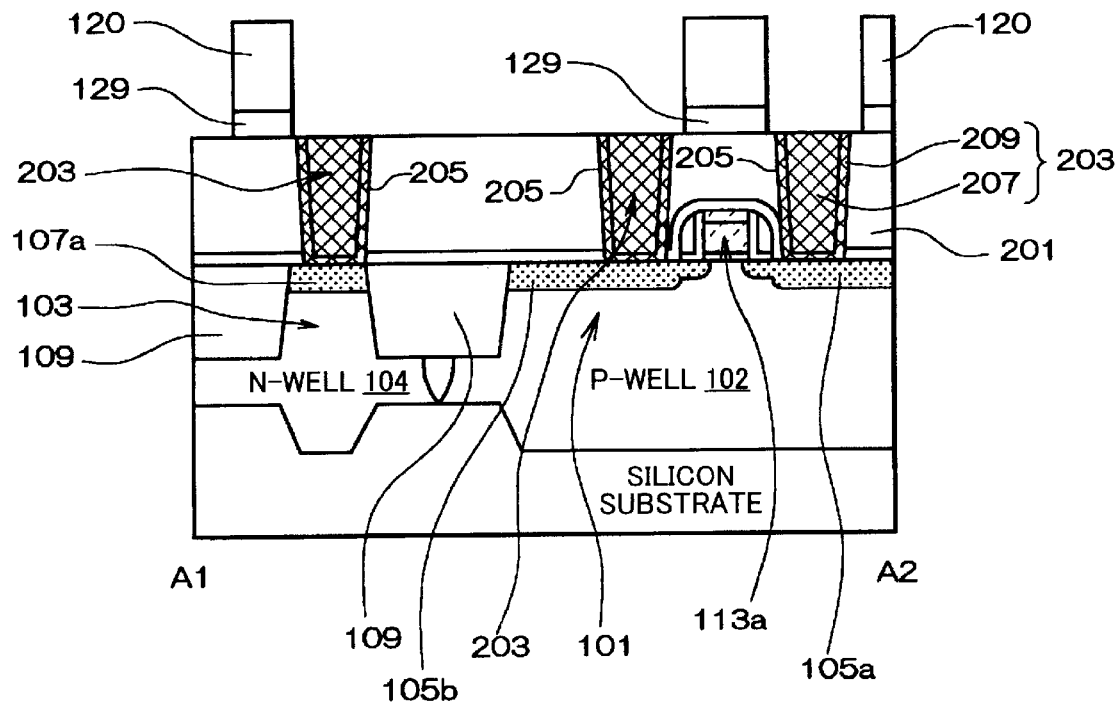

The insulating layer 129 including a silicon oxide film is formed on the interlayer dielectric 201 using CVD, for example, as shown in FIGS. 17A and 17B. The thickness of the insulating layer 129 is the same as the thickness of the second conductive layer. A resist 120 is formed on the insulating layer 129. The insulating layer 129 is removed in the formation region of the second conductive layer by photolithography and etching.

Figure 18A:
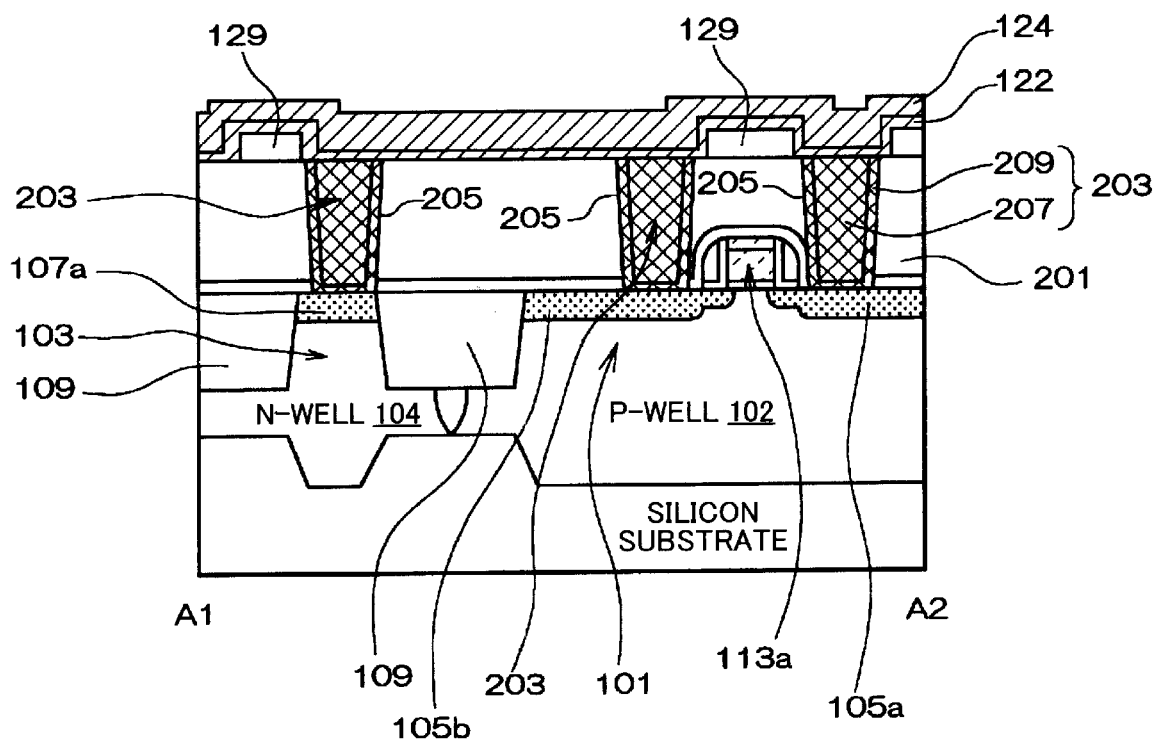
FIGS. 18A and 18B are views for illustrating a third step of the method of fabricating the SRAM according to the first embodiment.
Figure 18B:
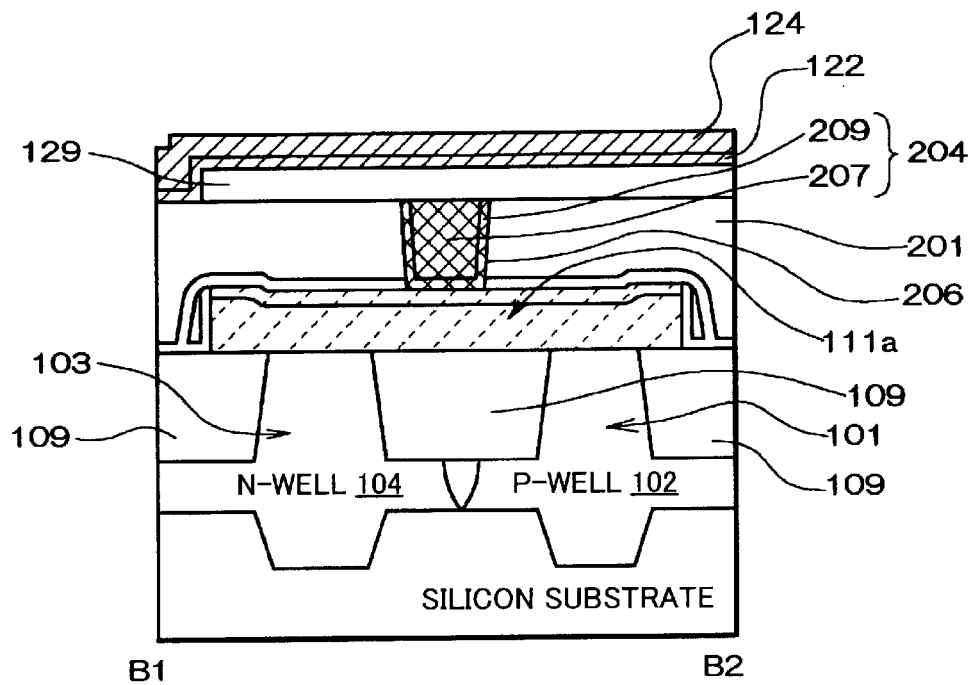

The high-melting-point metal nitride layer 122 consisting of titanium nitride and the tungsten-containing layer 124 are formed using sputtering so as to cover the insulating layer 129, as shown in FIGS. 18A and 18B. This causes the high-melting-point metal nitride layer 122 and the tungsten-containing layer 124 to be buried in the regions in which the insulating layer 129 is removed.

Figure 19A:
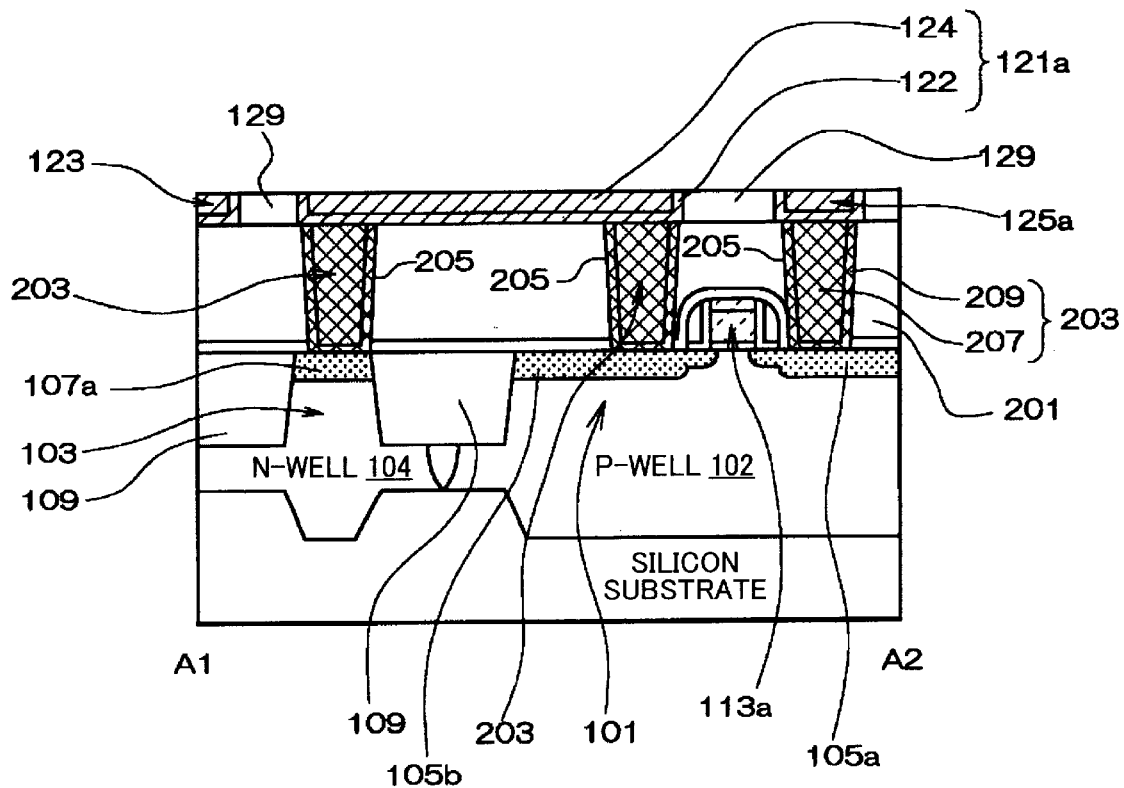
FIGS. 19A and 19B are views for illustrating a fourth step of the method of fabricating the SRAM according to the first embodiment.
Figure 19B:
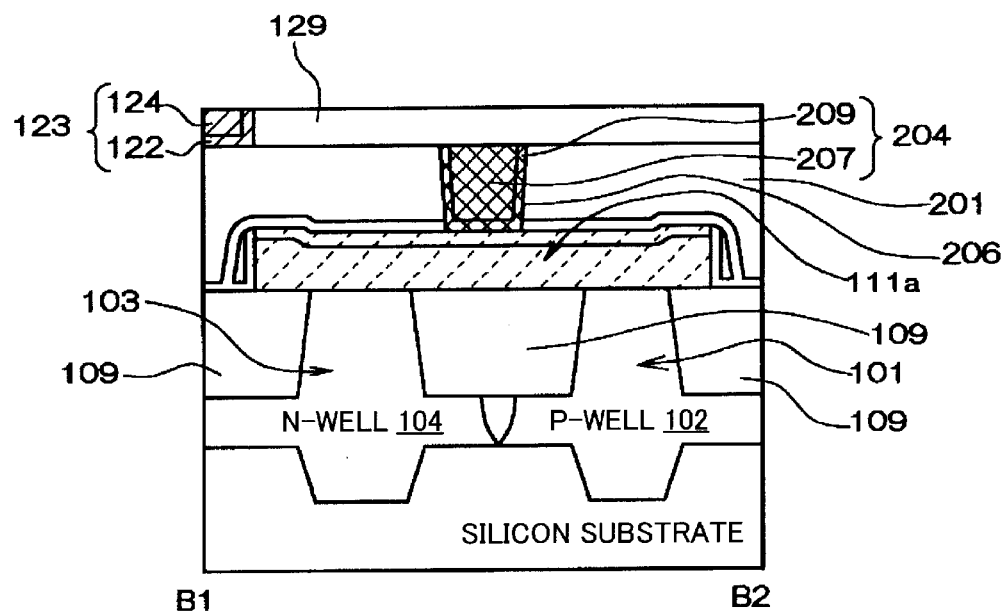

The tungsten-containing layer 124 and the high-melting-point metal nitride layer 122 are subjected to CMP, for example, as shown in FIGS. 19A and 19B, thereby forming the second conductive layer including the drain—drain connecting layers 121a and 121b, the $V_{DD}$ interconnect 123, and the like shown in FIG. 4. The second conductive layer is formed in this manner using a damascene process.

1.3.3 Formation of Third Conductive Layer

Figure 20A:
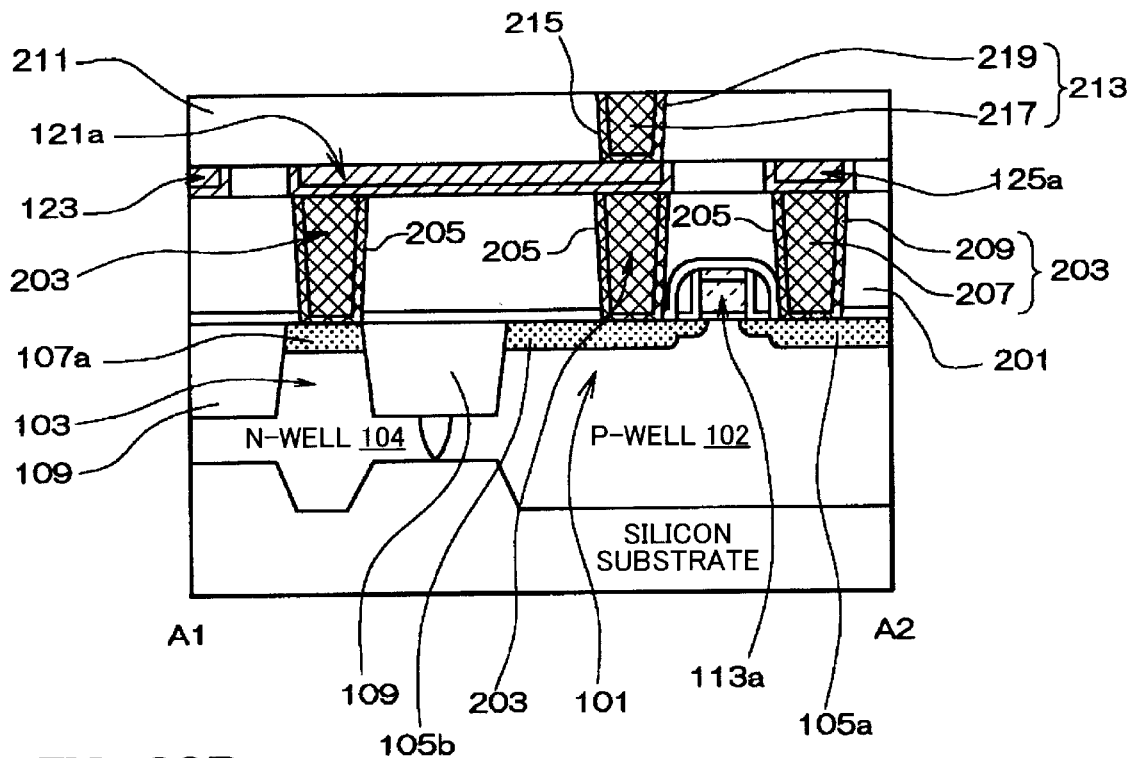
FIGS. 20A and 20B are views for illustrating a fifth step of the method of fabricating the SRAM according to the first embodiment.
Figure 20B:
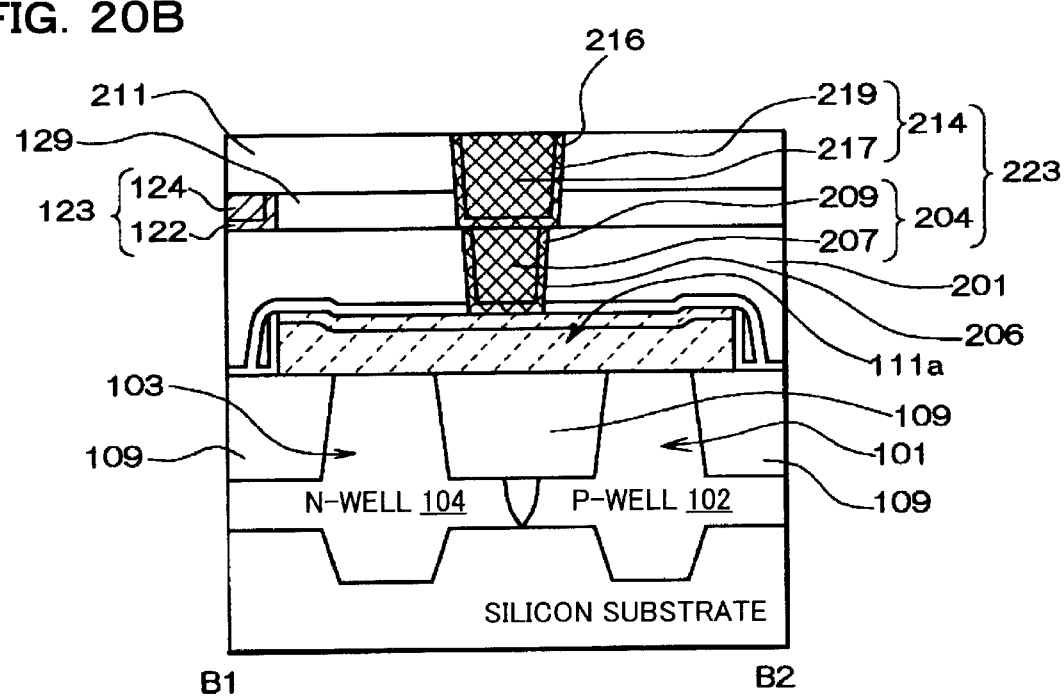

The interlayer dielectric 211 is formed to cover the second conductive layer, as shown in FIGS. 20A and 20B. The second-layer/third-layer contact-conductive sections 213 buried in the interlayer dielectric 211 and the upper layer conductive sections 214 of the first-layer/third-layer stacked contact-conductive sections 223 buried in the interlayer dielectric 211 and the insulating layer 129 shown in FIG. 10 are formed using a conventional method. The first-layer/third-layer stacked contact-conductive sections 223 are formed in this manner.

Figure 21A:
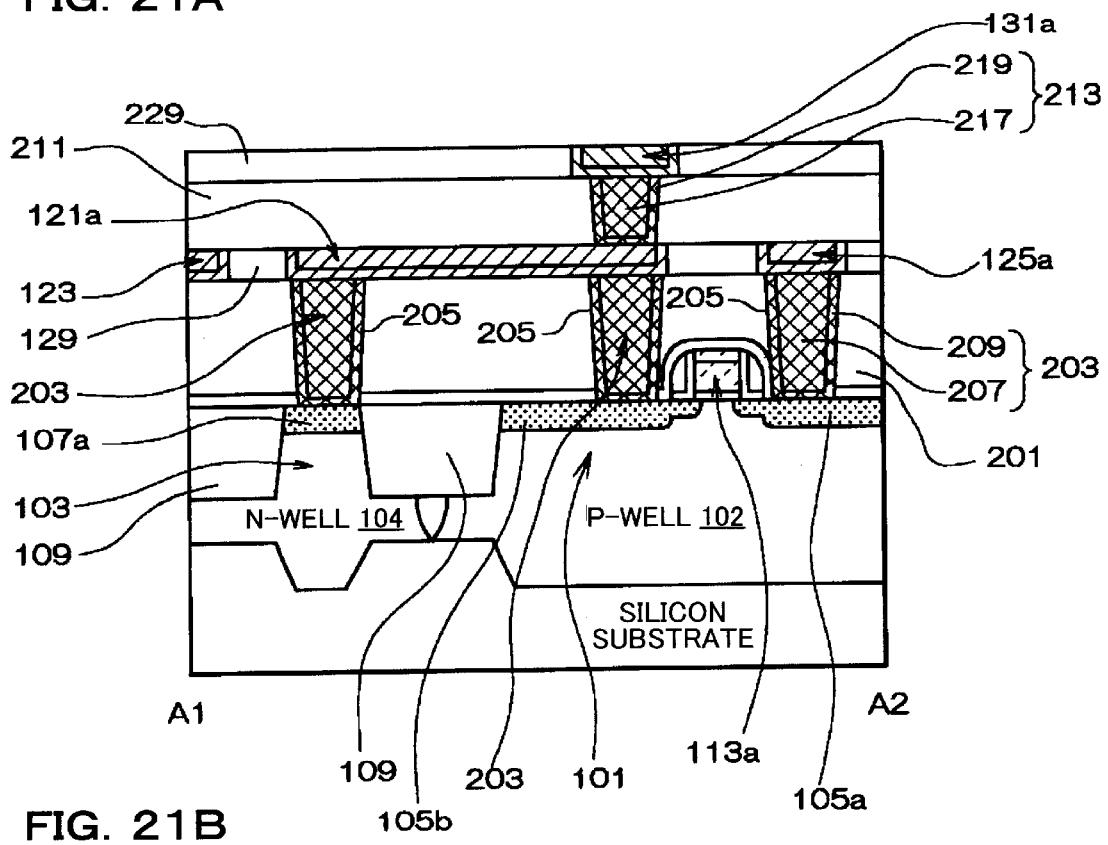
FIGS. 21A and 21B are views for illustrating a sixth step of the method of fabricating the SRAM according to the first embodiment.
Figure 21B:
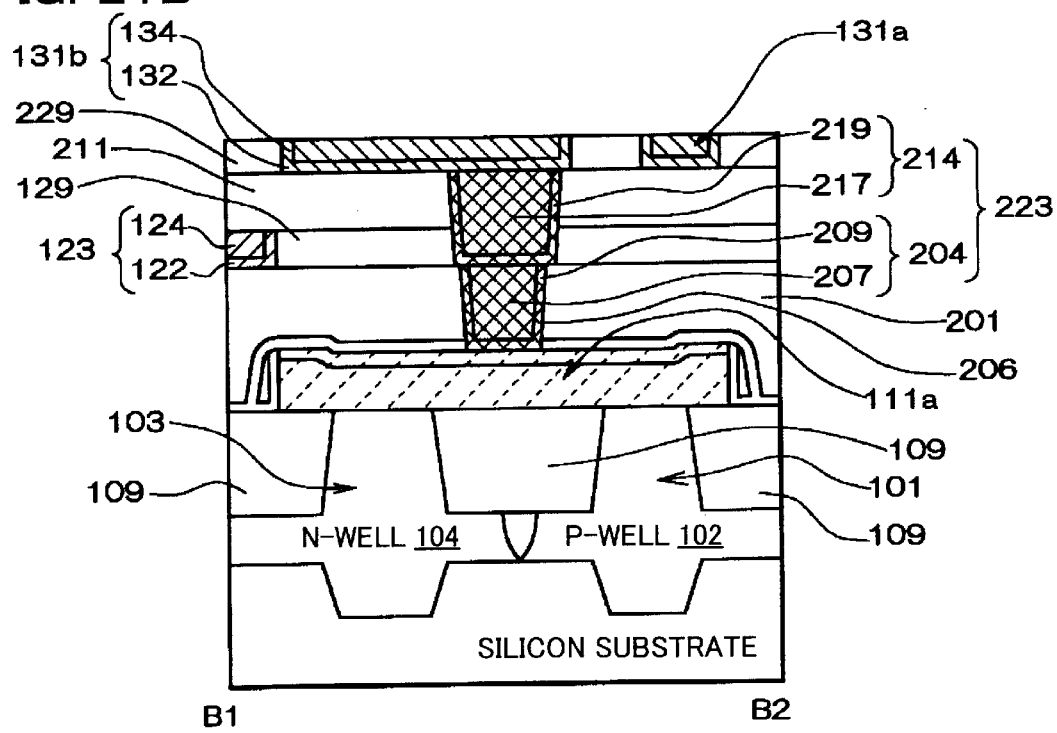

The insulating layer 229 including a silicon oxide film is formed on the interlayer dielectric 211 using a CVD process, for example, as shown in FIGS. 21A and 21B. The thickness of the insulating layer 229 is the same as the thickness of the third conductive layer. A resist is formed on the insulating layer 229. The insulating layer 229 is removed in the formation regions of the third conductive layer by photolithography and etching.

The high-melting-point metal nitride layer 132 consisting of titanium nitride and the tungsten-containing layer 134 are formed using sputtering so as to cover the insulating layer 229, for example. This causes the high-melting-point metal nitride layer 132 and the tungsten-containing layer 134 to be buried in the regions in which the insulating layer 229 is removed.

The tungsten-containing layer 134 and the high-melting-point metal nitride layer 132 are subjected to CMP, for example, thereby forming the third conductive layer including the drain-gate connecting layers 131a and 131b shown in FIG. 5.

1.3.4 Formation of Fourth and Fifth Conductive Layers

Figure 22A:
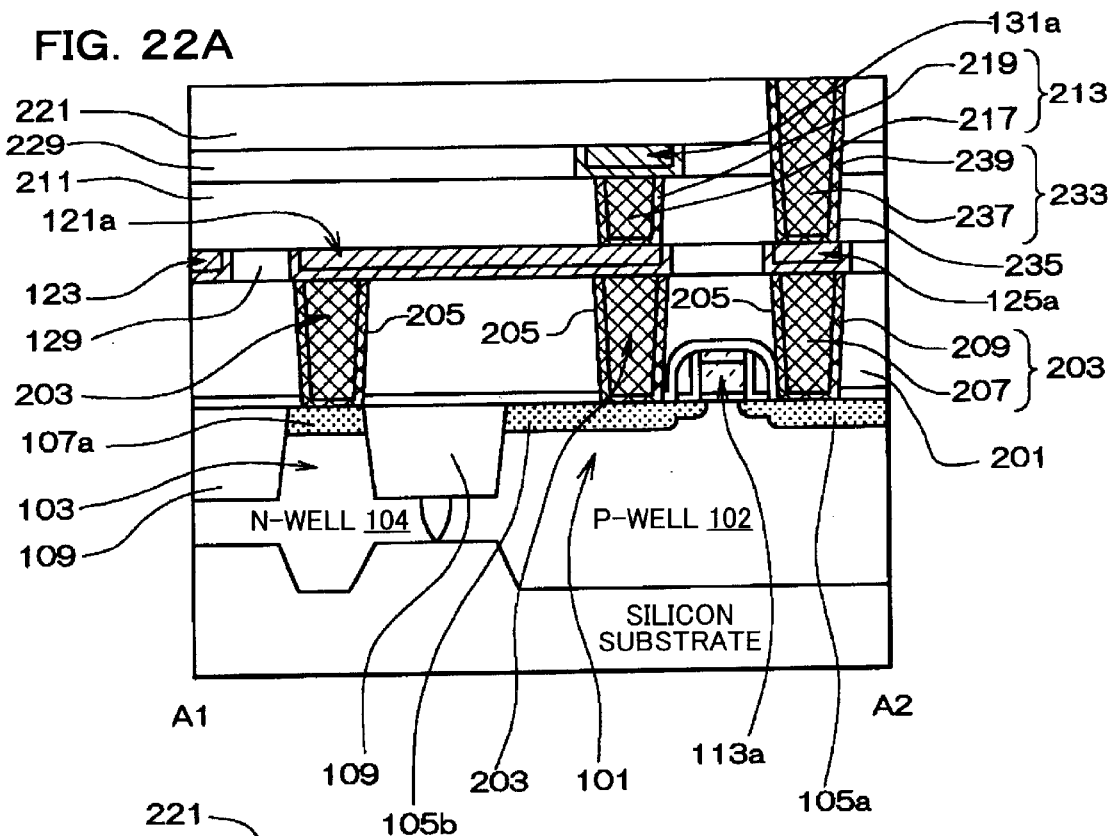
FIGS. 22A and 22B are views for illustrating a seventh step of the method of fabricating the SRAM according to the first embodiment.
Figure 22B:
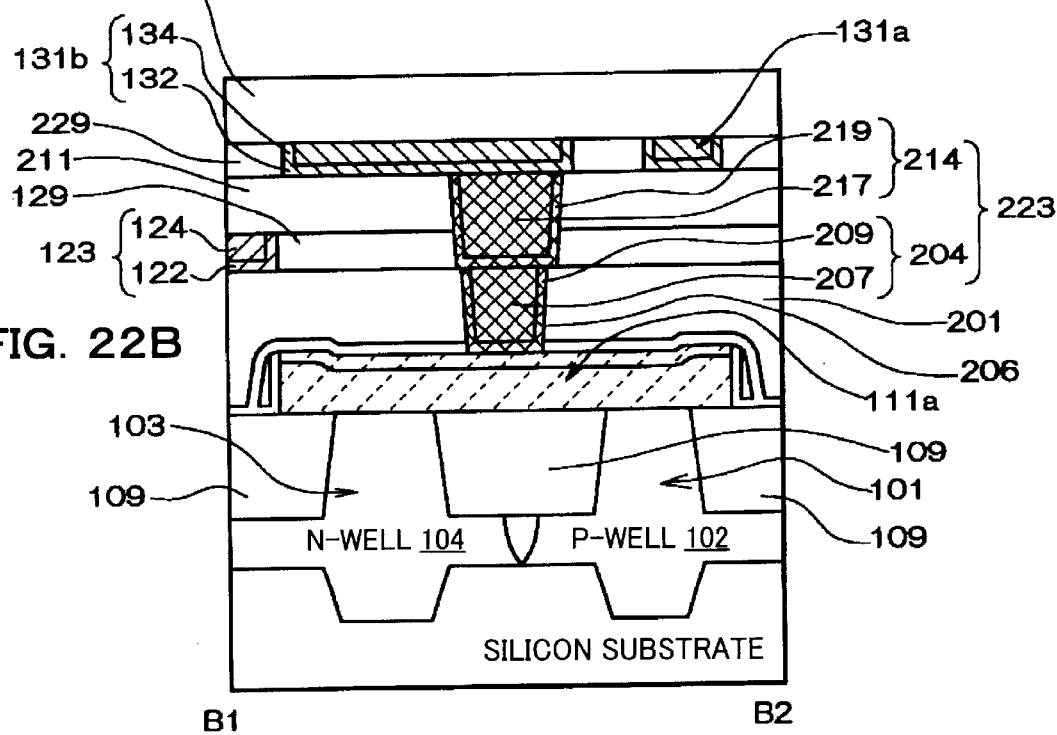

The interlayer dielectric 221 is formed to cover the third conductive layer, as shown in FIGS. 22A and 22B. The second-layer/fourth-layer contact-conductive sections 233 shown in FIG. 12 are formed in the interlayer dielectrics 211 and 221 using a conventional method. The fourth conductive layer and the fifth conductive layer are formed using a conventional method, whereby the structure shown in FIGS. 14 and 15 are completed.

1.4 Modification Example of First Embodiment

A second-layer/fourth-layer stacked contact-conductive sections may be used to connect the second conductive layer with the fourth conductive layer instead of using the second-layer/fourth-layer contact-conductive sections 233 shown in FIG. 14.

Figure 23:
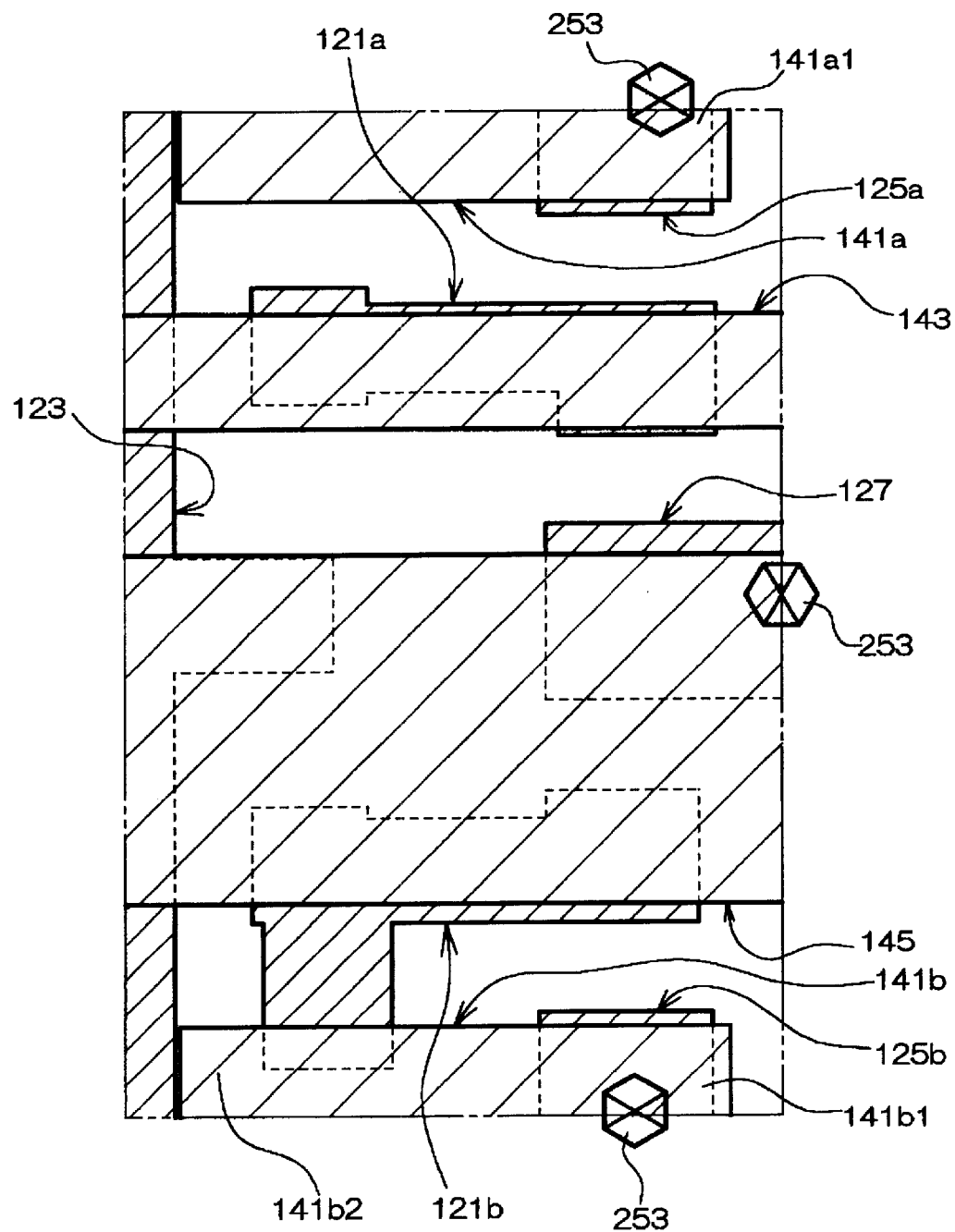
FIG. 23 is a plan view showing the second conductive layer and the fourth conductive layer of the memory cell array of the SRAM according to a modification example of the first embodiment.

FIG. 23 is a plan view showing the second conductive layer and the fourth conductive layer according to a modification example. The $V_{SS}$ interconnect 145 is connected to the ground line local interconnect layer 127, the bit line local interconnect layer 141a is connected to the bit line contact pad layer 125a, and the /bit line local interconnect layer 141b is connected to the /bit line contact pad layer 125b, through the second-layer/fourth-layer stacked contact-conductive sections 253.

Figure 24:
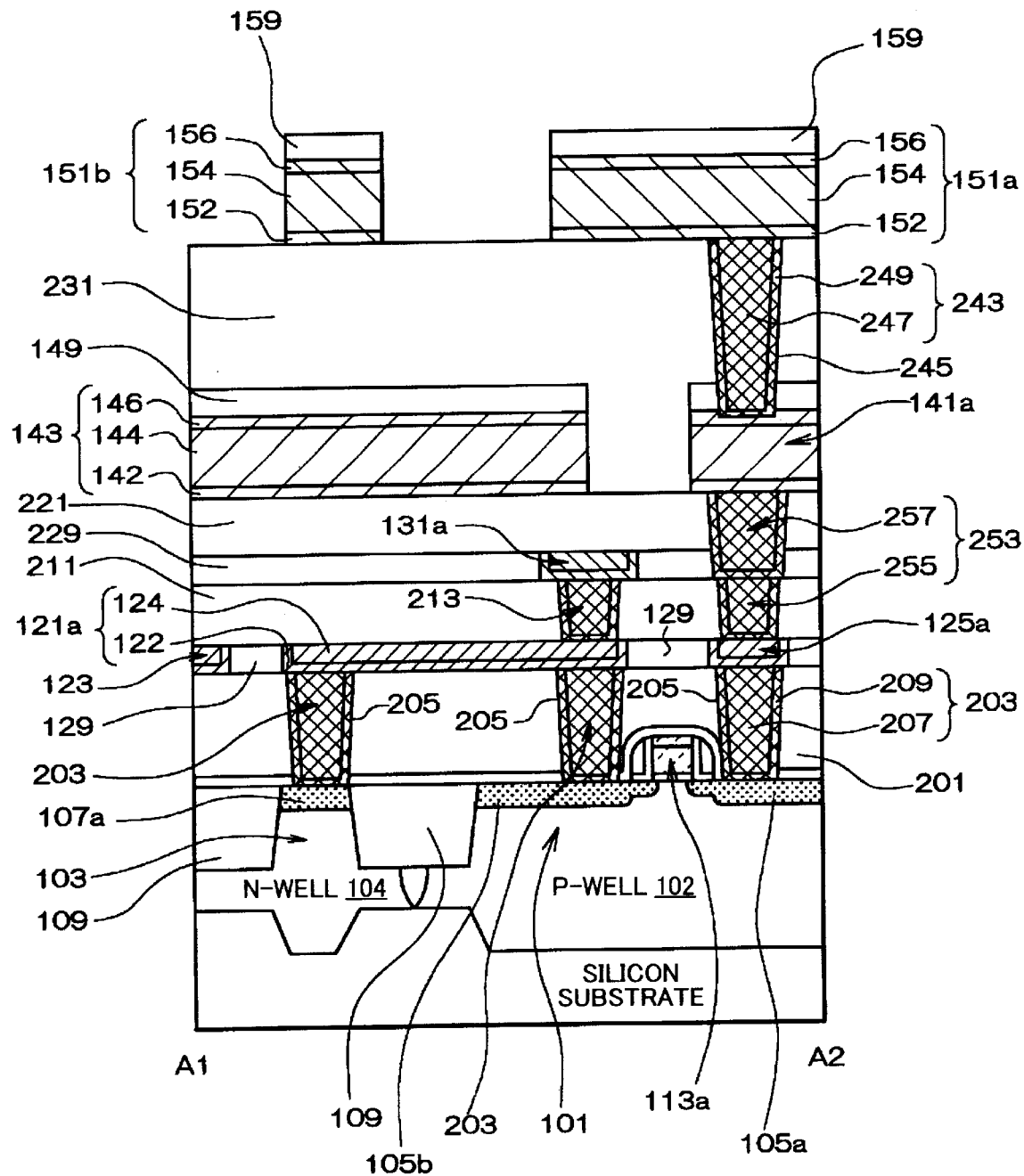
FIG. 24 is a cross-sectional view showing the memory cell array of the SRAM according to the modification example of the first embodiment.

FIG. 24 is a cross-sectional view showing the second-layer/fourth-layer stacked contact-conductive section 253, which corresponds to FIG. 14. The second-layer/fourth-layer stacked contact-conductive section 253 has a structure in which an upper layer conductive section 257 is stacked on a lower layer conductive section 255. The lower layer conductive section 255 is buried in the interlayer dielectric 211. The lower layer conductive section 255 has the same layer structure as the second-layer/third-layer contact-conductive section 213 and is formed in the same step. The upper layer conductive section 257 is buried in the interlayer dielectric 221. The upper layer conductive section 257 has the same layer structure as the second-layer/third-layer contact-conductive section 213.

2. Second Embodiment

The outline of the structure of an SRAM according to a second embodiment and details of the structure are described below.

2.1 Outline of SRAM Structure

Figure 25:
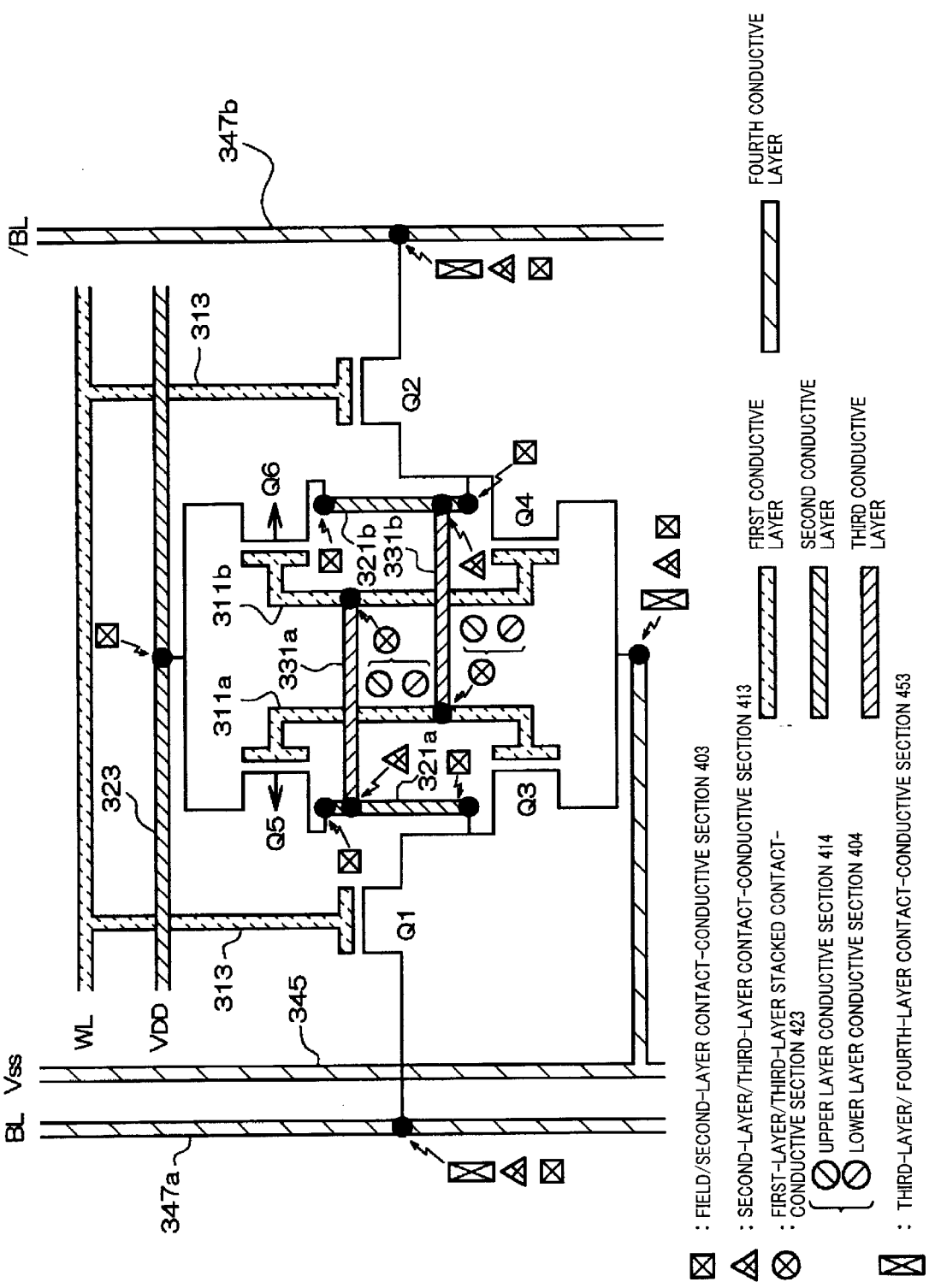
FIG. 25 is an equivalent circuit diagram of the SRAM according to the second embodiment.

FIG. 25 is an equivalent circuit diagram of the SRAM according to the second embodiment. The SRAM according to the second embodiment is a type of memory in which one memory cell is formed by six MOS field effect transistors in the same manner as in the first embodiment.

The memory cell of the SRAM according to the second embodiment has a structure including four conductive layers on a field, as shown in FIGS. 26 to 30. The memory cell of the SRAM according to the first embodiment has a structure including five conductive layers on the field. FIGS. 26 to 30 are described below briefly with reference to FIG. 25. A symbol "R" in these figures indicates a formation region of one memory cell.

Figure 26:
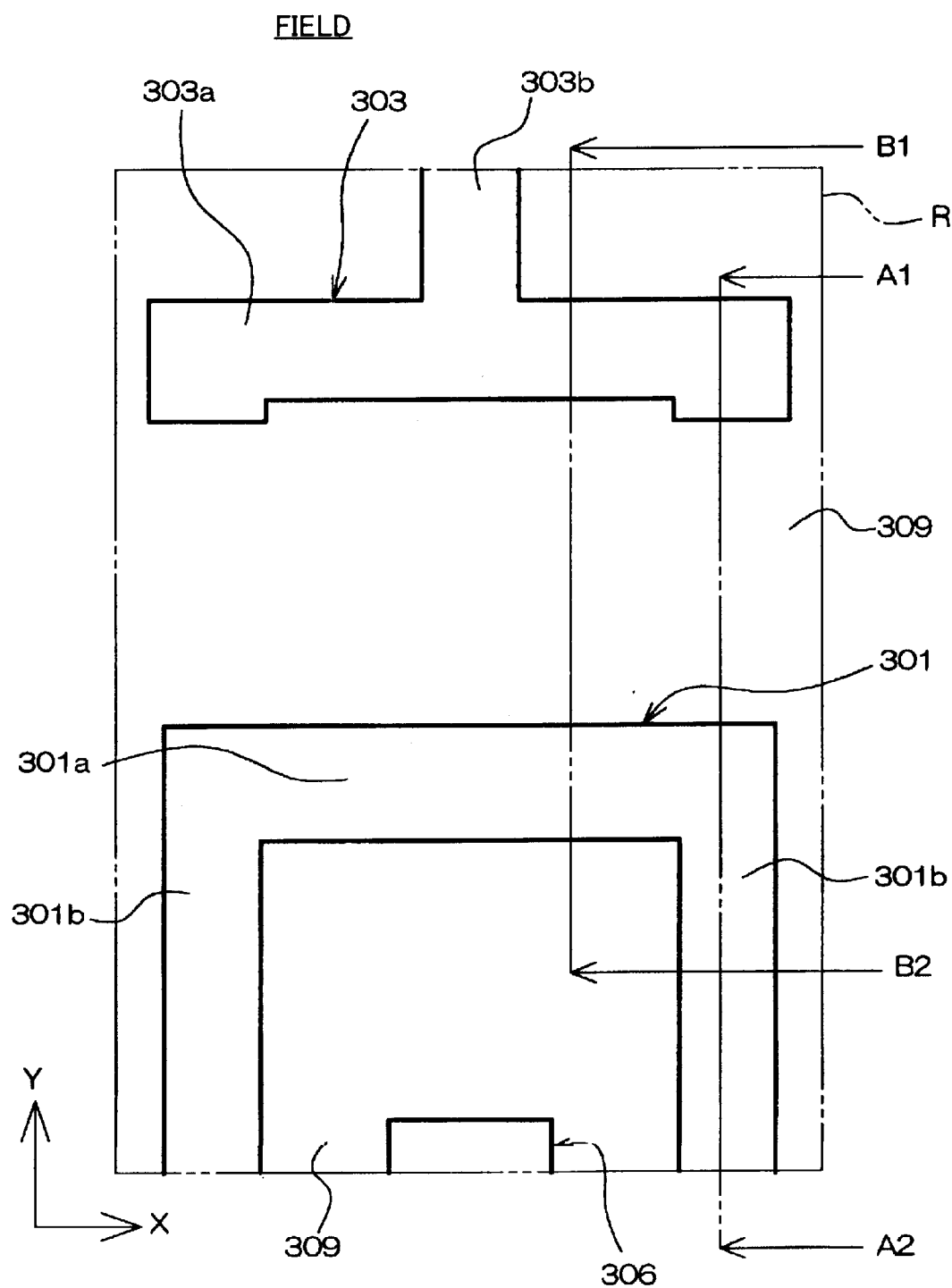
FIG. 26 is a plan view showing a field in a memory cell array of an SRAM according to a second embodiment.
Figure 27:
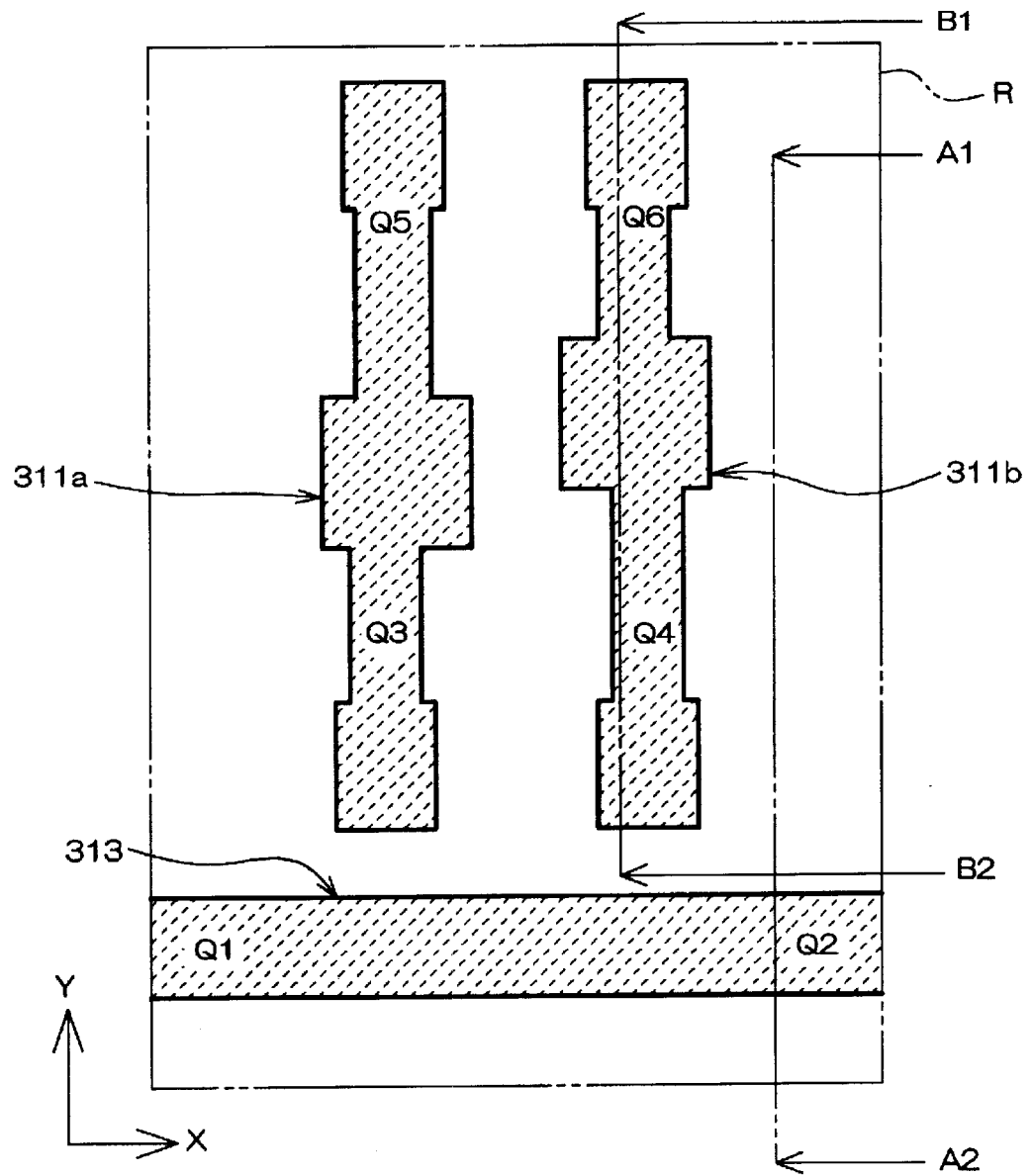
FIG. 27 is a plan view showing a first conductive layer of the memory cell array of the SRAM according to the second embodiment.
Figure 28:
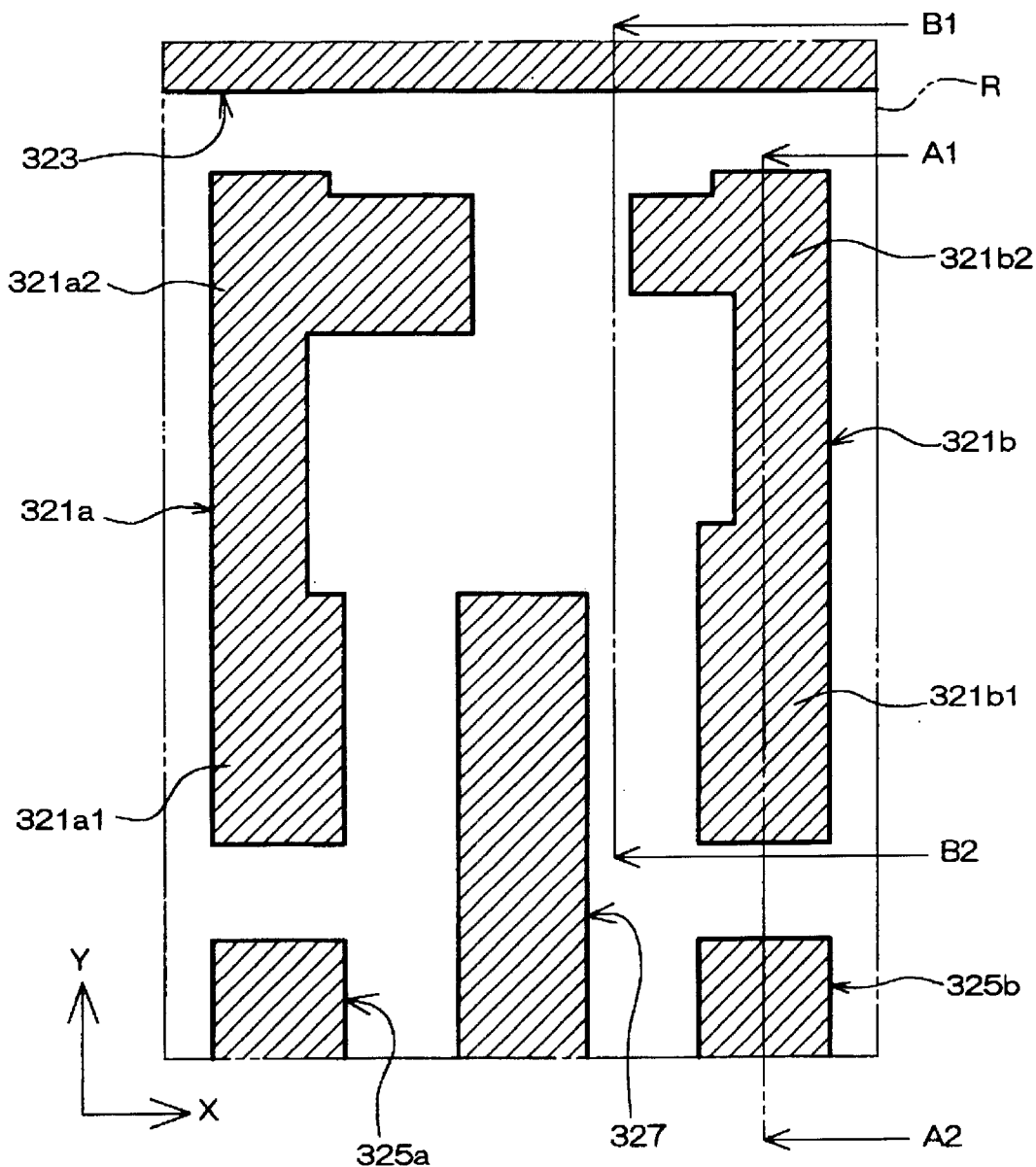
FIG. 28 is a plan view showing a second conductive layer of the memory cell array of the SRAM according to the second embodiment.
Figure 29:
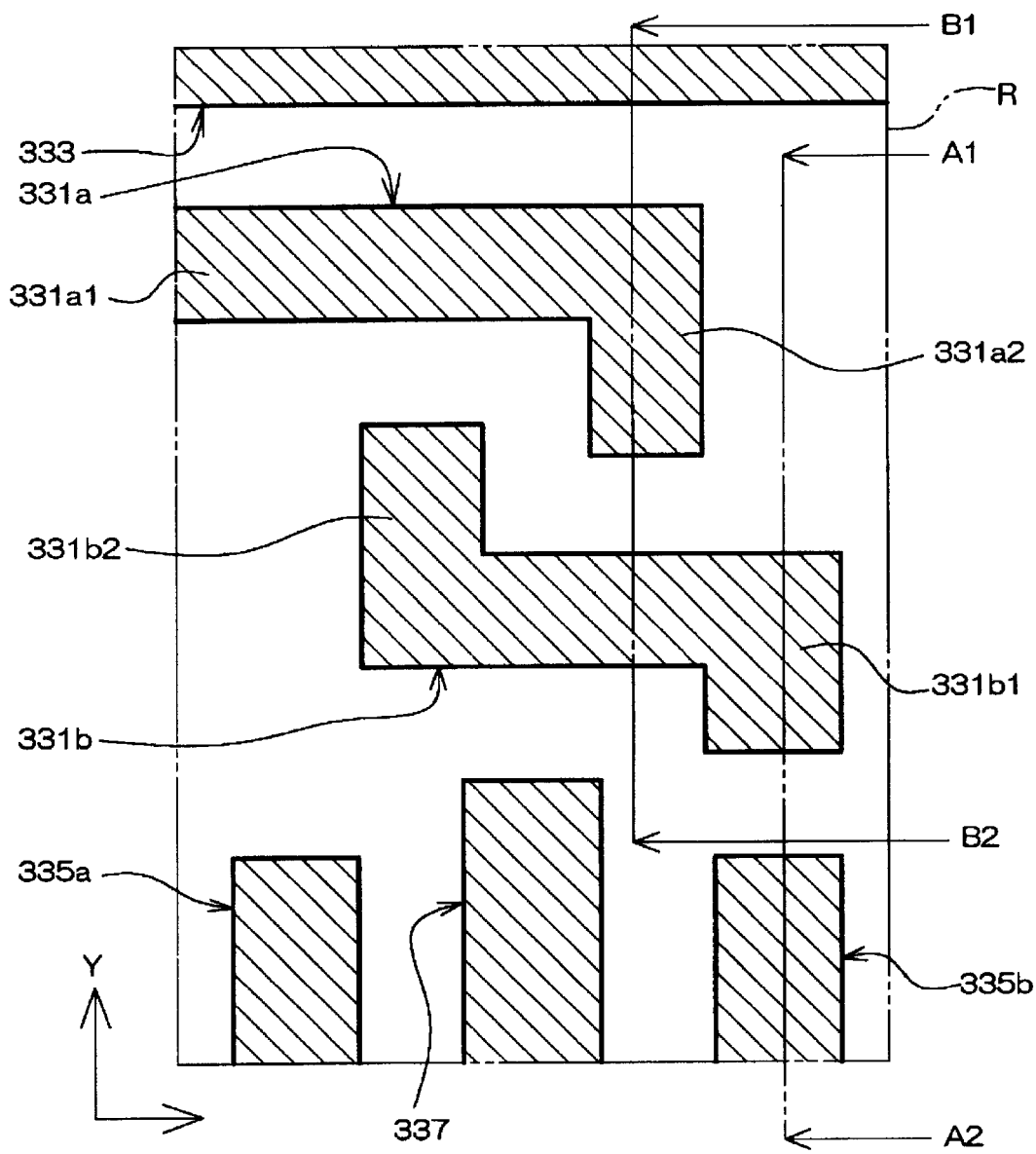
FIG. 29 is a plan view showing a third conductive layer of the memory cell array of the SRAM according to the second embodiment.
Figure 30:
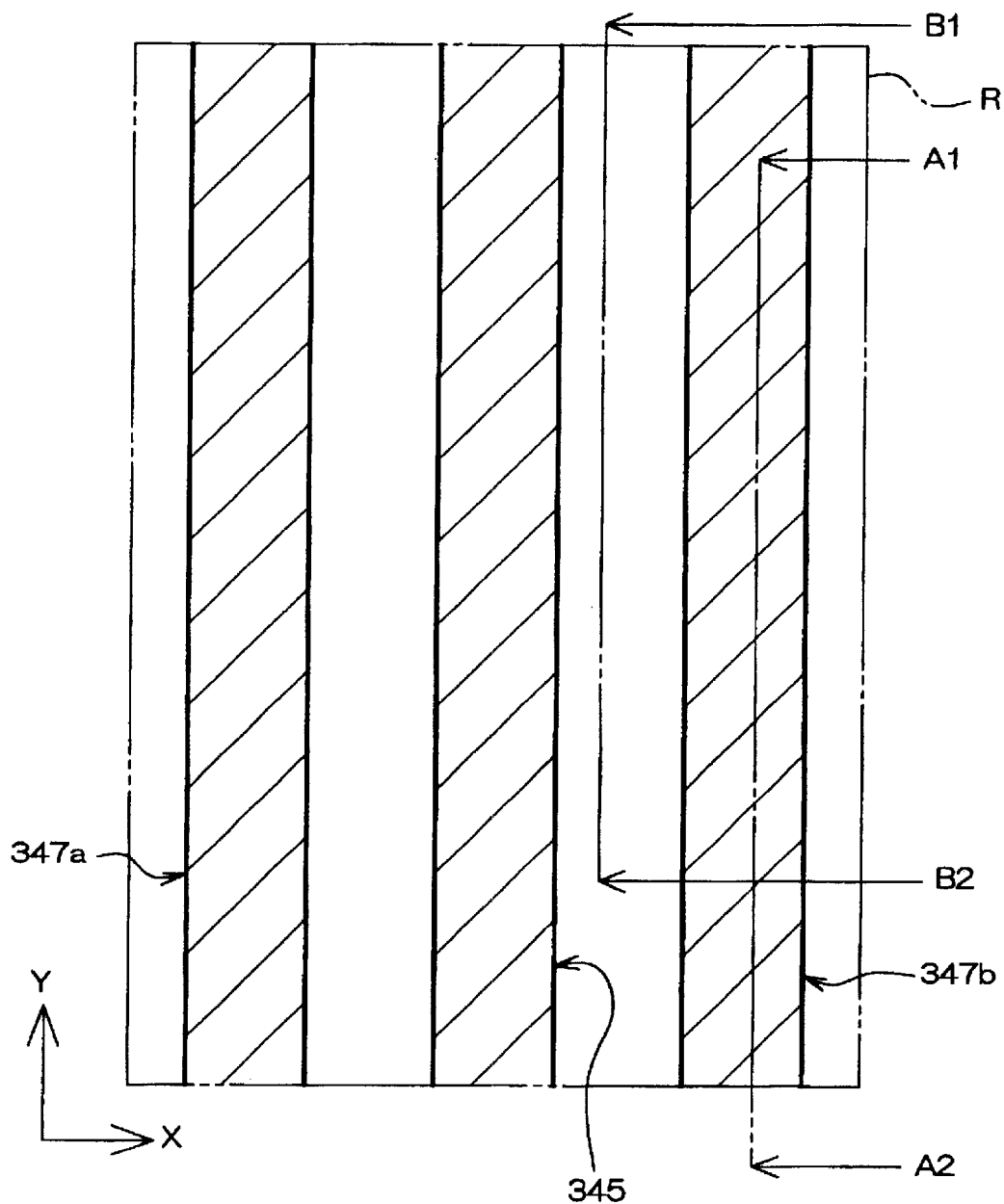
FIG. 30 is a plan view showing a fourth conductive layer of the memory cell array of the SRAM according to the second embodiment.

FIG. 26 is a plan view showing the field, which includes active regions 301, 303, and 306. FIG. 27 is a plan view showing a first layer conductive layer, which includes gate—gate electrode layers 311a and 311b having a pattern extending almost linearly in the Y direction, and a sub word line 313 having a pattern extending almost linearly in the X direction. The gate—gate electrode layer 311a includes gate electrodes of the driver transistor $Q_3$ and the load transistor $Q_5$. The gate—gate electrode layer 311b includes gate electrodes of the driver transistor $Q_4$ and the load transistor $Q_6$. The sub word line 313 includes gate electrodes of the transfer transistors $Q_1$ and $Q_2$. FIG. 28 is a plan view showing a second conductive layer, which includes drain—drain connecting layers 321a and 321b having a pattern in the shape of the letter "L", a $V_{DD}$ interconnect 323 having a pattern extending almost linearly in the X direction, and the like. FIG. 29 is a plan view showing a third conductive layer, which includes drain-gate connecting layers 331a and 331b and a main word line 333. FIG. 30 is a plan view showing a fourth conductive layer, which includes a bit line 347a, a /bit line 347b, and a $V_{SS}$ interconnect 345, each having a pattern extending almost linearly in the Y direction.

2.2 Details of SRAM Structure

Figure 31:
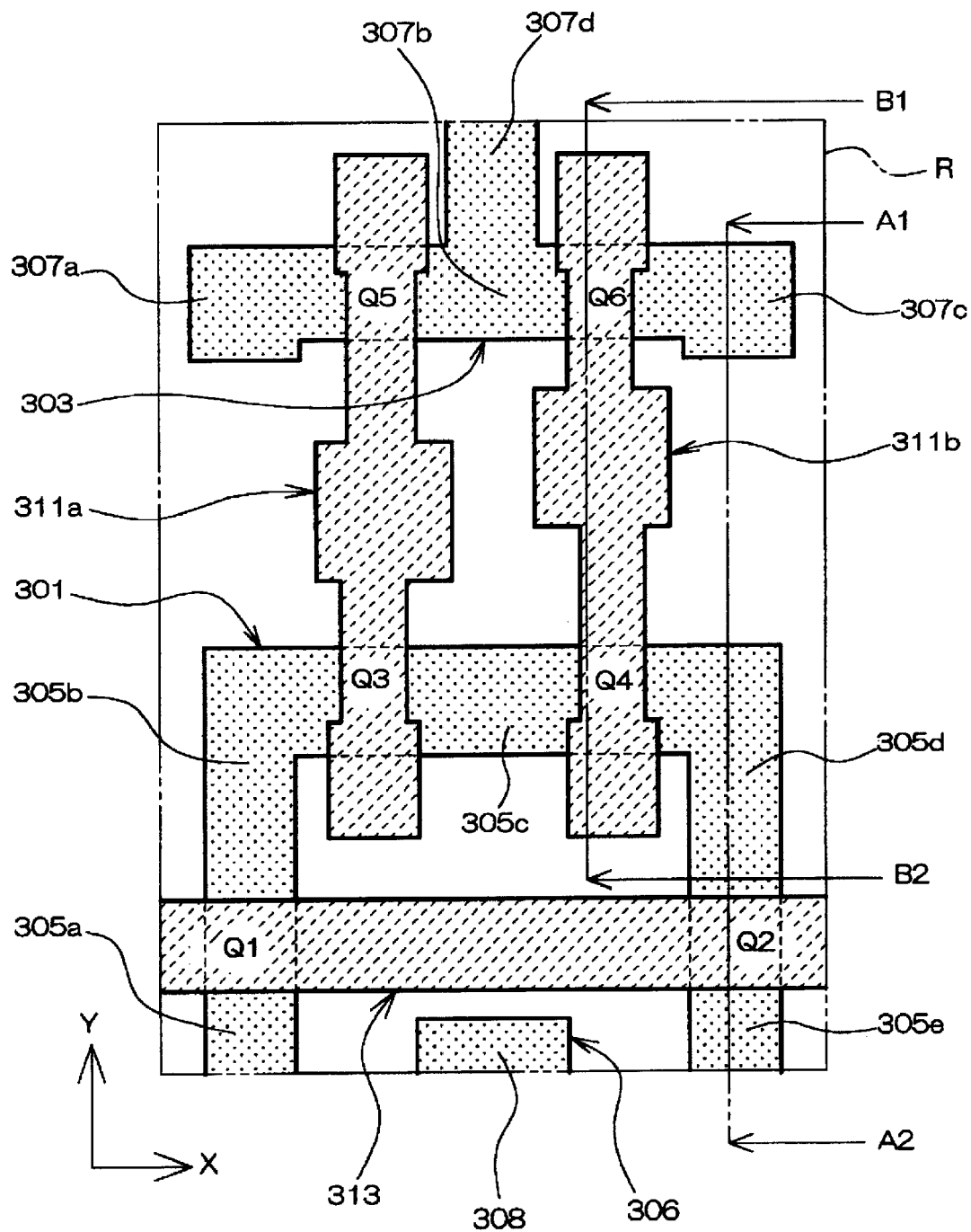
FIG. 31 is a plan view showing the field and the first conductive layer of the memory cell array of the SRAM according to the second embodiment.
Figure 32:
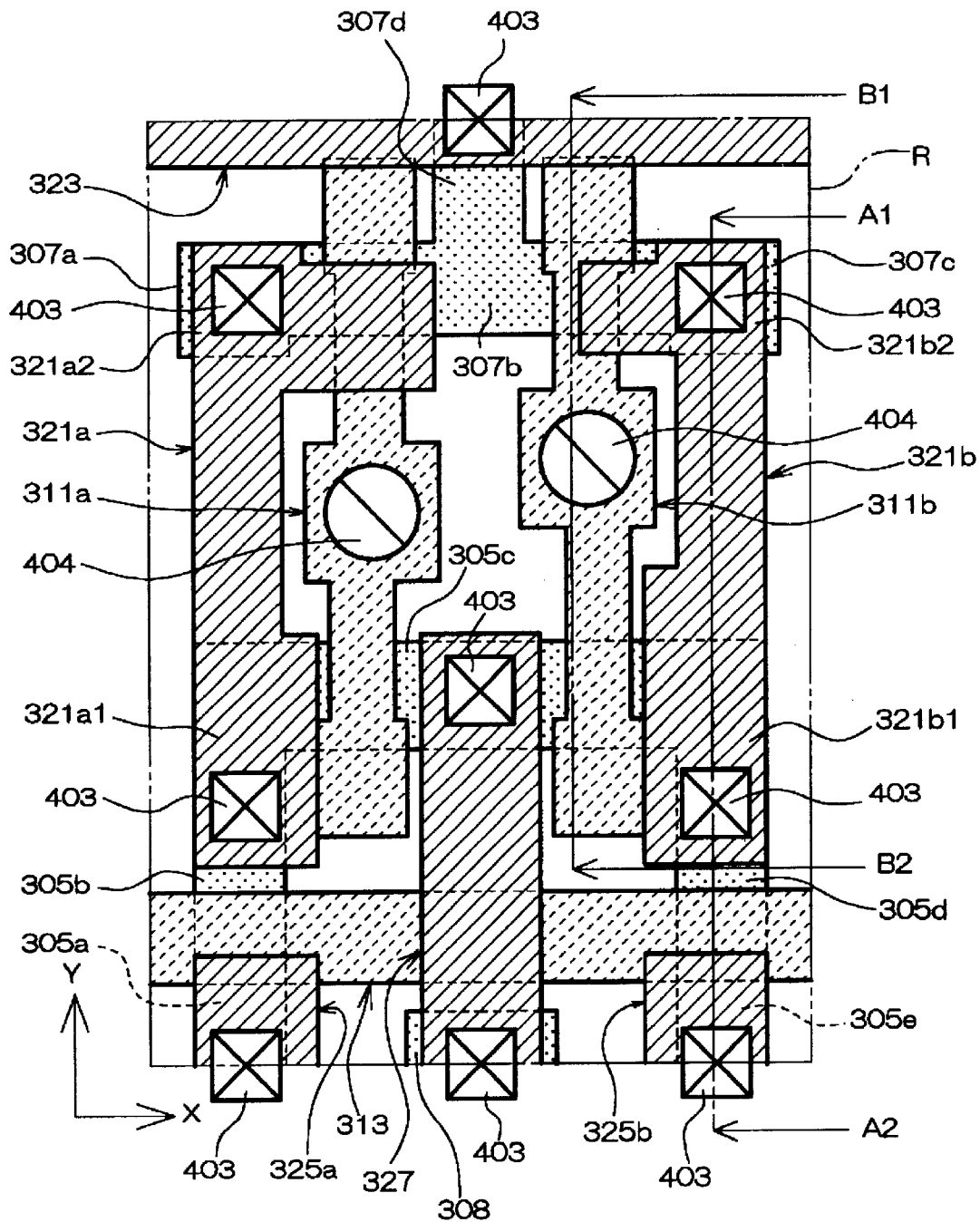
FIG. 32 is a plan view showing the field, the first conductive layer, and the second conductive layer of the memory cell array of the SRAM according to the second embodiment.
Figure 33:
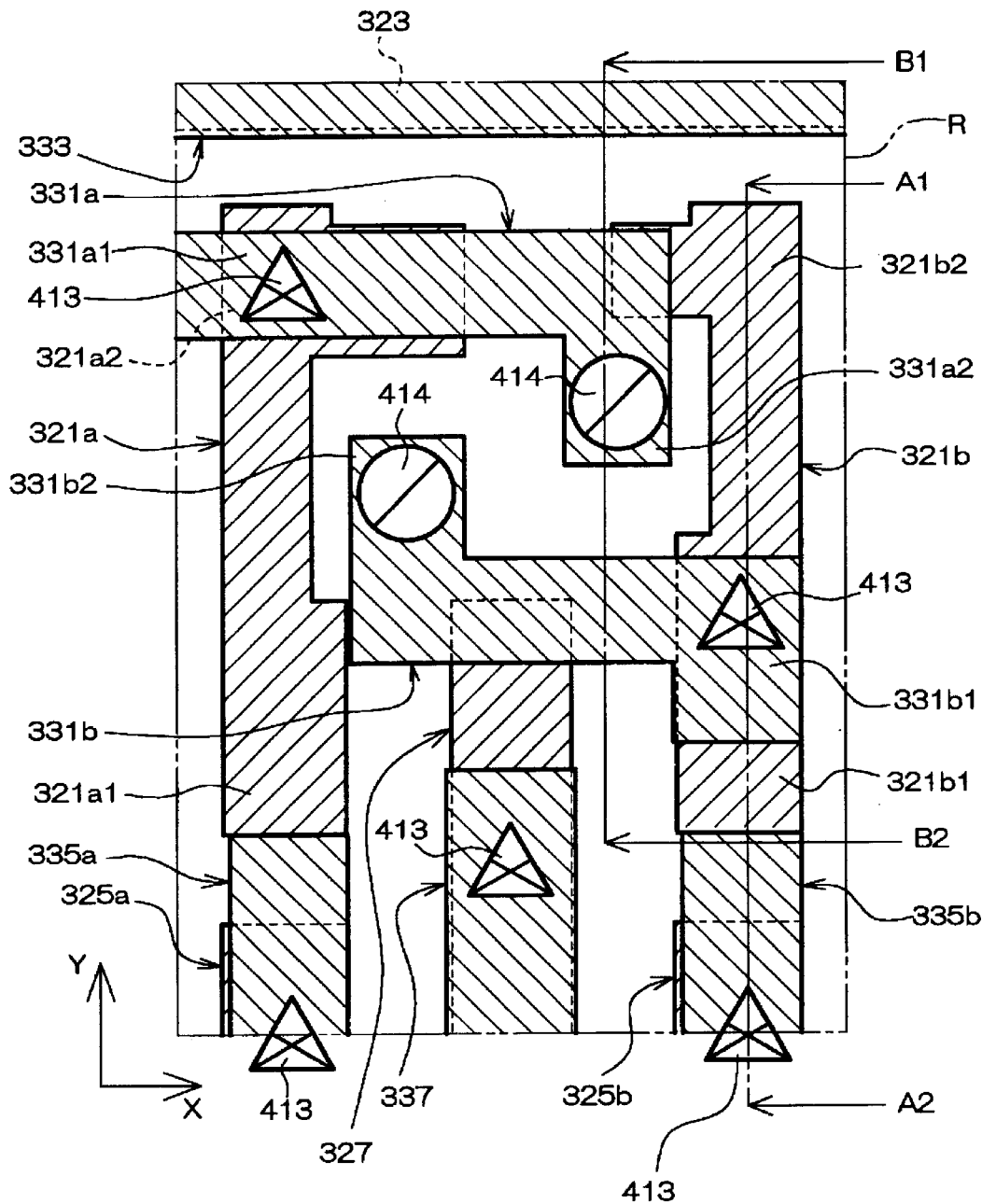
FIG. 33 is a plan view showing the second conductive layer and the third conductive layer of the memory cell array of the SRAM according to the second embodiment.
Figure 34:
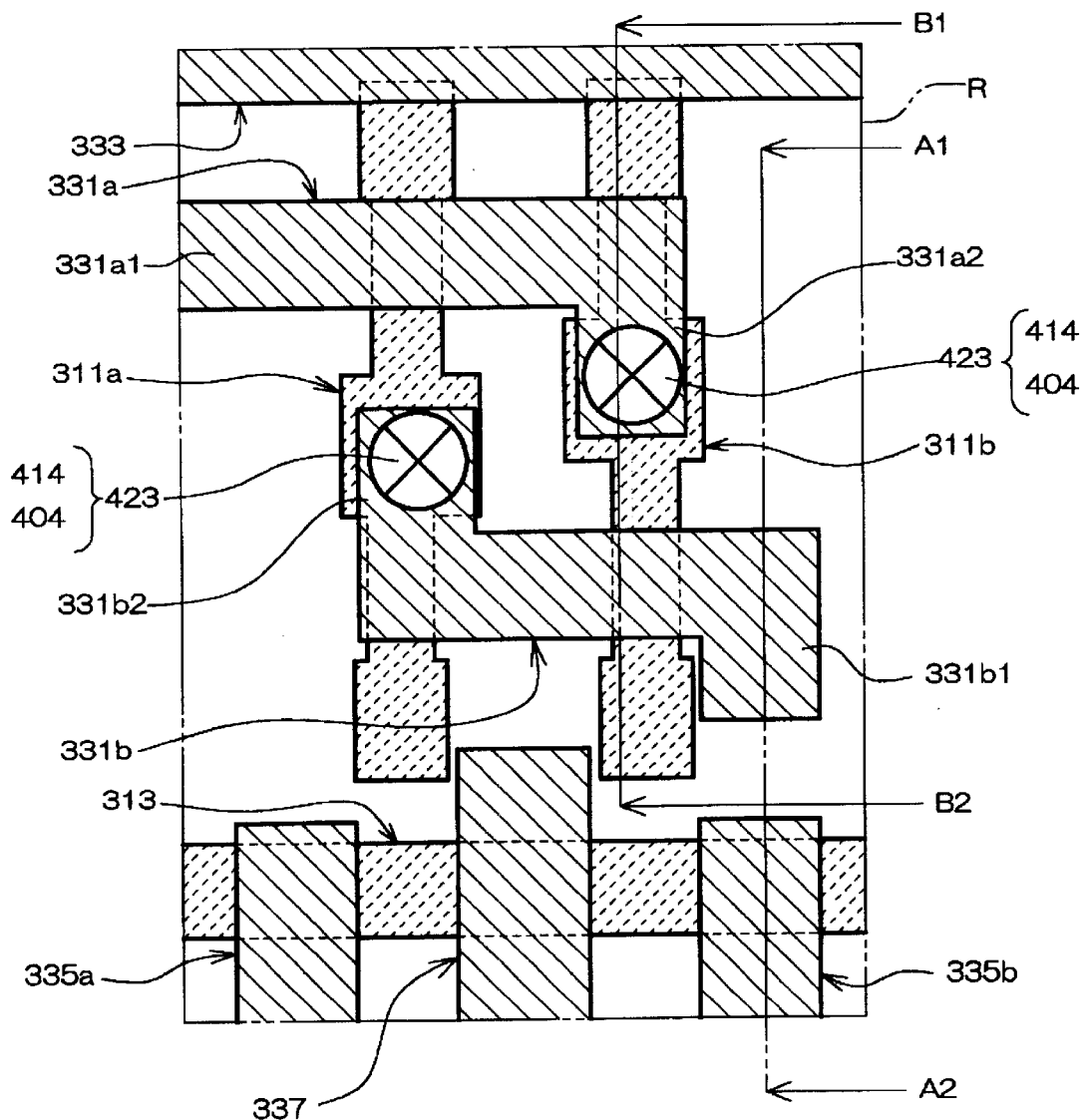
FIG. 34 is a plan view showing the first conductive layer and the third conductive layer of the memory cell array of the SRAM according to the second embodiment.
Figure 35:
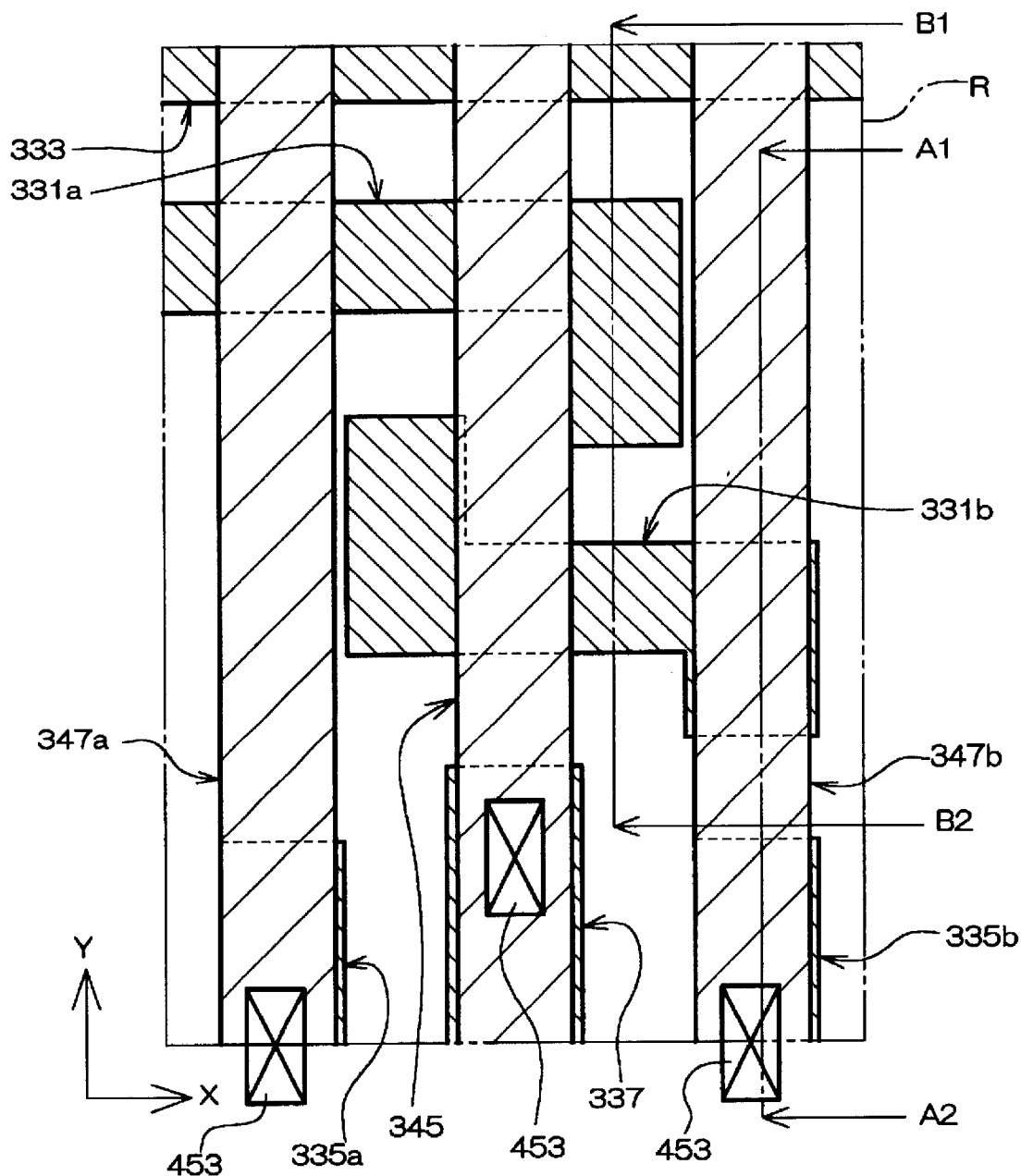
FIG. 35 is a plan view showing the third conductive layer and the fourth conductive layer of the memory cell array of the SRAM according to the second embodiment.
Figure 36:
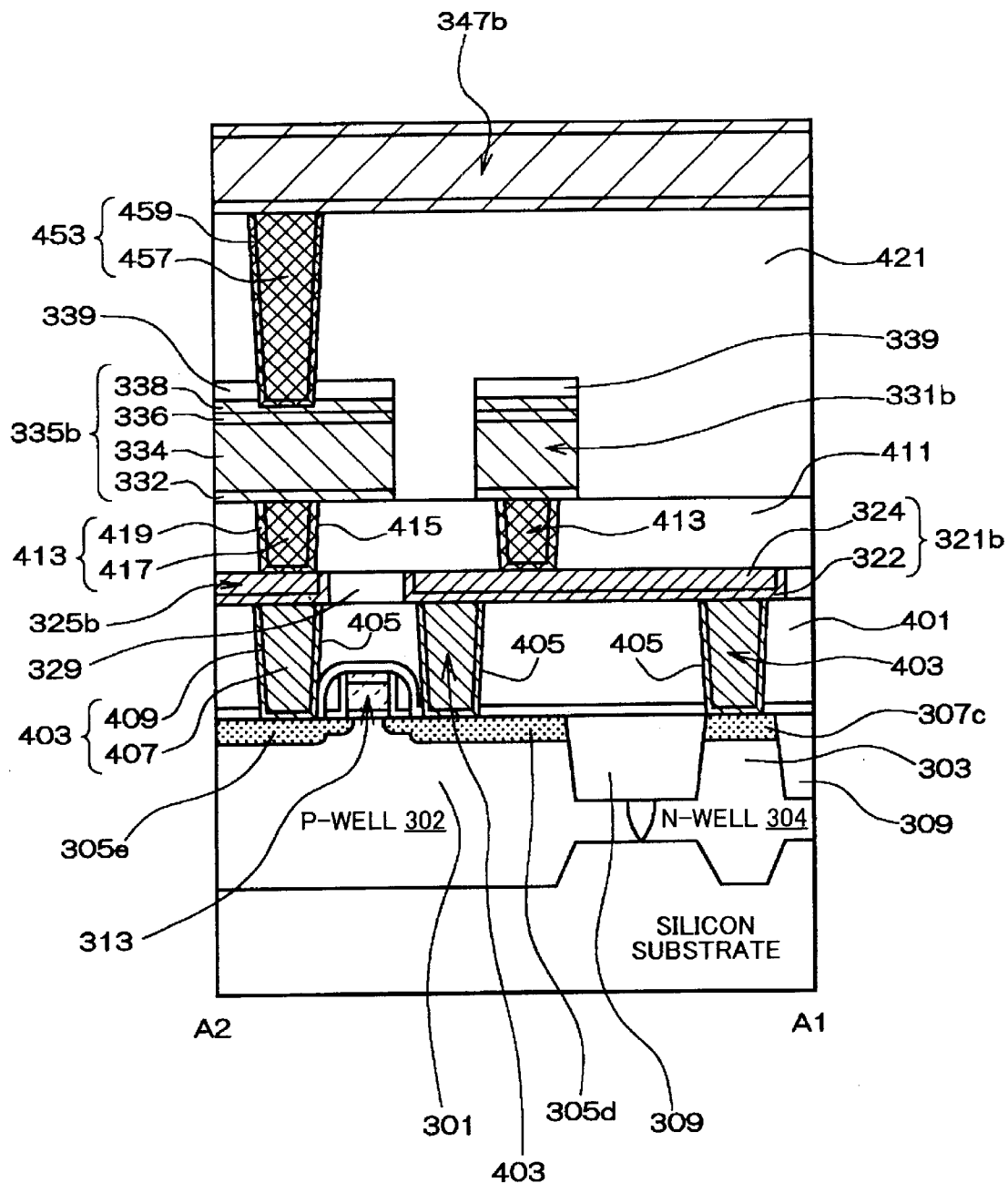
FIG. 36 is a cross-sectional view along the line A1–A2 shown in FIGS. 26 to 35.
Figure 37:
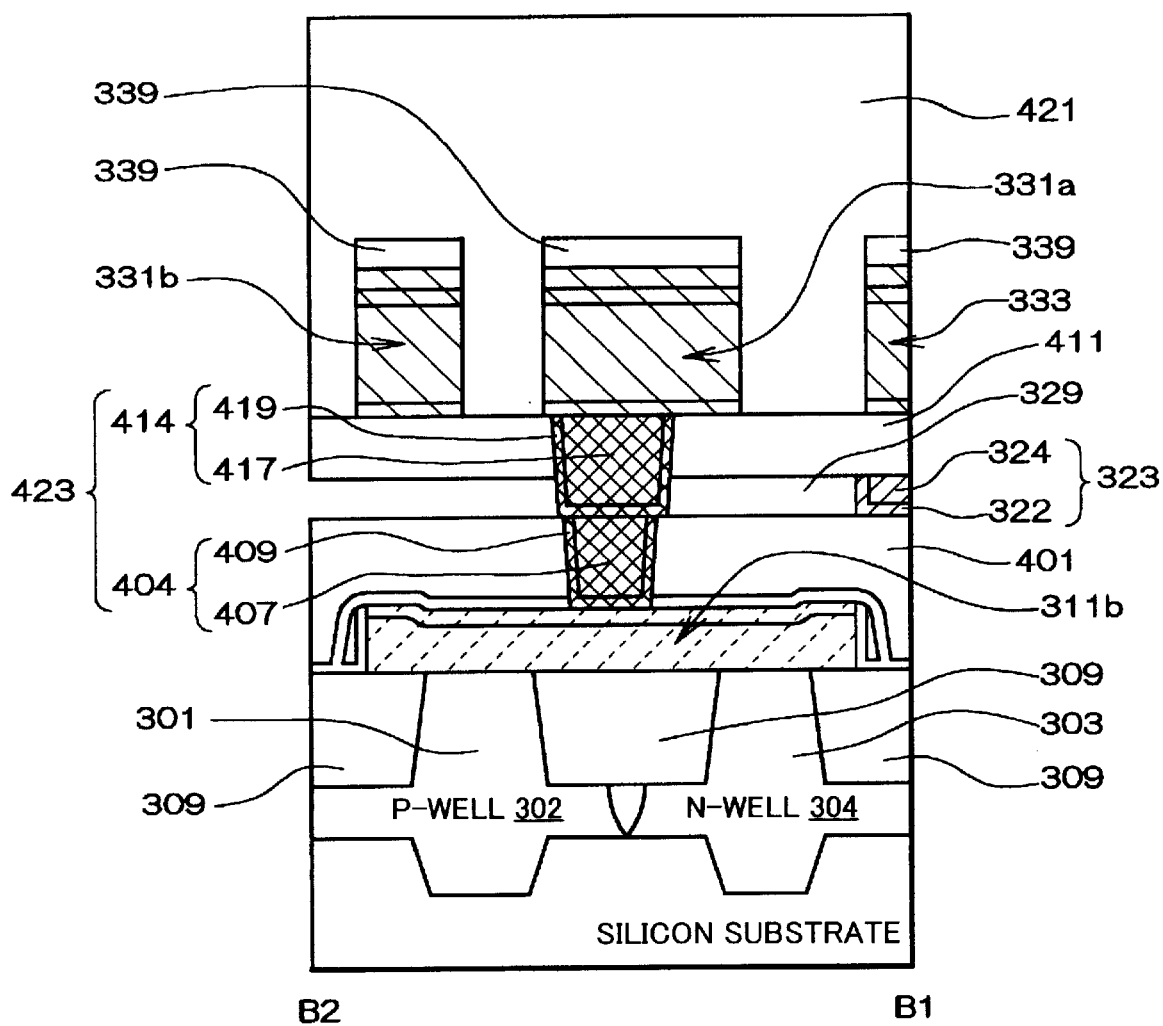
FIG. 37 is a cross-sectional view along the line B1–B2 shown in FIGS. 26 to 35.

The details of the structure of the SRAM according to the second embodiment are described below with reference to FIGS. 26 to 37 in the order from the lower layers. FIG. 31 is a plan view showing the field and the first conductive layer. FIG. 32 is a plan view showing the field, the first conductive layer, and the second conductive layer. FIG. 33 is a plan view showing the second conductive layer and the third conductive layer. FIG. 34 is a plan view showing the first conductive layer and the third conductive layer. FIG. 35 is a plan view showing the third conductive layer and the fourth conductive layer. FIG. 36 is a cross-sectional view along the line A1–A2 shown in FIGS. 26 to 35. FIG. 37 is a cross-sectional view along the line B1–B2 shown in FIGS. 26 to 35.

2.2.1 Field and First Conductive Layer

The field is described below. The field includes the active regions 301, 303, and 306 and element isolation regions 309, as shown in FIG. 26. The active regions 301, 303, and 306 are formed on the surface of a silicon substrate.

The active region 301 includes a region 301a having a pattern extending almost linearly in the X direction, and regions 301b having a pattern extending almost linearly in the Y direction. The transfer transistors $Q_1$ and $Q_2$ are formed in the regions 301b. The driver transistors $Q_3$ and $Q_4$ are formed across part of regions 301b and the region 301a.

The active region 303 includes a region 303a having a pattern extending almost linearly in the X direction and a region 303b having a pattern extending almost linearly in the Y direction. The load transistors $Q_1$ and $Q_6$ are formed in the region 303a.

A p-well contact region is formed in the active region 306. The memory cell in the formation region R and a memory cell located under the formation region R in FIG. 26 share the active region 306.

The active regions 301, 303, and 306 are isolated from one another by the element isolation regions 309. The element isolation regions 309 are the same as the element isolation regions 109 in the first embodiment.

The cross sections of the field shown in FIG. 26 along the line A1–A2 and the line B1–B2 are respectively shown in FIGS. 36 and 37. A p-well 302 and an n-well 304 formed in the silicon substrate and the like are illustrated in these cross sections.

The first conductive layer located on the field is described below with reference to FIGS. 27 and 31. A pair of gate—gate electrode layers 311a and 311b is disposed in parallel in one memory cell formation region R. The gate—gate electrode layers 311a and 311b intersect the active regions 301 and 303 in a plan view. The gate—gate electrode layer 311a forms gate electrodes of the driver transistor $Q_3$ and the load transistor $Q_5$, and connects these gate electrodes. The gate—gate electrode layer 311b forms gate electrodes of the driver transistor $Q_4$ and the load transistor $Q_6$, and connects these gate electrodes. The gate lengths of the driver transistors $Q_3$ and $Q_4$ and the load transistors $Q_5$ and $Q_6$ are the same as the gate lengths of the driver transistors $Q_3$ and $Q_4$ and the load transistors $Q_5$ and $Q_6$ in the first embodiment, respectively.

The sub word line 313 is located so as to intersect the active region 301 in a plan view. The sub word line 313 becomes gate electrodes of the transfer transistors $Q_1$ and $Q_2$. The gate lengths of the transfer transistors $Q_1$ and $Q_2$ are the same as the gate lengths of the transfer transistors $Q_1$ and $Q_2$ in the first embodiment.

The gate—gate electrode layers 311a and 311b and the sub word line 313 have a structure in which a silicide layer is formed on a polysilicon layer, for example.

The cross sections of the first conductive layer along the line A1–A2 and the line B1–B2 shown in FIGS. 27 and 31 are respectively shown in FIGS. 36 and 37. The sub word line 313 and the gate—gate electrode layer 311b are illustrated in these cross sections.

$n^+$-type impurity regions 305a, 305b, 305c, 305d, and 305e formed in the active region 301 are described below with reference to FIG. 31. The $n^+$-type impurity region 305a and the $n^+$-type impurity region 305b are located so that the sub word line 313 is interposed therebetween in a plan view. The $n^+$-type impurity region 305b and the $n^+$-type impurity region 305c are located so that the gate—gate electrode layer 311a is interposed therebetween. The $n^+$-type impurity region 305c and the $n^+$-type impurity region 305d are located so that the gate—gate electrode layer 311b is interposed therebetween. The $n^+$-type impurity region 305d and the $n^+$-type impurity region 305e are located so that the sub word line 313 is interposed therebetween.

The $n^+$-type impurity region 305a becomes either a source or a drain of the transfer transistor $Q_1$. The $n^+$-type impurity region 305b becomes either a source or a drain of the transfer transistor $Q_1$ and a drain of the driver transistor $Q_3$. The $n^+$-type impurity region 305c becomes a common source of the driver transistors $Q_3$ and $Q_4$. The $n^+$-type impurity region 305d becomes a drain of the driver transistor $Q_4$ and either a source or a drain of the transfer transistor $Q_2$. The $n^+$-type impurity region 305e becomes either a source or a drain of the transfer transistor $Q_2$.

$p^+$-type impurity regions 307a, 307b, 307c, and 307d formed in the active region 303 are described below with reference to FIG. 31. The $p^+$-type impurity region 307a and the $p^+$-type impurity region 307b are located so that the gate—gate electrode layer 311a is interposed therebetween in a plan view. The $p^+$-type impurity region 307b and the p⁺-type impurity region 307c are located so that the gate—gate electrode layer 311b is interposed therebetween. The p⁺-type impurity region 307a becomes a drain of the load transistor Q₅. The p⁺-type impurity region 307c becomes a drain of the load transistor Q₆. The p⁺-type impurity region 307b becomes a common source of the load transistors Q₁ and Q₆. The p⁺-type impurity region 307d has a pattern extending in the Y direction, and is connected to the p⁺-type impurity region 307b.

A p⁺-type impurity region 308 which becomes a p-well contact region is formed in the active region 306, as shown in FIG. 31.

The n⁺-type impurity regions 305d and 305e and the p⁺type impurity region 307c are illustrated in the cross section shown in FIG. 36.

An interlayer dielectric 401 such as a silicon oxide layer is formed to cover the field and the first conductive layer, as shown in FIGS. 36 and 37. The interlayer dielectric 401 is planarized by CMP.

2.2.2 Second Conductive Layer

The second conductive layer is described below with reference to FIGS. 28 and 32. The second conductive layer is located on the first conductive layer. The second conductive layer includes the drain—drain connecting layers 321a and 321b, $V_{DD}$ interconnect 323, bit line contact pad layer 325a, /bit line contact pad layer 325b, and ground line local interconnect layer 327. The second conductive layer is connected to the n⁺-type impurity regions and the p⁺-type impurity regions in the field through contact-conductive sections 403 which connect the second conductive layer with the field (hereinafter called "field/second-layer contact-conductive sections 403").

The drain—drain connecting layers 321a and 321b are provided so that the gate—gate electrode layers 311a and 311b are located between the drain—drain connecting layers 321a and 321b in a plan view. The drain—drain connecting layer 321a is located above the n⁺-type impurity region 305b (drain) and the p⁺-type impurity region 307a (drain). The end section 321a1 of the drain—drain connecting layer 321a is connected to the n⁺-type impurity region 305b (drain) through the field/second-layer contact-conductive section 403. The corner section 321a2 of the drain—drain connecting layer 321a in the shape of the letter "L" is connected to the p⁺-type impurity region 307a (drain) through the field/second-layer contact-conductive section 403. The drain—drain connecting layer 321b is located above the n⁺-type impurity region 305d (drain) and the p⁺-type impurity region 307c (drain). The end section 321b1 of the drain—drain connecting layer 321b is connected to the n⁺-type impurity region 305d (drain) through the field/second-layer contact-conductive section 403. The corner section 321b2 of the drain—drain connecting layer 321b in the shape of the letter "L" is connected to the p⁺-type impurity region 307c (drain) through the field/second-layer contact-conductive section 403.

The $V_{DD}$ interconnect 323 is connected to the p⁺-type impurity region 307d through the field/second-layer contact-conductive section 403. This causes the p⁺-type impurity region 307b which becomes a source of the load transistors Q₅ and Q₆ to be connected to the $V_{DD}$ interconnect 323.

The ground line local interconnect layer 327 has a pattern extending in the Y direction, and is located above the n⁺-type impurity region 305c (source) and the p⁺-type impurity region 308 (p-well contact region). The ground line local interconnect layer 327 is connected to the n⁺-type impurity region 305c and the p⁺-type impurity region 308 through the field/second-layer contact-conductive section 403. The ground line local interconnect layer 327 functions as an interconnect layer for connecting the $V_{SS}$ interconnect 345 (FIG. 30) with the n⁺-type impurity region 305c which becomes the source of the driver transistors Q₃ and Q₄, and as an interconnect layer for connecting the $V_{SS}$ interconnect 345 with the p⁺-type impurity region 308 which becomes the p-well contact region.

The bit line contact pad layer 325a is located above the n⁺-type impurity region 305a. The bit line contact pad layer 325a is connected to the n⁺-type impurity region 305a through the field/second-layer contact-conductive section 403. The bit line contact pad layer 325a functions as a pad layer for connecting the bit line 347a (FIG. 30) with the n⁺-type impurity region 305a which becomes either a source or a drain of the transfer transistor Q₁.

The /bit line contact pad layer 325b is located above the n⁺-type impurity region 305e. The /bit line contact pad layer 325b is connected to the n⁺-type impurity region 305e through the field/second-layer contact-conductive section 403. The /bit line contact pad layer 325b functions as a pad layer for connecting the /bit line 347b (FIG. 30) with the n⁺-type impurity region 305e which becomes either a source or a drain of the transfer transistor Q₂. The memory cell in the formation region R and a memory cell located under the formation region R in FIG. 32 share the ground line local interconnect layer 327, the bit line contact pad layer 325a, and the /bit line contact pad layer 325b.

The cross-sectional structure of the second conductive layer is described below with reference to FIG. 36. The second conductive layer has a structure in which the second conductive layer is buried in an insulating layer 329 such as a silicon oxide layer, for example. The second conductive layer is formed using a damascene process. The second conductive layer has the same structure as the second conductive layer in the first embodiment, in which a tungsten-containing layer 324 is formed on a high-melting-point metal nitride layer 322.

The cross-sectional structure of the field/second-layer contact-conductive section 403 is described below with reference to FIG. 36. A plurality of through-holes 405 which expose the n⁺-type impurity regions and the p⁺-type impurity regions present in the field is formed in the interlayer dielectric 401. The through-holes 405 are filled with the field/second-layer contact-conductive sections 403. The field/second-layer contact-conductive section 403 has the same structure as the field/second-layer contact-conductive section 203 (FIG. 14) in the first embodiment, which includes a plug 407 and a high-melting-point metal nitride layer 409.

Contact-conductive sections 423 used to connect the gate—gate electrode layers 311a and 311b with the drain-gate connecting layers 331a and 331b (hereinafter called "first-layer/third-layer stacked contact-conductive sections 423") are described below with reference to FIG. 37. FIG. 37 shows the first-layer/third-layer stacked contact-conductive section 423 which connects the gate—gate electrode layer 311b with the drain-gate connecting layer 331a. The first-layer/third-layer stacked contact-conductive section 423 has a structure in which an upper layer conductive section 414 is stacked on a lower layer conductive section 404. The lower layer conductive section 404 is buried in the interlayer dielectric 401. The lower layer conductive section 404 is formed in the same step as the field/second-layer contact-conductive section 403. The lower layer conductive section 404 includes the plug 407 and the high-melting-point metal nitride layer 409. The upper layer conductive section 414 is described in the section "Third conductive layer".

An interlayer dielectric 411 such as a silicon oxide layer is formed to cover the second conductive layer, as shown in FIGS. 36 and 37. The interlayer dielectric 411 is planarized by CMP.

2.2.3 Third Conductive Layer

The third conductive layer is described below with reference to FIGS. 29, 33, and 34. The third conductive layer is located on the second conductive layer. The third conductive layer includes the drain-gate connecting layers 331a and 331b, the main word line 333, the ground line local interconnect layer 337, a bit line contact pad layer 335a, and a /bit line contact pad layer 335b.

The drain-gate connecting layer 331a has a pattern in the shape of the letter "L", with the end section 331a1 located above the corner section 321a2 of the drain—drain connecting layer 321a in the shape of the letter "L" (FIG. 33). The end section 331a1 of the drain-gate connecting layer 331a is connected to the corner section 321a2 of the drain—drain connecting layer 321a in the shape of the letter "L" through a contact-conductive section 413 which connects the third conductive layer with the second conductive layer (hereinafter called "second-layer/third-layer contact-conductive section 413") (FIG. 33). The end section 331a2 of the drain-gate connecting layer 331a is located above the center of the gate—gate electrode layer 311b (FIG. 34). The end section 331a2 of the drain-gate connecting layer 331a is connected to the center of the gate—gate electrode layer 311b through the first-layer/third-layer stacked contact-conductive section 423 (FIG. 34).

The drain-gate connecting layer 331b is approximately in the shape of the letter "L", with the end section 331b1 located above the end section 321b1 of the drain—drain connecting layer 321b (FIG. 33). The end section 331b1 of the drain-gate connecting layer 331b is connected to the end section 321b1 of the drain—drain connecting layer 321b through the second-layer/third-layer contact-conductive section 413 (FIG. 33). The end section 331b2 of the drain-gate connecting layer 331b is located above the center of the gate—gate electrode layer 311a (FIG. 34). The end section 331b2 of the drain-gate connecting layer 331b is connected to the center of the gate—gate electrode layer 311a through the first-layer/third-layer stacked contact-conductive section 423 (FIG. 34).

The main word line 333 is located above the $V_{DD}$ interconnect 323. The sub word line 313 (FIG. 27) is activated or deactivated by the main word line 333. In the second embodiment, the word line consists of the sub word lines and the main word line. However, the main word line need not be formed.

The ground line local interconnect layer 337 has a pattern extending in the Y direction and is located above the ground line local interconnect layer 327 (FIG. 33). The ground line local interconnect layer 337 is connected to the ground line local interconnect layer 327 through the second-layer/third-layer contact-conductive section 413. The ground line local interconnect layer 337 functions as an interconnect layer for connecting the $V_{SS}$ interconnect 345 (FIG. 30) with the $n^+$-type impurity region 305c (FIG. 31) which becomes a source of the driver transistors $Q_3$ and $Q_4$, and as an interconnect layer for connecting the $V_{SS}$ interconnect 345 with the $p^+$-type impurity region 308 (FIG. 31) which becomes the p-well contact region.

The bit line contact pad layer 335a is located above the bit line contact pad layer 325a (FIG. 33). The bit line contact pad layer 335a is connected to the bit line contact pad layer 325a through the second-layer/third-layer contact-conductive section 413. The bit line contact pad layer 335a functions as a pad layer for connecting the bit line 347a (FIG. 30) with the $n^+$-type impurity region 305a (FIG. 31) which becomes either a source or a drain of the transfer transistor $Q_1$.

The /bit line contact pad layer 335b is located above the /bit line contact pad layer 325b. The /bit line contact pad layer 335b is connected to the /bit line contact pad layer 325b through the second-layer/third-layer contact-conductive section 413. The /bit line contact pad layer 335b functions as a pad layer for connecting the /bit line 347b (FIG. 30) with the $n^+$-type impurity region 305e (FIG. 31) which becomes either a source or a drain of the transfer transistor $Q_2$. The memory cell in the formation region R and a memory cell located under the formation region R in FIG. 33 share the ground line local interconnect layer 337, the bit line contact pad layer 335a, and the /bit line contact pad layer 335b.

The cross-sectional structure of the third conductive layer is described below with reference to FIGS. 36 and 37. The third conductive layer has a structure in which a high-melting-point metal nitride layer 332, a metal layer 334, a high-melting-point metal layer 336, and a high-melting-point metal nitride layer 338 are layered in that order from the bottom, for example. Specific examples of each layer are given below. As examples of the high-melting-point metal nitride layer 332, a titanium nitride layer and the like can be given. As examples of the metal layer 334, an aluminum layer, a copper layer, an alloy layer of these metals, and the like can be given. As examples of the high-melting-point metal layer 336, a titanium layer and the like can be given. As examples of the high-melting-point metal nitride layer 338, a titanium nitride layer and the like can be given. A hard mask layer 339 consisting of a silicon oxide layer is formed on the third conductive layer. The reason for forming the hard mask layer 339 is the same as that for the hard mask layer 149 (FIG. 14) in the first embodiment.

The cross-sectional structure of the second-layer/third-layer contact-conductive section 413 is described below with reference to FIG. 36. The through-holes 415 formed through the interlayer dielectric 411 are filled with the second-layer/third-layer contact-conductive sections 413. The second-layer/third-layer contact-conductive section 413 has the same structure as the second-layer/third-layer contact-conductive section 213 in the first embodiment, which includes a plug 417 and a high-melting-point metal nitride layer 419.

The upper layer conductive section 414 of the first-layer/third-layer stacked contact-conductive section 423 is described below with reference to FIG. 37. The upper layer conductive section 414 is buried in the interlayer dielectric 411 and the insulating layer 329 and connected to the lower layer conductive section 404 and the drain-gate connecting layer 331a. The upper layer conductive section 414 is formed in the same step as the second-layer/third-layer contact-conductive section 413. The upper layer conductive section 414 includes the plug 417 and the high-melting-point metal nitride layer 419.

An interlayer dielectric 421 such as a silicon oxide layer is formed to cover the third conductive layer, as shown in FIGS. 36 and 37. The interlayer dielectric 421 is planarized by CMP.

2.2.4 Fourth Conductive Layer

The fourth conductive layer is described below with reference to FIGS. 30 and 35. The fourth conductive layer is located on the third conductive layer. The fourth conductive layer includes the bit line 347a, the /bit line 347b, and the $V_{SS}$ interconnect 345, each having a pattern extending almost linearly in the Y direction. The $V_{SS}$ interconnect 345 is located between the bit line 347*a* and the /bit line 347*b*. A signal which compensates a signal flowing through the bit line 347*a* flows through the /bit line 347*b*.

The bit line 347*a* is connected to the bit line contact pad layer 335*a* through a contact-conductive section 453 which connects the third conductive layer with the fourth conductive layer (hereinafter called "third-layer/fourth-layer contact-conductive section 453"). The /bit line 347*b* is connected to the /bit line contact pad layer 335*b* through the third-layer/fourth-layer contact-conductive section 453. The $V_{SS}$ interconnect 345 is connected to the ground line local interconnect layer 337 through the third-layer/fourth-layer contact-conductive section 453.

The fourth conductive layer has a structure in which a titanium nitride layer, an aluminum-copper alloy layer, and a titanium nitride layer are layered in that order from the bottom, for example, as shown in FIG. 36.

The cross-sectional structure of the third-layer/fourth-layer contact-conductive section 453 is described below with reference to FIG. 36. The third-layer/fourth-layer contact-conductive section 453 has the same structure as the fourth layer/fifth layer contact-conductive section 243 (FIG. 14) in the first embodiment, which includes a plug 457 and a high-melting-point metal nitride layer 459.

The details of the structure of the SRAM according to the second embodiment are described above.

2.3 Method of Fabricating SRAM

The method of fabricating the SRAM according to the first embodiment may be applied to the method of fabricating the SRAM according to the second embodiment. However, since the SRAM of the second embodiment includes four conductive layers, the formation step of the third conductive layer in the first embodiment is unnecessary.

3. Major Effects of SRAM According to First and Second Embodiments

The following four major effects are obtained by the SRAM according to the first and second embodiments. These effects are described below using the first embodiment. The same is applied to the second embodiment.

3.1 Effect 1

In the case of forming the conductive layer using a damascene process, tungsten is preferably used as the material for the conductive layer. In the first embodiment, the tungsten-containing layer 124 is used for the second conductive layer, as shown in FIG. 14. Therefore, the second conductive layer can be formed using a damascene process as described in the section "Formation of second conductive layer" in "Method of fabricating SRAM". Therefore, although the SRAM of the first embodiment has a multilevel interconnection structure consisting of five conductive layers, the SRAM can be fabricated easily.

3.2 Effect 2

The drain—drain connecting layers 121*a* and 121*b* are formed using a damascene process as described in the section "Formation of second conductive layer" in "Method of fabricating SRAM". Therefore, the memory cells can be miniaturized. The reasons therefor are as follows. As an example of the method for forming the drain—drain connecting layers 121*a* and 121*b*, there is a method of patterning a laminated film consisting of a high-melting-point metal layer and a high-melting-point metal nitride layer by photolithography and etching. A high-melting-point metal layer and a high-melting-point metal nitride layer are used as the materials for both the drain—drain connecting layers 121*a* and 121*b* and the field/second-layer contact-conductive section 203. Therefore, in the case of forming the drain—drain connecting layers 121*a* and 121*b* using the above method, if the field/second-layer contact-conductive section 203 is not completely covered with the drain—drain connecting layers 121*a* and 121*b*, the exposed areas of the field/second-layer contact-conductive section 203 are removed during patterning. This gives rise to problems such as an increase in the resistance of the field/second-layer contact-conductive section 203. Therefore, according to the above method, it is necessary to take into consideration the covering margin of the drain—drain connecting layers 121*a* and 121*b* with respect to the field/second-layer contact-conductive section 203. This causes the area of the drain—drain connecting layers 121*a* and 121*b* to be increased, thereby hindering miniaturization of the memory cells.

According to the first embodiment, the drain—drain connecting layers 121*a* and 121*b* are formed using a damascene process. Specifically, the insulating layer 129 is patterned so that the areas in which the drain—drain connecting layers 121*a* and 121*b* are formed are removed. Laminated films consisting of the tungsten-containing layer 124 and the high-melting-point metal nitride layer 122 are formed so that these areas are filled with these laminated films. The laminated films are polished by CMP, whereby the drain—drain connecting layers 121*a* and 121*b* are formed. Therefore, it is unnecessary to take into consideration the covering margin of the drain—drain connecting layers 121*a* and 121*b* with respect to the field/second-layer contact-conductive section 203. This enables the drain—drain connecting layers 121*a* and 121*b* to be miniaturized, whereby the memory cells can be miniaturized.

3.3 Effect 3

The SRAM includes the first-layer/third-layer stacked contact-conductive section 223, as shown in FIG. 15. This also enables miniaturization of memory cells. The reasons therefor are as follows. The gate—gate electrode layers 111*a* and 111*b* are located in the first conductive layer. The drain-gate connecting layers 131*a* and 131*b* are located in the third conductive layer. Therefore, the interlayer dielectric 201 used to insulate the first conductive layer from the second conductive layer and the interlayer dielectric 211 used to insulate the second conductive layer from the third conductive layer are located between the gate—gate electrode layers 111*a* and 111*b* and the drain-gate connecting layers 131*a* and 131*b*. As a result, the distance between the first conductive layer and the third conductive layer becomes comparatively larger.

Since the SRAM according to the first embodiment includes the first-layer/third-layer stacked contact-conductive section 223, it is unnecessary to provide through-holes formed through two interlayer dielectrics, specifically, through-holes formed through the interlayer dielectric used to insulate the first conductive layer from the second conductive layer and the interlayer dielectric used to insulate the second conductive layer from the third conductive layer. Therefore, even if the memory cells are more and more miniaturized, it is possible to prevent an excessive increase in the aspect ratio of the through-holes used to connect the drain-gate connecting layers 131*a* and 131*b* with the gate—gate electrode layers 111*a* and 111*b*. Therefore, according to the first embodiment, miniaturization of the memory cells can also be achieved by this feature.

As described in the section "Modification example of the first embodiment", since the SRAM according to the modification example of the first embodiment includes the second-layer/fourth-layer stacked contact-conductive section 253 (FIG. 24), it is unnecessary to provide through-holes formed through two interlayer dielectrics, specifically, through-holes formed through the interlayer dielectrics 211 and 221 present between the second conductive layer and the fourth conductive layer. Therefore, even if the memory cells are more and more miniaturized, it is possible to prevent an excessive increase in the aspect ratio of the through-holes used to connect the second conductive layer with the fourth conductive layer. Therefore, according to the modification example, miniaturization of the memory cells can also be achieved by this feature.

3.4 Effect 4

According to the first embodiment, miniaturization of the memory cells can also be achieved by the following feature. This feature is described below. In the first embodiment, information is stored using a flip-flop of the memory cell. The flip-flop is formed by connecting an input terminal (gate electrode) of one inverter to an output terminal (drain) of the other inverter, and connecting an input terminal (gate electrode) of the latter inverter to an output terminal (drain) of the former inverter. Specifically, the flip-flop is formed by cross-coupling a first inverter with a second inverter. In the case of forming a flip-flop using two conductive layers, the inverters can be cross-coupled by forming a drain—drain connecting layer which connects the drains of the inverters and a drain-gate connecting layer which connects the gate and the drain of the inverters in one conductive layer.

According to this structure, this conductive layer is formed across a region in which the drain of one inverter is located, a region in which the gate of the other inverter is located, and a region for connecting these regions. Therefore, this conductive layer has a pattern having three end sections (pattern having a branched section in the shape of the letter "T" or "h", for example), or a spiral pattern in which the arms are intricate. Japanese Patent Application Laid-open No. 10-41409 discloses a pattern in the shape of the letter "T" in FIG. 1, for example. M. Ishida, et al., IEDM Tech Digest (1998), page 203, FIG. 4 (*b*) discloses a pattern in the shape of the letter "h", for example. A spiral pattern is disclosed in M. Ishida, et al., IEDM Tech Digest (1998), page 203, FIG. 3 (*b*) for example. These complicated patterns make it difficult to accurately reproduce the shape of a pattern in a photoetching step as the pattern becomes minute, whereby a desired pattern cannot be obtained. This hinders miniaturization of the memory cells.

According to the first embodiment, the gate—gate electrode layers (111*a*, 111*b*) which become the gates of the CMOS inverters, the drain—drain connecting layers (121*a*, 121*b*) for connecting the drains of the CMOS inverters, and the drain-gate connecting layers (131*a*, 131*b*) for connecting the gate of one CMOS inverter to the drain of the other CMOS inverter are formed in different layers, as shown in FIGS. 3, 4, and 5. In the first embodiment, since the flip-flop is formed using three conductive layers, the pattern of each layer can be simplified (almost linearly, for example) in comparison with a case of forming a flip-flop using two layers. Therefore, according to the first embodiment, an SRAM in the 0.12 μm generation with a memory cell size of 2.5 μm² or less can be fabricated, for example.

4. Application Example of SRAM to Electronic Instrument

Figure 38:
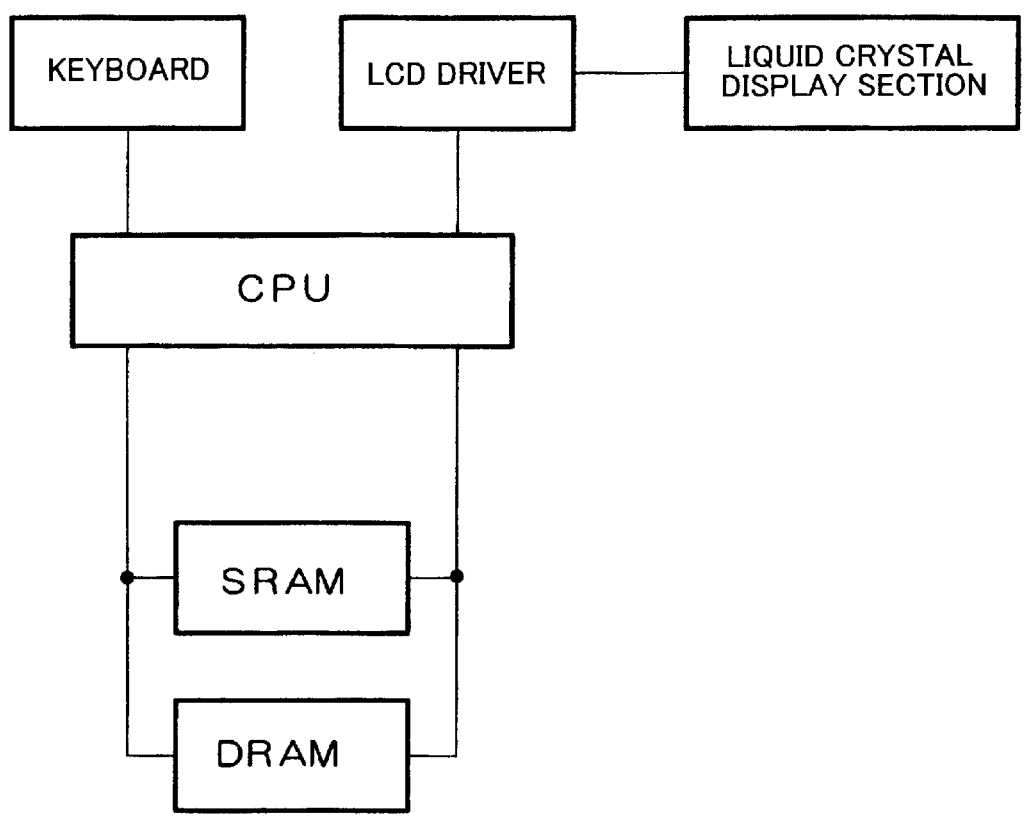
FIG. 38 is a block diagram showing part of a system for portable telephones equipped with the SRAM according to the first and second embodiments.

The SRAM according to the first and second embodiments may be applied to an electronic instrument such as portable equipment. FIG. 38 is a block diagram showing part of a system for portable telephones. A CPU, SRAM, and DRAM are connected one another through bus lines. The CPU is connected to a keyboard and an LCD driver through the bus lines. The LCD driver is connected to a liquid crystal display section through the bus lines. The CPU, SRAM, and DRAM make up a memory system.

Figure 39:
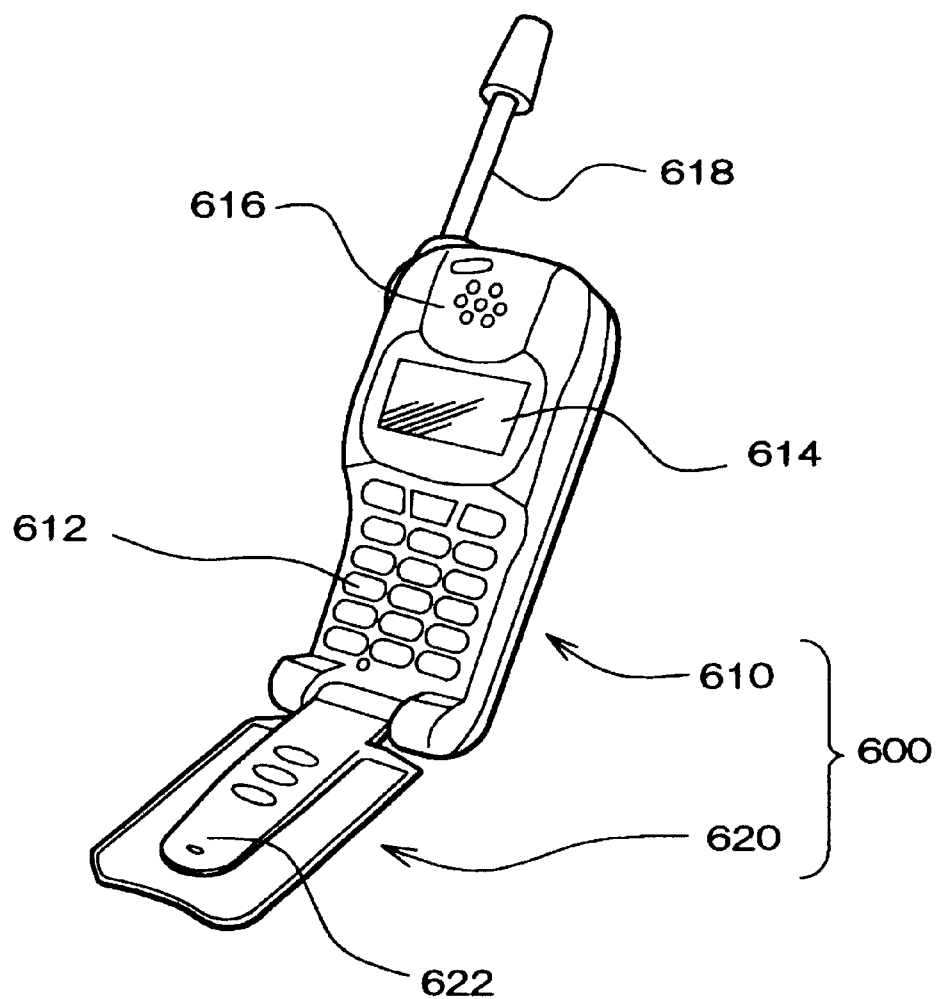
FIG. 39 is an oblique view showing a portable telephone equipped with the system for portable telephones shown in FIG. 38.

FIG. 39 is an oblique view showing a portable telephone 600 equipped with the system for portable telephones shown in FIG. 38. The portable telephone 600 includes a keyboard 612, a liquid crystal display section 614, a body section 610 including a receiver section 616 and an antenna section 618, and a cover section 620 including a transmitter section 622.

What is claimed is:

1. A semiconductor device comprising:
   a first gate—gate electrode layer located in a first conductive layer and including gate electrodes of a first load transistor and a first driver transistor,
   a second gate—gate electrode layer located in the first conductive layer and including gate electrodes of a second load transistor and a second driver transistor,
   a first drain—drain connecting layer located in a second conductive layer which is an upper layer of the first conductive Layer and connecting a drain of the first load transistor with a drain of the first driver transistor,
   a second drain—drain connecting layer located in the second conductive layer and connecting a drain of the second load transistor with a drain of the second driver transistor,
   a first drain-gate connecting layer located in a third conductive layer which is an upper layer of the first and second drain—drain connecting layers and connecting the first drain—drain connecting layer with the second gate—gate electrode layer, and
   a stacked contact-conductive section connecting the third conductive layer with the first conductive layer and having a structure in which an upper layer conductive section buried in a second interlayer dielectric used to insulate the second conductive layer from the third conductive layer is stacked over a lower layer conductive section buried in a first interlayer dielectric used to insulate the first conductive layer from the second conductive layer.

2. The semiconductor device as defined in claim 1, comprising:
   an insulating layer located between the first interlayer dielectric and the second interlayer dielectric, the second conductive layer being buried in the insulating layer,
   wherein the upper layer conductive section of the stacked contact-conductive section is buried in the insulating layer and the second interlayer dielectric.

3. The semiconductor device as defined in claim 1, wherein the second conductive layer includes tungsten.

4. The semiconductor device as defined in claim 1, comprising:
   a first transfer transistor and a second transfer transistor,
   a first active region having a pattern extending in a first direction and located in a layer under the first conductive layer, the first and second load transistors being formed in the first active region,
   a second active region having a pattern extending in the first direction and located in the same layer as the first active region, the first and second driver transistors and the first and second transfer transistors being formed in the second active region,
   a first word line having a pattern extending in a second direction and located in the first conductive layer so as to intersect with the second active region in a plan view, the first word line including a gate electrode of the first transfer transistor, and
   a second word line having a pattern extending in the second direction and located in the first conductive layer so as to intersect with the second active region in a plan view, the second word line including a gate electrode of the second transfer transistor, wherein the first and second gate—gate electrode layers have a pattern extending in the second direction and are located between the first word line and the second word line so as to intersect with the first and second active regions in a plan view, and wherein the first and second drain—drain connecting layers have a pattern extending in the second direction.

5. The semiconductor device as defined in claim 4, further comprising:

a power supply line which has a pattern extending in the first direction and which is located in the second conductive layer and connected with a source of the first and second load transistors, a ground line local interconnect layer which has a pattern extending in the second direction and which is located in the second conductive layer and connected with a source of the first and second driver transistors, a bit line contact pad layer which is located in the second conductive layer and connected with the first transfer transistor, a /bit line contact pad layer which is located in the second conductive layer and connected with the second transfer transistor, a ground line having a pattern extending in the second direction and located in a fourth conductive layer which is an upper layer of the third conductive layer, the ground line being connected with the ground line local interconnect layer, a main word line having a pattern extending in the second direction and located in the fourth conductive layer, a bit line local interconnect layer which has a pattern extending in the second direction and which is located in the fourth conductive layer and connected with the bit line contact pad layer, a /bit line local interconnect layer which has a pattern extending in the second direction and which is located in the fourth conductive layer and connected with the /bit line contact pad layer, a bit line having a pattern extending in the first direction and located in a fifth conductive layer which is an upper layer of the fourth conductive layer, the bit line being connected with the bit line local interconnect layer, and a /bit line which has a pattern extending in the first direction and which is located in the fifth conductive layer and connected with the /bit line local interconnect layer.

6. The semiconductor device as defined in claim 5, further comprising:

a first stacked contact-conductive section connecting the ground line with the ground line local interconnect layer, and having a structure in which an upper layer conductive section buried in a third interlayer dielectric used to insulate the third conductive layer from the fourth conductive layer is stacked over a lower layer conductive section buried in the second interlayer dielectric, a second stacked contact-conductive section connecting the bit line local interconnect layer with the bit line contact pad layer, and having a structure in which an upper layer conductive section buried in the third interlayer dielectric is stacked over a lower layer conductive section buried in the second interlayer dielectric, and a third stacked contact-conductive section connecting the /bit line local interconnect layer with the /bit line contact pad layer, and having a structure in which an upper layer conductive section buried in the third interlayer dielectric is stacked over a lower layer conductive section buried in the second interlayer dielectric.

7. The semiconductor device as defined in claim 5, wherein the power supply line, the ground line local interconnect layer, the bit line contact pad layer, and the /bit line contact pad layer include tungsten.

8. The semiconductor device as defined in claim 1, comprising:

a first transfer transistor and a second transfer transistor, a first active region having a pattern extending in a second direction and located in a layer under the first conductive layer, the first and second load transistors being formed in the first active region, a second active region having a pattern extending in a first and second directions and located in the same layer as the first active region, the first and second driver transistors and the first and second transfer transistors being formed in the second active region, and a word line having a pattern extending in the second direction and located in the first conductive layer so as to intersect with the pattern of the second active region extending in the first direction in a plan view, the word line including gate electrodes of the first and second transfer transistors, wherein the first and second gate—gate electrode layers have a pattern extending in the first direction and intersect with the first and second active regions in a plan view, and wherein the first and second drain—drain connecting layers have a pattern extending in the first direction.

9. The semiconductor device as defined in claim 8, comprising:

a power supply line which has a pattern extending in the second direction and which is located in the second conductive layer and connected with a source of the first and second load transistors, a first ground line local interconnect layer which has a pattern extending in the first direction and which is located in the second conductive layer and connected with a source of the first and second driver transistors, a first bit line contact pad layer which is located in the second conductive layer and connected with the first transfer transistor, a first /bit line contact pad layer which is located in the second conductive layer and connected with the second transfer transistor, a main word line having a pattern extending in the second direction and located in the third conductive layer, a second ground line local interconnect layer which has a pattern extending in the first direction and which is located in the third conductive layer and connected with the first ground line local interconnect layer, a second bit line contact pad layer which is located in the third conductive layer and connected with the first bit line contact pad layer, a second /bit line contact pad layer which is located in the third conductive layer and connected with the first /bit line contact pad layer, a bit line having a pattern extending in the first direction and located in a fourth conductive layer which is an upper layer of the third conductive layer, the bit line being connected with the second bit line contact pad layer, a /bit line which has a pattern extending in the first direction and which is located in the fourth conductive layer and connected with the second /bit line contact pad layer, and a ground line which has a pattern extending in the first direction and which is located in the fourth conductive layer and connected with the second ground line local interconnect layer.

10. The semiconductor device as defined in claim 9, wherein the power supply line, the first ground line local interconnect layer, the first bit line contact pad layer, and the first /bit line contact pad layer include tungsten.

11. The semiconductor device as defined in claim 4, wherein the size of a memory cell including the first and second load transistors, the first and second driver transistors, and the first and second transfer transistors is 2.5 $\mu m^2$ or less.

12. A memory system comprising the semiconductor device according to claim 1.

13. An electronic instrument comprising the semiconductor device according to claim 1.

14. A semiconductor device comprising:

a first gate—gate electrode layer located in a first conductive layer and including gate electrodes of a first load transistor and a first driver transistor, a second gate—gate electrode layer located in the first conductive layer and including gate electrodes of a second load transistor and a second driver transistor, a first drain—drain connecting layer located in a second conductive layer which is an upper layer of the first conductive layer and connecting a drain of the first load transistor with a drain of the first driver transistor, a second drain—drain connecting layer located in the second conductive layer and connecting a drain of the second load transistor with a drain of the second driver transistor, a first drain-gate connecting layer located in a third conductive layer which is an upper layer of the first and second drain—drain connecting layers and connecting the first drain—drain connecting layer with the second gate—gate electrode layer, and a means for connecting the third conductive layer with the first conductive layer and having a structure in which an upper layer conductive section buried in a second interlayer dielectric used to insulate the second conductive layer from the third conductive layer is stacked over a lower layer conductive section buried in a first interlayer dielectric used to insulate the first conductive layer from the second conductive layer.

15. The semiconductor device as defined in claim 14, comprising:

an insulating layer located between the first interlayer dielectric and the second interlayer dielectric, the second conductive layer being buried in the insulating layer, wherein the upper layer conductive section of the means for connecting is buried in the insulating layer and the second interlayer dielectric.

16. The semiconductor device as defined in claim 14, wherein the second conductive layer includes tungsten.

17. The semiconductor device as defined in claim 14, comprising:

a first transfer transistor and a second transfer transistor, a first active region having a pattern extending in a first direction and located in a layer under the first conductive layer, the first and second load transistors being formed in the first active region, a second active region having a pattern extending in the first direction and located in the same layer as the first active region, the first and second driver transistors and the first and second transfer transistors being formed in the second active region, a first word line having a pattern extending in a second direction and located in the first conductive layer so as to intersect with the second active region in a plan view, the first word line including a gate electrode of the first transfer transistor, and a second word line having a pattern extending in the second direction and located in the first conductive layer so as to intersect with the second active region in a plan view, the second word line including a gate electrode of the second transfer transistor, wherein the first and second gate—gate electrode layers have a pattern extending in the second direction and are located between the first word line and the second word line so as to intersect with the first and second active regions in a plan view, and wherein the first and second drain—drain connecting layers have a pattern extending in the second direction.

18. The semiconductor device as defined in claim 17, further comprising:

a power supply line which has a pattern extending in the first direction and which is located in the second conductive layer and connected with a source of the first and second load transistors, a ground line local interconnect layer which has a pattern extending in the second direction and which is located in the second conductive layer and connected with a source of the first and second driver transistors, a bit line contact pad layer which is located in the second conductive layer and connected with the first transfer transistor, a /bit line contact pad layer which is located in the second conductive layer and connected with the second transfer transistor, a ground line having a pattern extending in the second direction and located in a fourth conductive layer which is an upper layer of the third conductive layer, the ground line being connected with the ground line local interconnect layer, a main word line having a pattern extending in the second direction and located in the fourth conductive layer, a bit line local interconnect layer which has a pattern extending in the second direction and which is located in the fourth conductive layer and connected with the bit line contact pad layer, a /bit line local interconnect layer which has a pattern extending in the second direction and which is located in the fourth conductive layer and connected with the /bit line contact pad layer, a bit line having a pattern extending in the first direction and located in a fifth conductive layer which is an upper layer of the fourth conductive layer, the bit line being connected with the bit line local interconnect layer, and a /bit line which has a pattern extending in the first direction and which is located in the fifth conductive layer and connected with the /bit line local interconnect layer.

19. The semiconductor device as defined in claim 18, further comprising:

a first stacked contact-conductive section connecting the ground line with the ground line local interconnect layer, and having a structure in which an upper layer conductive section buried in a third interlayer dielectric used to insulate the third conductive layer from the fourth conductive layer is stacked over a lower layer conductive section buried in the second interlayer dielectric, a second stacked contact-conductive section connecting the bit line local interconnect layer with the bit line contact pad layer, and having a structure in which an upper layer conductive section buried in the third interlayer dielectric is stacked over a lower layer conductive section buried in the second interlayer dielectric, and a third stacked contact-conductive section connecting the /bit line local interconnect layer with the /bit line contact pad layer, and having a structure in which an upper layer conductive section buried in the third interlayer dielectric is stacked over a lower layer conductive section buried in the second interlayer dielectric.

20. The semiconductor device as defined in claim 18, wherein the power supply line, the ground line local interconnect layer, the bit line contact pad layer, and the /bit line contact pad layer include tungsten.

* * * * *